(12) United States Patent
Fredriksson

(10) Patent No.: US 7,567,629 B2
(45) Date of Patent: Jul. 28, 2009

(54) MULTIPHASE CLOCK RECOVERY

(76) Inventor: Jesper Jonas Fredriksson, Vasagatan 5A, SE-753 13 Uppsala (SE)

( * ) Notice: Subject to any disclaimer, the term of this patent is extended or adjusted under 35 U.S.C. 154(b) by 673 days.

(21) Appl. No.: 10/554,531

(22) PCT Filed: Apr. 29, 2003

(86) PCT No.: PCT/SE03/00699

§ 371 (c)(1),
(2), (4) Date: Oct. 25, 2005

(87) PCT Pub. No.: WO2004/105303

PCT Pub. Date: Dec. 2, 2004

(65) Prior Publication Data

US 2007/0009066 A1    Jan. 11, 2007

(51) Int. Cl.
*H04L 27/14* (2006.01)
(52) U.S. Cl. .................. 375/326; 375/355; 375/219; 375/354; 375/360; 375/376; 331/11; 331/2; 331/179; 331/23
(58) Field of Classification Search .................. 375/360, 375/355, 326, 224, 219, 354, 376; 311/11, 311/2, 179, 23
See application file for complete search history.

(56) References Cited

U.S. PATENT DOCUMENTS

| | | | | |
|---|---|---|---|---|
| 6,259,326 | B1 * | 7/2001 | Dunlop et al. | 331/2 |
| 7,251,304 | B2 * | 7/2007 | Fukushima | 375/354 |
| 7,302,026 | B2 * | 11/2007 | Kaeriyama et al. | 375/355 |
| 2002/0047738 | A1 * | 4/2002 | Kamihara | 327/237 |

FOREIGN PATENT DOCUMENTS

| | | |
|---|---|---|
| EP | 0648033 A1 | 10/1993 |
| EP | 0822683 | 2/1998 |
| EP | 0822683 A2 | 2/1998 |
| EP | 1172962 A2 | 1/2002 |
| EP | 1331750 A1 | 7/2003 |

* cited by examiner

*Primary Examiner*—Chieh M. Fan
*Assistant Examiner*—Eva Puente

(57) ABSTRACT

The invention represents a parallel and distributed approach to clock recovery based on multiple mutually phase shifted sample clock signals (åS) defining a set of orthogonal clock phases. The phase shifted clock signals are used for obtaining an input data sample representation (åU). Input data transition detection is accomplished by determining, for each one of the above clock phases, whether input data samples within a detection window associated with the respective clock phase include an input data transition vector (I). A corresponding clock selection control signal vector (I) is generated based on the input data transition vector (I) to determine a clock selection master. In order to dynamically extract an output clock signal, to control signal vector (I) is then logically combined with a representation (åS'), preferably a rotated version, of the sample clock vector (åS).

16 Claims, 43 Drawing Sheets

| $q_1q_0$ | RTV | | | | | | | |
|---|---|---|---|---|---|---|---|---|
| | 000 | 001 | 011 | 010 | 110 | 111 | 101 | 100 |
| 00 | 0 | 0 | 0 | 0 | 0 | 0 | 0 | 0 |
| 01 | 0 | 0 $q_0^+$ | 1 | 1 | 1 | 1 | 0 | 0 |
| 11 | 0 | 0 | 0 | 0 | 0 | 0 | 0 | 0 |
| 10 | 0 | 0 | 0 | 0 | 0 | 0 | 0 | 0 |

$q_0^+ = \overline{q_1} \cdot q_0 \cdot T + \overline{q_1} \cdot T \cdot \overline{V}$

Fig. 11B

| $q_1q_0$ | RTV | | | | | | | |
|---|---|---|---|---|---|---|---|---|
| | 000 | 001 | 011 | 010 | 110 | 111 | 101 | 100 |
| 00 | 0 | 0 $q_1^+$ | 0 | 0 | 0 | 0 | 0 | 0 |
| 01 | 0 | 0 | 1 | 0 | 0 | 1 | 0 | 0 |
| 11 | 1 | 1 | 1 | 1 | 1 | 1 | 0 | 1 |
| 10 | 1 | 1 | 1 | 1 | 0 | 0 | 0 | 0 |

$q_1^+ = q_1 \cdot q_0 + q_1 \cdot \overline{R} \cdot \overline{AR} + q_0 \cdot T \cdot V$

Fig. 11A

D : Monitored input data signal, with stable states Low and High
A : Acknowledge signal (ACK) from successfully resetted units

Fig. 15B $q_0^+ = \overline{q}_1 \cdot q_0 + \overline{q}_1 \cdot D + q_0 \cdot D$

Fig. 15A $q_1^+ = q_1 \cdot q_0 + q_0 \cdot A + q_1 \cdot \overline{A}$

Fig. 19A $q_1^+ = q_1 \cdot q_0 \cdot \overline{AR} + q_1 \cdot q_0 \cdot \overline{REL} \cdot \overline{AR} + q_1 \cdot \overline{R}$

Fig. 19B $q_0^+ = \overline{q_1} \cdot q_0 \cdot \overline{AR} + q_1 \cdot q_0 \cdot \overline{AR} + \overline{q_1} \cdot TR_i \cdot \overline{AR} + q_0 \cdot \overline{REQ} \cdot \overline{AR}$ ■ = *Controlled by forced asynchronous reset, AR*

Fig. 24A

| $q_1 q_0$ | $REQ\, S_U\, S_L$ | | | | | | | |
|---|---|---|---|---|---|---|---|---|
| | 000 | 001 | 011 | 010 | 110 | 111 | 101 | 100 |
| 00 | 0 | 0 | 0 | 0 | 0 | 0 | 0 | 0 |
| 01 | 0 | 1 | 0 | 0 | 0 | 0 | 0 | 0 |
| 11 | 1 | 1 | 0 | 0 | 1 | 1 | 1 | 1 |
| 10 | 0 | 0 | 0 | 0 | 1 | 1 | 1 | 1 |

$q_1^+ = q_1 \cdot q_0 \cdot \bar{S}_U + q_1 \cdot REQ + q_0 \cdot \overline{REQ} \cdot \bar{S}_U \cdot S_L$

Fig. 24B

| $q_1 q_0$ | $REQ\, S_U\, S_L$ | | | | | | | |
|---|---|---|---|---|---|---|---|---|
| | 000 | 001 | 011 | 010 | 110 | 111 | 101 | 100 |
| 00 | 0 | 1 | 0 | 0 | 0 | 0 | 1 | 0 |
| 01 | 0 | 1 | 0 | 0 | 0 | 0 | 1 | 0 |
| 11 | 1 | 1 | 1 | 1 | 0 | 0 | 0 | 0 |
| 10 | 0 | 0 | 0 | 0 | 0 | 0 | 0 | 0 |

$q_0^+ = q_1 \cdot q_0 \cdot \overline{REQ} + \bar{q}_1 \cdot \bar{S}_U \cdot S_L + q_0 \cdot \overline{REQ} \cdot \bar{S}_U \cdot S_L$

TRUTH TABLE

"INPUTS" / "OUTPUTS"

| | | | | | |
|---|---|---|---|---|---|
| 0 | 0 | 0 | 1 | 1 | 1 |
| 0 | 1 | 1 | 1 | — | — |
| 0 | 0 | 0 | 0 | 0/1 | 1 |
| 0 | 0 | 0 | 0 | 1 | 0/1 |
| 0 | 1 | 0 | 1 | — | — |
| 0 | 0 | 1 | 1 | — | — |

Fig. 27

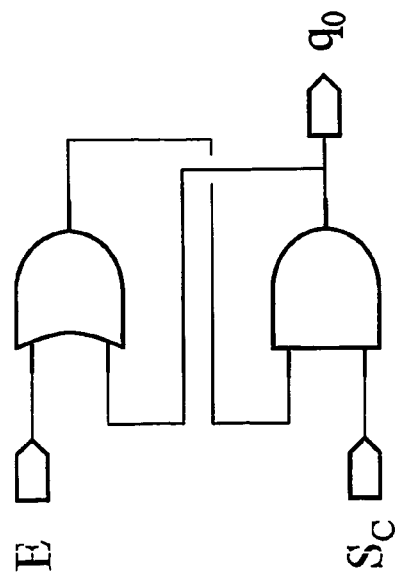
Fig. 36C
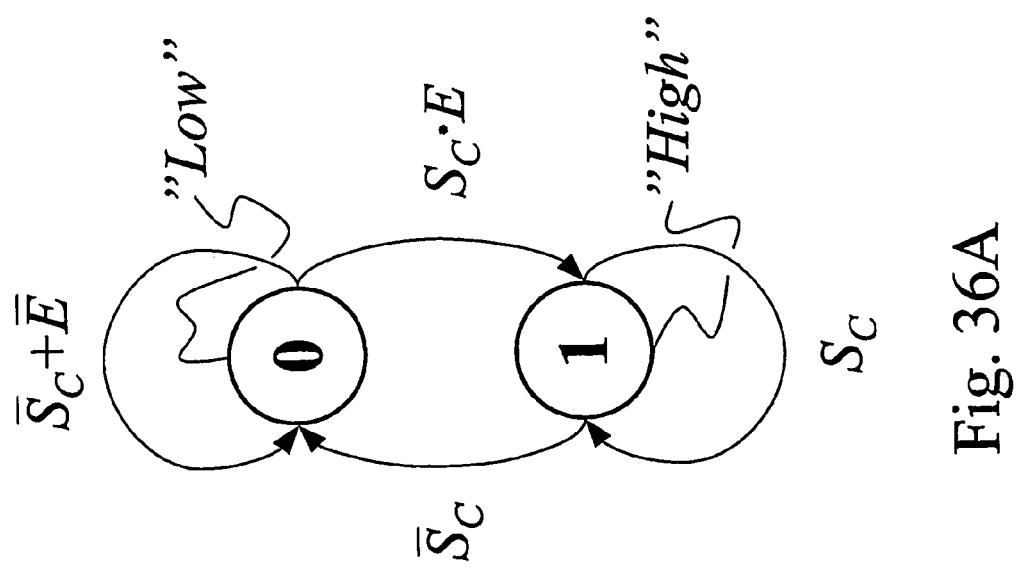
Fig. 36B
Fig. 36A

| $q_1q_0$ | PH 00 | 01 | 11 | 10 |
|---|---|---|---|---|
| 00 | 0 | 1 | 1 | 0 |
| 01 | 1 | 1 | 1 | 1 |
| 11 | 0 | 0 | 0 | 0 |
| 10 | 0 | 0 | 0 | 0 |

$q_0^+ = \overline{q}_1 \cdot q_0 + \overline{q}_1 \cdot H$

Fig. 38B

| $q_1q_0$ | PH 00 | 01 | 11 | 10 |
|---|---|---|---|---|
| 00 | 0 | 0 | 0 | 0 |
| 01 | 1 | 1 | 1 | 1 |
| 11 | 1 | 1 | 1 | 1 |
| 10 | 0 | 1 | 0 | 0 |

$q_1^+ = q_1 \cdot q_0 + q_0 \cdot \overline{P} + q_1 \cdot \overline{P}$

Fig. 38A

MULTIPHASE CLOCK RECOVERY

TECHNICAL FIELD OF THE INVENTION

The present invention generally relates to communication systems and digital clock recovery in such systems.

BACKGROUND OF THE INVENTION

High-speed digital communication channels or links often employ implicit synchronization with the source clock embedded in the transferred data. To interpret the input data correctly in another synchronous system or clock domain the source clock must first be recovered from the often sparse data transitions occurring in an irregular pattern. A fundamental object for any clock recovery mechanism is to extract timing information from an incoming data stream without the explicit knowledge of the source clock, hence the label embedded clock is often used to state that no explicit clock accompanies the input data.

A clock signal is merely a regular data pattern alternating between marks and zeros (0101 . . . ). In general, a non-coded data stream contains significantly less synchronization information or transitions than a regular clock signal since the logic state may remain unaltered for more than one clock cycle.

Synchronous digital systems involve sequential storage elements, often implemented using asynchronous combinatorial feedback networks, that are updated synchronous to the logic state transition of a system clock signal, i.e. low to high or reverse for a negative edge triggered system. Hence a retiming circuit is required to continuously align an asynchronous sample or system clock to the incoming data. In such a system, an independent local clock source located at the receiver side will be synchronized to the incoming source clock rate.

Receiving the input data correctly hence necessitate a clock recovery mechanism that ensures sampling of the input data ideally in the middle of the data bit. Unfortunately Non Return to Zero (NRZ) encoding is widely used, which in turn does not prevent long sequences of marks (logical high state or one) or zeros (logical low state or zero) in a row. Aligning a sample clock to the incoming data is thus a difficult task when there is little synchronization information (edge transitions) available due to NRZ type of coding schemes.

Conventional accurate data receivers designed to operate without malfunction over a wide range of conditions are often sensitive to excessive input data cycle-to-cycle variations. Severe limitations in the clock recovery mechanism tend to impose unnecessary restrictions on the input data variation.

Common practice of clock recovery is to employ a resonant circuit, often denoted a Q-tank, which has good filtering characteristics but also give rise to a large amount of jitter when the resonant circuit is left unaided between the data transitions (drift towards the natural resonant frequency). Naturally a more precisely tuned Q-tank has a resonant frequency, which is at least closer to the ideal source clock frequency, but there is always a residual frequency drift (due to source tolerances) especially with NRZ coded data that is not rich in the transitions necessary to guide the resonant circuit properly. Note also that a low loss (high Q) resonator has a very narrow band of acceptable input frequencies and thus may reject an offseted source totally with a significantly reduced flexibility at hand.

Various all-digital solutions have emerged to address this and other shortcomings of the analog approaches. Phase locked loops (PLL) together with transition detectors converting the input data to a format, which is richer in transitions and hence allow conventional phase lock techniques to be applied. On the down side is the inherent low pass filtering characteristic of such a phase locked loop. High frequency jitter on the input data signal cannot be tracked (followed) which pose a limit on the final or limit jitter tolerance of the digital clock recovery circuit. A class of particularly interesting and useful clock recovery circuits is based upon the usage of multiphase sample clocks that are asynchronous to the input data, as described for example in U.S. Pat. No. 4,189,622, U.S. Pat. No. 4,415,984, U.S. Pat. No. 4,821,297, U.S. Pat. No. 4,977,582, U.S. Pat. No. 5,488,641, U.S. Pat. No. 5,822,386, U.S. Pat. No. 6,044,122, U.S. Pat. No. 6,130,584, European Patent Application 0 390 958, and European Patent Application 0 480 165. Typically, a number N of equally spaced sample clocks with a period close to the largest input data bit rate is supplied by a delay locked loop or similar means and used for parallel transition edge detection. However, the predominant trend for conventional multiphase clock recovery systems is to employ a centralized clock mux control mechanism of high complexity for updating the phase of recovered clock to more or less accurately fit the desired predetermined relation to the detected input data transitions. In that process, the recovered clock and the input data transitions are compared, but the instantaneous parallel transition indication information is terminated by the centralized control mechanism in the usual increment/decrement manner associated with feedback-based clock synthesis. Unfortunately, step-wise feedback regulation generally results in poor acquisition performance, as well as relatively slow phase tracking response once acquisition has been completed.

SUMMARY OF THE INVENTION

The present invention overcomes these and other drawbacks of the prior art arrangements.

It is a general object of the present invention to provide an improved mechanism for digital clock recovery.

It is a particular object of the invention to provide a novel clock recovery system with excellent performance characteristics.

It is also an object of the invention to provide an improved method for digital clock recovery.

Yet another object of the invention is to provide a clock recovery mechanism that allows reduced complexity implementations of the control and supervision logic. In this aspect, it is desirable to provide a flexible and scalable approach to extract synchronization information from an irregular pattern of input data.

Still another object of the invention is to design a clock recovery system, which in contrast to conventional feedback-based clock recovery systems has at least reduced sensitivity to input data history, perturbations and abnormal input data conditions, and which is not based on delay-sensitive feedback processing.

These and other objects are met by the invention as defined by the accompanying patent claims.

The invention represents a parallel and distributed approach to clock recovery based on multiple mutually phase shifted clock signals defining a set of orthogonal clock phases. The clock recovery system operates on an input data sample representation obtained through sampling of an input data signal with the phase shifted sample clocks. The clock recovery system comprises a set of individual transition detectors for processing the input data sample representation, as well as a corresponding set of clock selection controllers and functionality for dynamically extracting an output clock from the set of mutually exclusive phase shifted clock signals under the control of the clock selection controllers.

In general, each transition detector is adapted for determining whether or not input data samples within a detection window associated with a respective one of the above clock phases includes an input data transition. Each clock selection controller, also referred to as a basic control unit, is conveniently connected to a respective transition detector, and associated with a unique clock phase. Instead of having a centralized clock selection control mechanism, the selection of a new sample clock phase is preferably performed in such a manner that there is a self-appointed dynamic clock selection master controlling the output clock until a new clock selection controller requests clock master control following the detection of a new data transition by another transition detector. The output clock is hence dynamically selected, initially triggered by an input data transition, from the ensemble of mutually exclusive sample clocks.

The entire decision logic is hence preferably distributed and transferred down to individual control units and building blocks operating independently of each other. The overall dynamic clock selection is conveniently performed completely in parallel by the individual control units, each of which acts as a gatekeeper to a unique sample clock phase. In this way, the clock recovery system only requires small, low complexity building blocks, as opposed to a conventional centralized phase selection topology, which generally requires a far more complex overall control and supervision logic. The building blocks of the clock recovery system may be implemented as synchronous or asynchronous state machines without any limitation.

The parallel transition indication information is hence not terminated by any centralized control mechanism in the usual increment/decrement manner associated with feedback-based clock synthesis. Instead, the all-through parallelism of the clock recovery mechanism proposed by the invention makes the clock recovery system virtually insensitive to input data history, in contrast to feedback-based clock recovery systems that are input pattern and sequence sensitive. As should be understood, there is no clock domain or reference phase associated with the clock selection process. In addition, the clock recovery mechanism according to a preferred embodiment of the invention provides instantaneous resynchronization upon every input data transition, without any black out periods and delay sensitive feedback-based information processing. For the same reason, other advantages include limited impact of perturbations and reduced sensitivity to abnormal input data conditions. Data jitter frequencies up to the bit rate can be followed in jitter tracking mode. Edge to edge varying jitter is not in general averaged since a new sample phase selection decision is taken in response to every input data transition.

More specifically, each clock selection controller normally requests clock master control only if an input data transition is detected by the associated transition detector. Each clock selection controller continuously monitors if any of a predetermined group of clock selection controllers requests clock master control, and releases its own possible clock master control if such a request is detected. It furthermore acquires clock master control only when no clock selection controller is in clock master control. The recovered output clock is dynamically extracted from a clock signal with a clock phase associated with the clock selection controller currently in clock master control. This implies that there is no single centralized source of information anywhere in the entire system indicating which sample phase that is currently selected to produce the recovered output clock. The interaction and communication between different control units is normally handled through global signaling together with handshaking and handover processes, preferably using general indicator and request signals formed by simple superposition of individual indicator and request signals generated by the distributed control units.

By performing so-called request filtering, carefully selecting, for each considered clock selection controller, the associated group of clock selection controllers that are monitored for clock master control requests, it is possible to limit the cycle-to-cycle phase changes of the output clock signal. Preferably, the associated group of clock selection controllers comprises a number of controllers, each of which is associated with a clock phase within a given phase distance from the clock phase of the considered clock selection controller. If the group of clock selection controllers is not restricted for any considered controller every new input data transition will unconditionally trigger a clock master control update irrespective of the change in phase of said output clock signal. In this latter case, the clock recovery system will operate in so-called bit rate jitter tracking mode.

Preferably, each clock selection controller is adapted for acquiring clock master control in two steps, by awaiting that all prior control of the clock mux is released, and ending its own request for clock master control.

The simple, yet robust handshaking procedure in the above clock phase selection procedure generally results in predictable behavior and characteristics of the overall clock recovery system.

The mechanism for the actual clock extraction is preferably implemented as a distributed clock signal multiplexor that responds to the parallel clock selection signals independently accessed from the respective clock selection controllers as well as the phase shifted clock signals for dynamically gating one of the phase shifted clock signals as the recovered output clock signal. In this respect, it is worth noting that each clock selection controller is normally associated with another clock phase than that of the transition detector to which it is connected.

The clock recovery system may also be implemented with a hold latch, connected to the output of the clock signal multiplexor, and controlled to suppress impact of spurious transitions, prevent parasitic transitions and/or enable adaptive pulse broadening of the output clock signal.

Differently expressed, using the mathematical concepts of vectors and orthogonal systems in linear spaces, the clock recovery mechanism according to a preferred embodiment of the invention samples an input data signal with a multiphase clock signal vector to obtain an input data sample vector. The input data sample vector and the multiphase clock signal vector are then utilized for input data transition detection to obtain an input data transition vector, which forms the base for generating a corresponding control signal vector. The control signal vector is finally logically combined with a representation of the multiphase clock signal vector to dynamically generate an output clock signal, preferably by projecting the multiphase clock signal vector representation along the control signal vector. The vector form used for the involved signals in the different stages of the clock recovery mechanism reveals that the parallelism is present not only in the transition detection, but also in the actual clock selection.

The entire clock recovery mechanism, including both transition detection and clock selection control, is hence preferably based on an all-through parallel and fully distributed algorithm.

The invention offers the following advantages:

Flexible and scalable approach to extract synchronization information from an irregular pattern of input data;

Parallel and distributed clock recovery mechanism without any centralized clock selection;

Possibility of implementations based on low complexity building blocks;

Virtually insensitive to input data history;

Instantaneous resynchronization upon every input data transition, without any black out periods and delay sensitive feedback-based information processing;

Limited impact of perturbations and reduced sensitivity to abnormal input data conditions;

Suppressed impact of spurious transitions, prevented parasitic transitions;

Adaptive pulse broadening; and

Flexible limitation of the cycle-to-cycle phase changes of the output clock.

Other advantages offered by the present invention will be appreciated upon reading of the below description of the embodiments of the invention.

BRIEF DESCRIPTION OF THE DRAWINGS

The invention, together with further objects and advantages thereof, will be best understood by reference to the following description taken together with the accompanying drawings, in which:

FIGS. 11A-B are slightly modified Karnaugh diagrams for the next state functions $q_1^+$ and $q_0^+$ illustrating the transition indicator state machine behavior;

FIGS. 15A-B are illustrative Karnaugh diagrams for the asynchronous transition detector with acknowledge (A) and data (D) inputs;

FIGS. 19A-B are slightly modified Karnaugh diagrams for an exemplary clock mux control unit;

FIGS. 24A-B are schematic Karnaugh diagrams for an individual request filtering unit;

FIG. 27 is a logical truth table for a single block of FIG. 26;

FIGS. 36A, B and C illustrate a hold latch state diagram, a next state Karnaugh diagram and a gate level logic implementation of an exemplary, preferred embodiment of the invention, respectively;

FIG. 38 is a Karnaugh diagram for the preferred implementation of the hold latch control circuitry (HLC) according to an exemplary embodiment of the invention;

DETAILED DESCRIPTION OF EMBODIMENTS OF THE INVENTION

Figure 1:
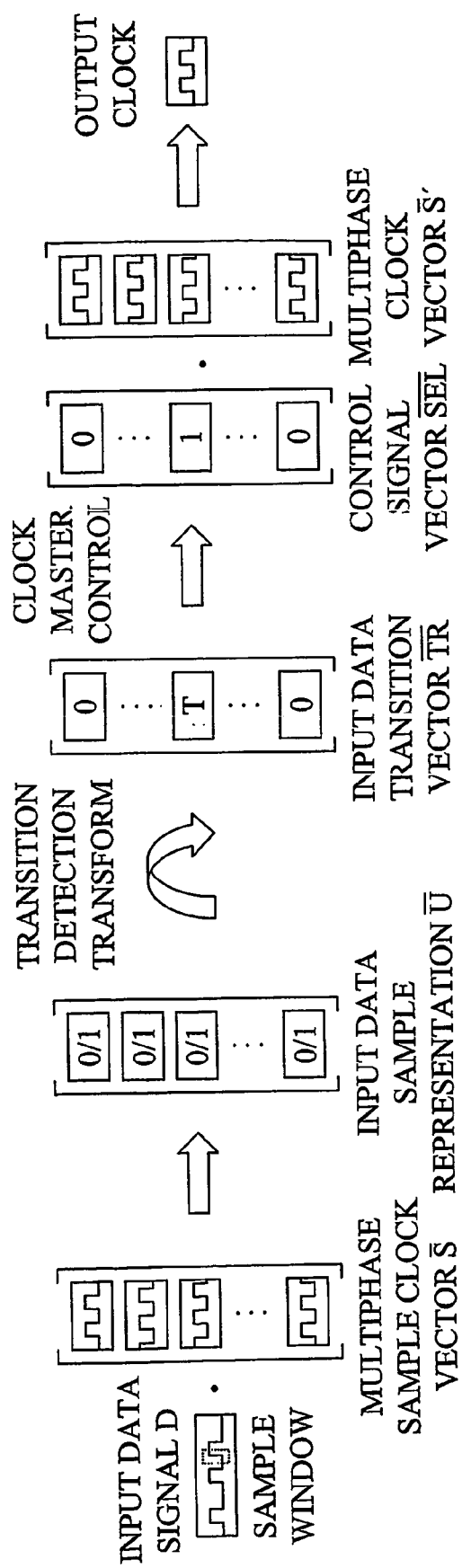
FIG. 1 is a schematic diagram illustrating an all-through vector-based clock recovery algorithm, including data sampling, transition detection as well as phase selection control.

Throughout the drawings, the same reference characters will be used for corresponding or similar elements.

A fundamental scope for a clock recovery mechanism is to extract timing information from an incoming data stream without any explicit knowledge of the source clock, hence the label embedded clock is often used stating that no explicit clock accompanies the input data.

The invention represents a parallel and distributed approach to clock recovery. The clock recovery mechanism proposed by the invention operates based on multiple mutually phase shifted sample clock signals defining a set of orthogonal clock phases. Using the mathematical concepts of vectors and orthogonal systems in linear spaces, a vector-based notation is introduced to fully disclose the parallelism in the clock recovery algorithm. With reference to FIG. 1, the mutually phase shifted clock signals, forming a multiphase sample clock vector ($\bar{S}$), are employed for sampling an input data signal D to obtain an input data sample vector ($\bar{U}$). In general, each input data sample element in the vector ($\bar{U}$) is only updated once during the sample clock cycle (period) associated with that particular sample element. Input data transition detection is represented by a transform designed to identify and uniquely sort out an input data signal transition and to algorithmically associate it with a suitable sample clock phase in the vicinity of the transition. This is preferably accomplished by determining, for each one of the above clock phases, whether input data samples within a detection window associated with the respective clock phase includes an input data transition, thus generating an input data transition vector ($\overline{TR}$). The output clock is dynamically selected from the ensemble of mutually exclusive sample clocks, initially triggered by an input data signal transition. Therefore, a corresponding clock selection control signal vector ($\overline{SEL}$) is generated based on the input data transition vector ($\overline{TR}$) to determine a clock selection master. The selection of a new sample clock phase is preferably performed in such a manner that there is a self-appointed dynamic clock selection master controlling the output clock until a new input data transition triggers another clock selection master. In order to dynamically extract an output clock signal, the control signal vector ($\overline{SEL}$) is logically combined with a representation ($\bar{S}'$), preferably a rotated version, of the sample clock vector ($\bar{S}$). The dynamic clock master control and output clock extraction may thus ultimately be reduced to a simple combinatorial logical combination task, preferably performed in parallel and in much resembling a simple scalar product operation, involving the control signal vector and the rotated multiphase sample clock vector.

In a system where no explicit clock accompanies the input data, an independent local clock source located at the receiver side is synchronized to the source clock rate, which is the origin for the input data, but with arbitrary noise and phase variation shaping and suppression abilities, acting such that the recovered clock has a cleaner noise spectrum with less jitter and frequency variations other than what the tracking algorithm introduces.

For a better understanding of the invention, reference will now be made to an example of a fully distributed clock recovery system implementing the clock recovery algorithm according to the invention. It should be understood that although this implementation is particularly advantageous, the invention is not limited thereto.

The clock recovery system basically comprises a set of individual transition detectors for processing an input data sample representation obtained by multi-phase sampling, as well as a corresponding set of clock selection controllers and functionality for dynamically extracting an output clock from the set of mutually exclusive sample clock signals under the control of the clock selection controllers. Instead of having a centralized clock selection control mechanism, the selection of a new sample clock phase is preferably performed in such a manner that there is a self-appointed dynamic clock selection master controlling the output clock until a new clock selection controller requests clock master control following the detection of a new data transition by another transition detector. The output clock is dynamically selected, initially triggered by an input data transition, from the ensemble of mutually exclusive sample clocks. The entire decision logic is hence preferably distributed and transferred down to individual control units and building blocks operating independently of each other.

Figure 2:
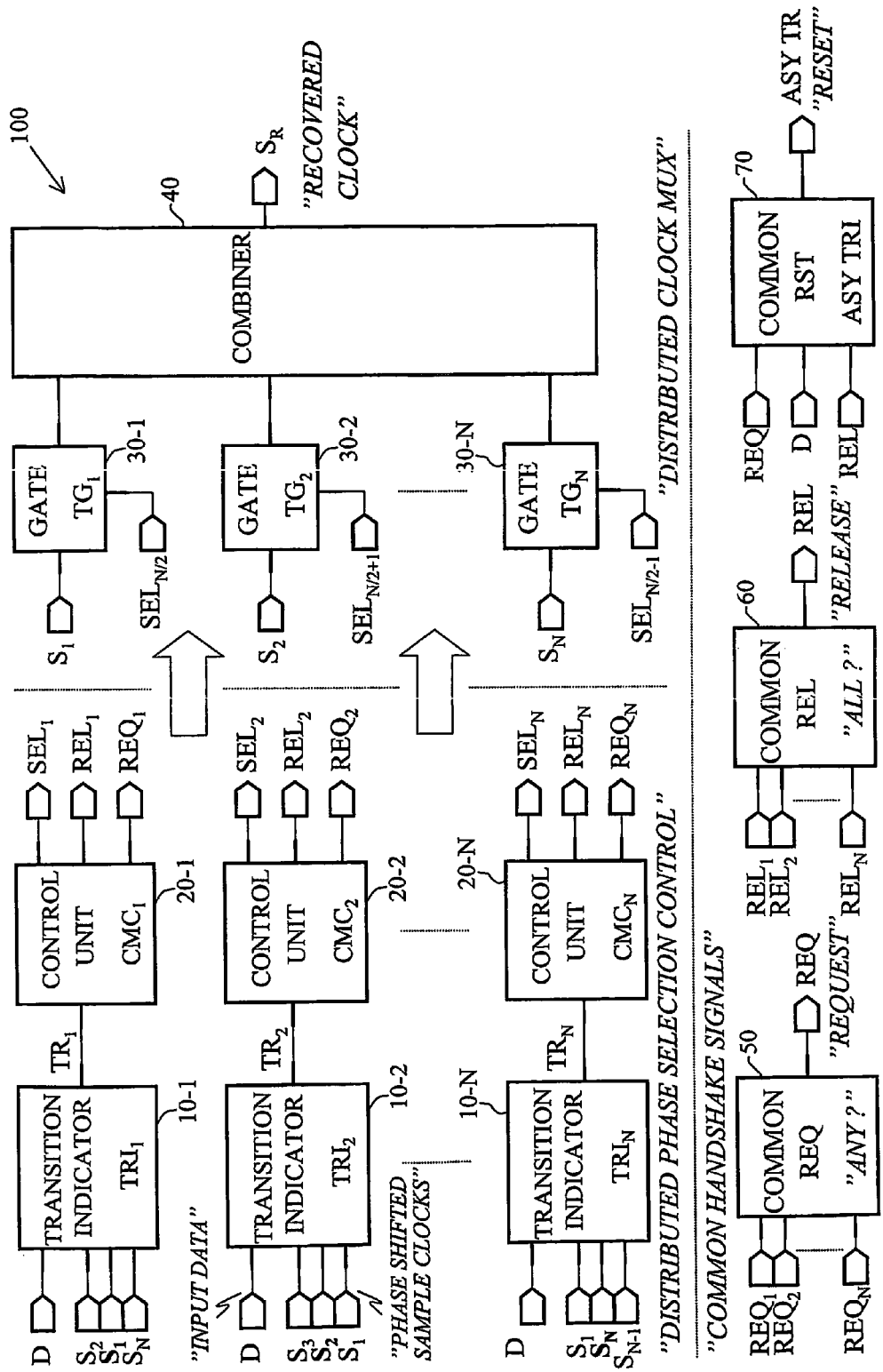
FIG. 2 is a schematic block diagram of a clock recovery system according to a preferred embodiment of the invention.

FIG. 2 is a schematic block diagram of a clock recovery system according to a preferred embodiment of the invention. The proposed clock recovery system depicted on block diagram level utilizes a fully distributed algorithm both for input data transition detection and control path for output clock selection. The clock recovery system 100 comprises a set of mutually exclusive transition detectors or indicators 10-1 to 10-N, also denoted $TRI_1, \ldots TRI_N$, a set of controllers or control units 20-1 to 20-N, also denoted $CMC_1 \ldots CMC_N$, as well as a distributed clock multiplexor formed by a set of gates, 30-1 to 30-N, also denoted $TG_1, \ldots, TG_N$, together with a subsequent combiner 40.

The nominally equally spaced sample clocks, $S_1 \ldots S_N$, used by the clock recovery system may for instance be generated by decoding a high frequency divider or using a delay locked loop. It is furthermore assumed that a time discrete representation (not shown in FIG. 2) of the input data signal D is extracted using the phase shifted sample clocks for use by the transition detectors or indicators 10. Each transition detector is adapted for determining whether input data samples within a detection window associated with a respective one of the above clock phases includes an input data transition. The transition indicators, $TRI_1 \ldots TRI_N$, hence define a set of N orthogonal input data edge detectors with respective sub detection windows, $SW_1 \ldots SW_N$, being formed around the sample phases. An input data transition is uniquely detected by exactly one transition indicator as a consequence of an arbitration algorithm included in each sub detector, as will be explained later on.

For clock selection, each transition indicator, $TRI_i$, is connected to an individual controller or control unit, $CMC_i$, which in turn generates a selector signal in response to the output of the respective transition indicator. The overall dynamic clock selection is conveniently performed completely in parallel by the individual control units, each of which acts as a gatekeeper to a unique sample clock phase, selectively opening the gate in response to the selector signal.

In this way, the clock recovery system only requires small, low complexity building blocks, as opposed to a conventional centralized phase selection topology. The gates 30 and the combiner 40 form a distributed clock multiplexor, or clock mux in short, which dynamically gates one of the phase shifted clock signals in response to the clock selector signals from the control units.

The clock recovery system further comprises blocks 50, 60, 70 for generating common handshake signals. A fully distributed clock recovery architecture preferably restricts all communication between different uncoupled (independent) control and detector units to common (global) signaling and handshake procedures. This provides means for a scalable solution with well-defined control paths without any associated timing constraints, opening up for asynchronous state machine implementations. As a matter of fact, preferred implementations are based solely on asynchronous state machines in all modules.

A detailed description of all individual modules (units) of the overall clock recovery system, both with respect to underlying algorithms and signaling, and in-depth logic implementation aspects will be given later on.

The proposed clock recovery function does not incorporate a feedback control system or any type of centralized control or clock selection mechanism. On the contrary it operates in an open-loop manner performing dynamic selection between a number of free running phase shifted sample clocks.

Some underlying fundamental mechanisms that are important for the distributed clock recovery system operation during one cycle between two consecutive input data transitions will now be described with reference to FIG. 3, which illustrates a typical clock recovery cycle on a high abstraction level.

Sampling of the input data using several phase shifted sample clocks provide a time discrete representation of the input data signal, $U_1 \ldots U_N$. Operating independently in parallel, a set of mutually (equally) delayed, with a delay $\Delta T_S$, synchronous transition detectors, TRI, process the sampled representation in order to capture an input data transition. Each indicator, $TRI_i$, associated with a sample phase, $S_i$, and a sub detection window, $SW_i$, evaluates a transition condition, $TR_i$, based upon the logic state of sample registers, $\ldots U_{i-1}$, $U_i$, $U_{i+1} \ldots$, located in the vicinity of the mid gitter (sample) point i (see 1 in FIG. 3).

Primarily, a new input data transition is identified by block 70, referred to as a common asynchronous transition detector and also denoted ASY TRI. Consequent action is merely to remove all not served requests, i.e. to reset control units in request mode, and optionally reset all other synchronous transition indicators.

Figure 3:
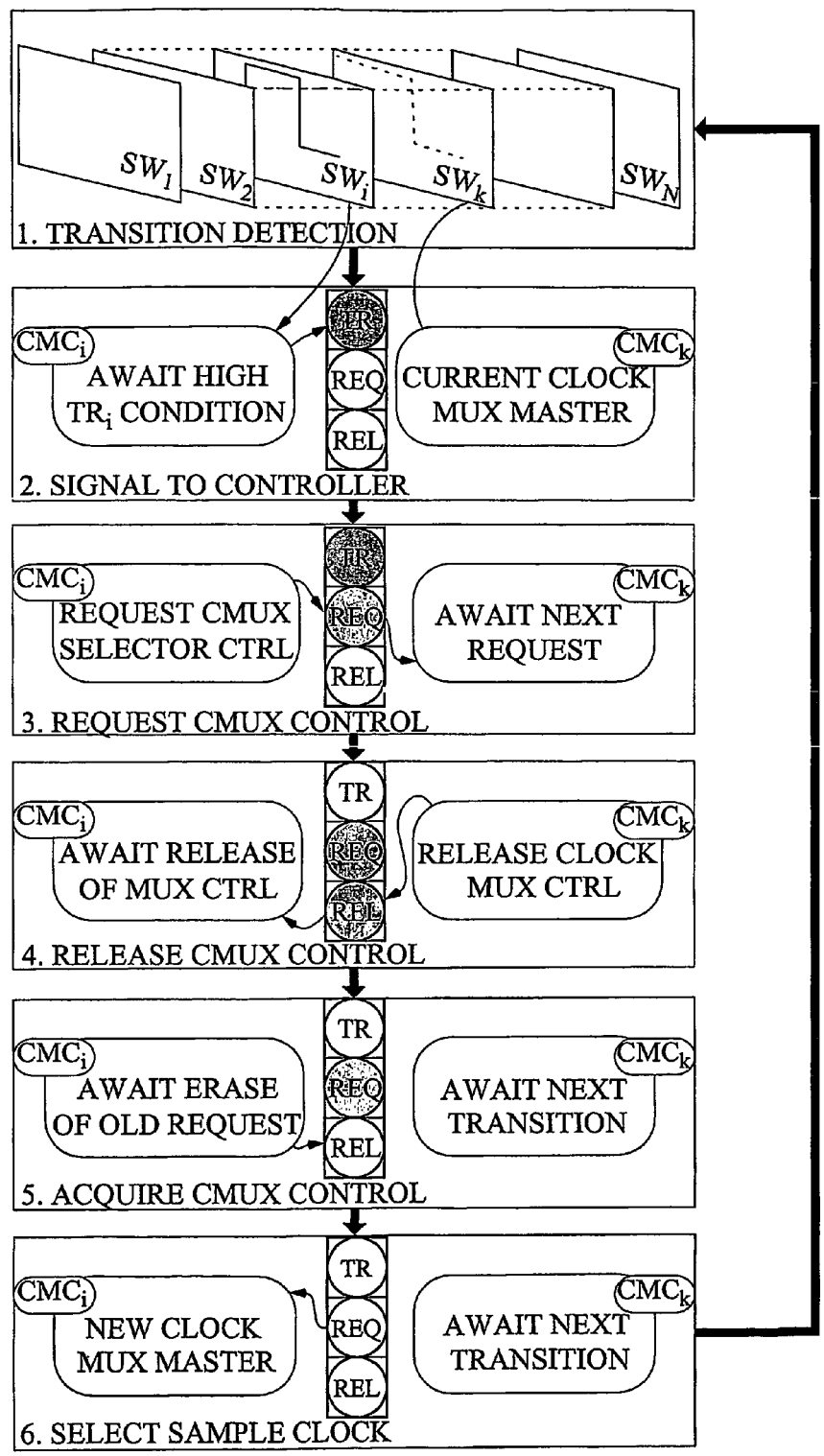
FIG. 3 is a schematic state diagram illustrating a basic operation cycle according to a preferred embodiment of the invention.

Continuous parallel processing of the sampled input data performed by the synchronous transition detectors uniquely identifies an input data transition in the detection window of the transition indicator closest to the input data signal transition, here denoted $TRI_i$, which in turn communicates the event to the associated clock mux control unit (controller), $CMC_i$, by raising the $TR_i$ condition (high), in essence waving a flag (see 2 in FIG. 3).

A control unit, $CMC_i$, that receives a transition indication immediately issues a request to attain control over the clock mux, CMUX (see 3 in FIG. 3).

The current clock mux master, $CMC_k$, that gained control over the clock selection during the previous data bit continuously monitor the global request signal, REQ, formed by a logical superposition of all individual request signals, $REQ_1 \ldots REQ_N$. If any other control unit has a valid request accepted by the request filter, REQF, the current master must inevitably release the clock mux control by returning to the initial state and wait for a new transition occurring in the vicinity of its associated sample phase (see 4 in FIG. 3).

In an exemplary realization, the requesting clock selection controller awaits that the overall release signal, REL, which is formed by a logical and superposition of all individual release signals, $REL_1 \ldots REL_N$, goes high. This indicates that there is no control unit with an active clock mux selector enabling any sample clock phase.

Before entering the control state the new pending master awaits that the overall (compound or global) request signal has gone low in order to avoid combinatorial feedback loops (see 5 in FIG. 3). Otherwise the control unit may respond to the earlier self-issued obsolete request and thus release control of the clock mux just to regain control again and loose it again and so forth. This type of behavior is related to delay properties in the global signaling compared to the "instantaneous" alteration of the local signals from individual control unit. In fact the proposed clock recovery algorithm preferably includes several local and global feedback loops. In an implementation based on asynchronous communicating state machines, all interactions are thoroughly examined to avoid malfunction and improper start up behavior, i.e. dead lock.

Hence, the important conditions for fully acquiring clock master control are, without any order, i) that no other clock selection controller requests clock master control, and ii) that the requesting controller ends its own request for entering clock master control.

When the overall request signal has been cleared, full control over output clock selection has been handed over to the new master (see 6 in FIG. 3). The selected clock has a predetermined and fixed offset relative to the input data transition, which is located inside the detection window associated with the transition detector and clock mux control unit that just gained control over the clock mux. The desired relation between data transition and selected clock is readily achieved by assigning the clock selection signal from the control unit to the proper sample phase in the gated clock mux function. To enhance the performance the assignment may be performed adaptively to account for different data speeds. The clock mux itself is however preferably a passive gated unit so the distributed architecture is not violated.

Now, the sample phase selection cycle is completed. Everything starts all over again when the next input data transition occurs; meanwhile the selected sample clock phase is used.

Figure 4:
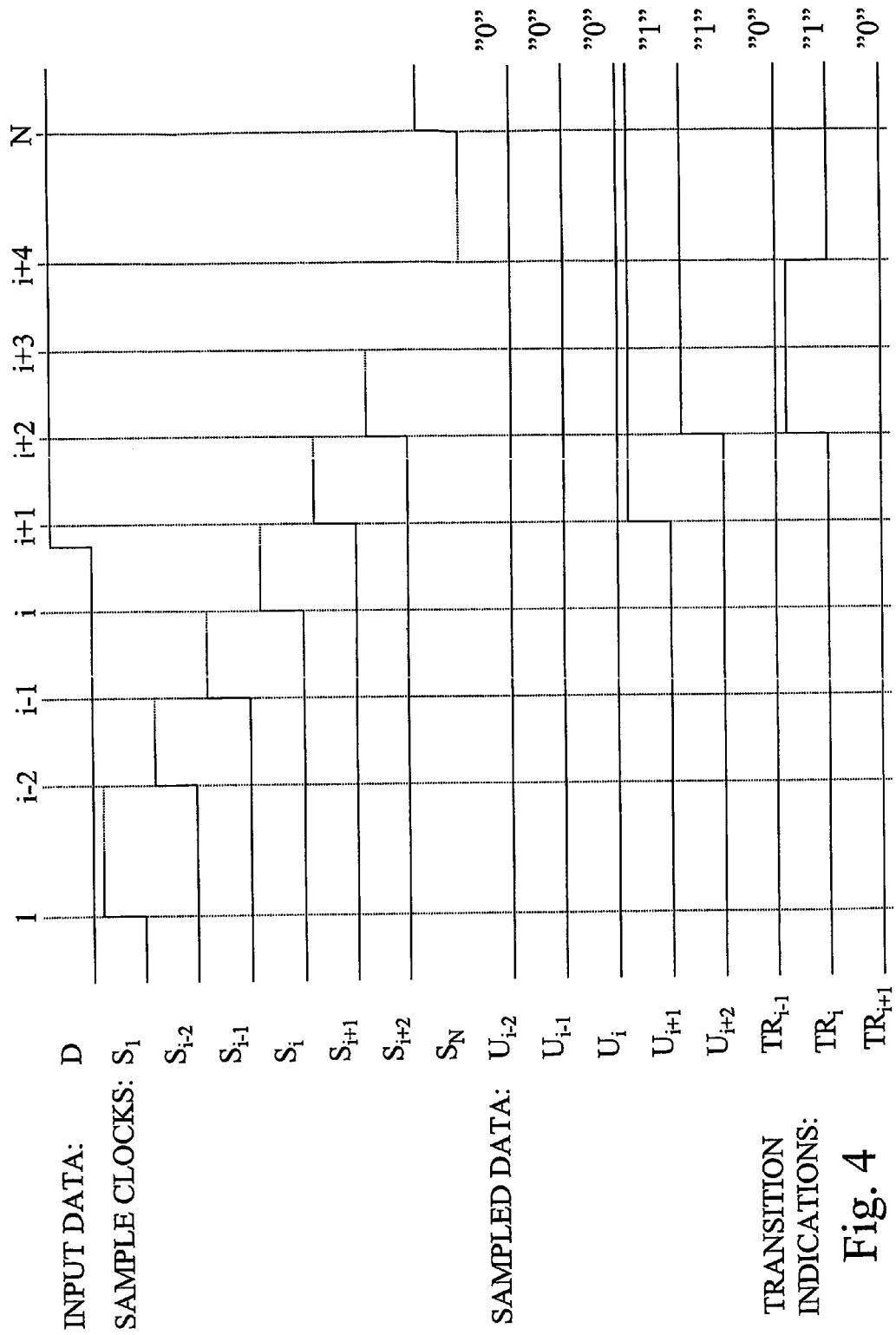
FIG. 4 is a schematic timing diagram illustrating an example of an input data signal, a set of sample clock signals, a selection of sampled data and associated transition indications.

FIG. 4 is a schematic timing diagram illustrating an example of an input data signal, a set of sample clock signals, a selection of sampled data and associated transition indications. A plurality of phase shifted, mutually delayed in time but frequency synchronous, sample clocks, $S_1 \ldots S_N$, are supplied to the clock recovery system, as seen in FIG. 4. Moreover, the input data is sampled into corresponding registers, $U_1 \ldots U_N$. The input data is sampled coincident with a principal recovered clock transition, positive or negative polarity dependent upon system architecture. A suitable sampling point often denoted data strobe point is located well apart from any data transitions. Ideal sampling is performed in the middle of a data "bit".

Each sample phase, $S_i$, has an associated transition detector, $TR_i$, which operates on the sampled (and held) representation of the input data signal, $U_1 \ldots U_N$. Note that the transition detection is unique and only one transition indicator, TRi, is high at a time even if the sampled data vector, $\overline{U}$, may contain several or a mix of ones and zeros.

Dynamic selection of the "most" suitable sample phase is achieved in a fully distributed, or parallel fashion, and in such a manner that each transition detector, $TRI_i$, is coupled to a distinct phase selection control unit, $CMC_i$, unique for that particular phase. No interaction exists between different selection control units other than through global request and release signals. Each phase selection control unit gates a sample clock phase offseted a suitable distance from a possible transition, thereby enabling a distributed recovered clock multiplexor, CMUX, through a simple superposition of all gated signals, similar to a logic OR operation, where only one output (gate) is active at a time to ensure proper operation.

Figure 5:
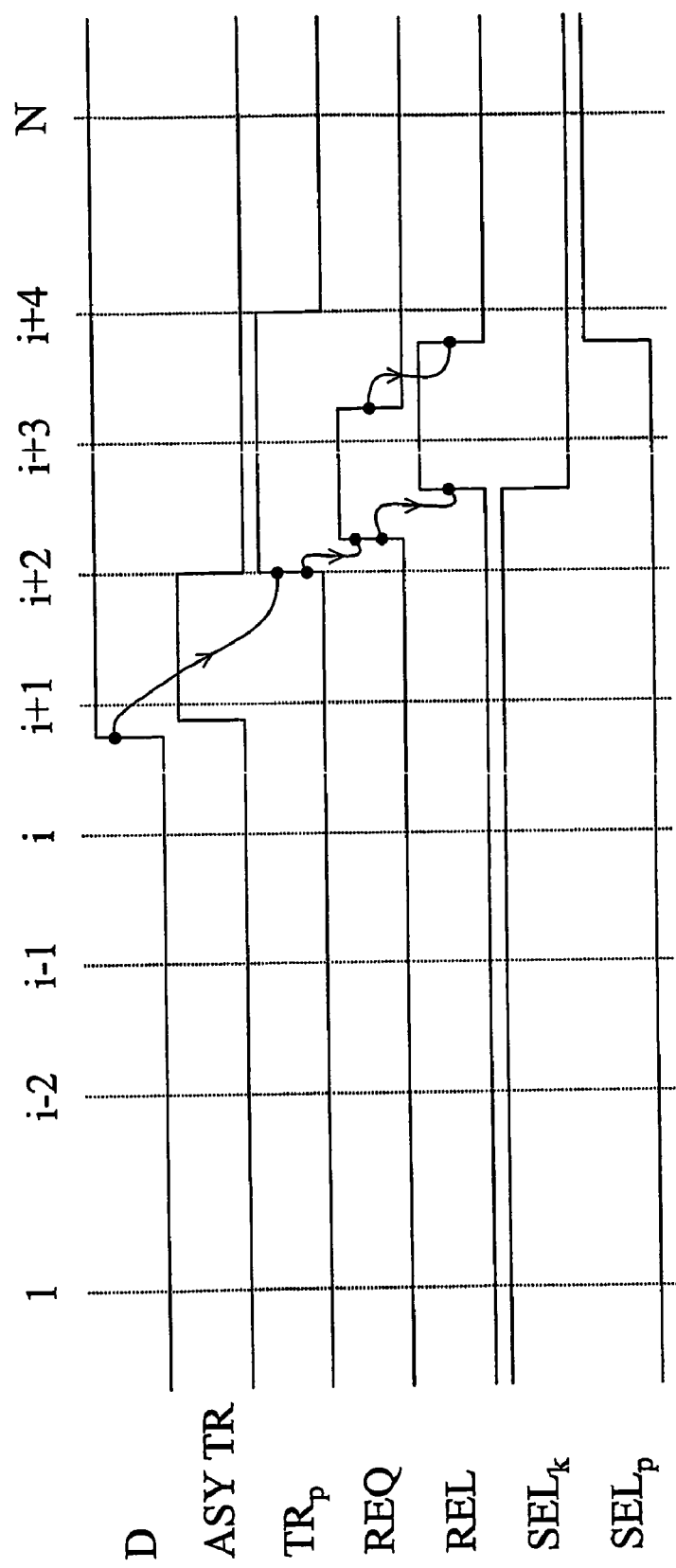
FIG. 5 is a schematic timing diagram illustrating an example of a transition indication together with the common request and release signals, and the relevant phase selection control signals control signals.

After an input data transition is detected near a particular sample phase, $S_p$, the associated clock selection control unit, $CMC_p$, signal a request to attain control of the recovered output clock, i.e. raises $REQ_p$ high, as seen in FIG. 5. Superposition of all individual request signals, $REQ_1 \ldots REQ_N$, through a logical ANY operation results in a global request signal, REQ. In fact all handshake signals, here TRansition, REQuest and RELease, are composed by the uncorrelated individual signals provided by the parallel clock mux control units, $CMC_1 \ldots CMC_N$.

The current active clock mux master, $CMC_k$, with origin from the previous data transition, detects a valid request only when the compound request signal, REQ, goes high, although without the explicit knowledge of from whom the request stems from. This is in fact the very essence of the distributed clock recovery.

To enable a different sample phase to appear on the recovered clock output, the clock mux control unit currently in charge must shift state, from $10_b$ to $00_b$ in the preferred implementation discussed below, and release the control, i.e. $REL_k$ goes high when $SEL_k$ goes low. After that the overall release signal, REL, also goes high to signal that none of the control units are active as clock selection master.

With none in active control the awaiting control unit shift state to become the new active clock selection master. Note that the global request signal has an associated delay and thus the new master must await that its own request has disappeared to prevent a false release triggered by combinatorial feedback. In practice an intermediate state ($11_b$) between request ($01_b$) and active master ($10_b$) states remove all delay dependency through additional handshake.

In the following, the invention will be described with reference to an example of a particular implementation, including an overall introductory discussion as well as a subsequent detailed description of basic building blocks.

Example of Practical Implementation

Figure 6:
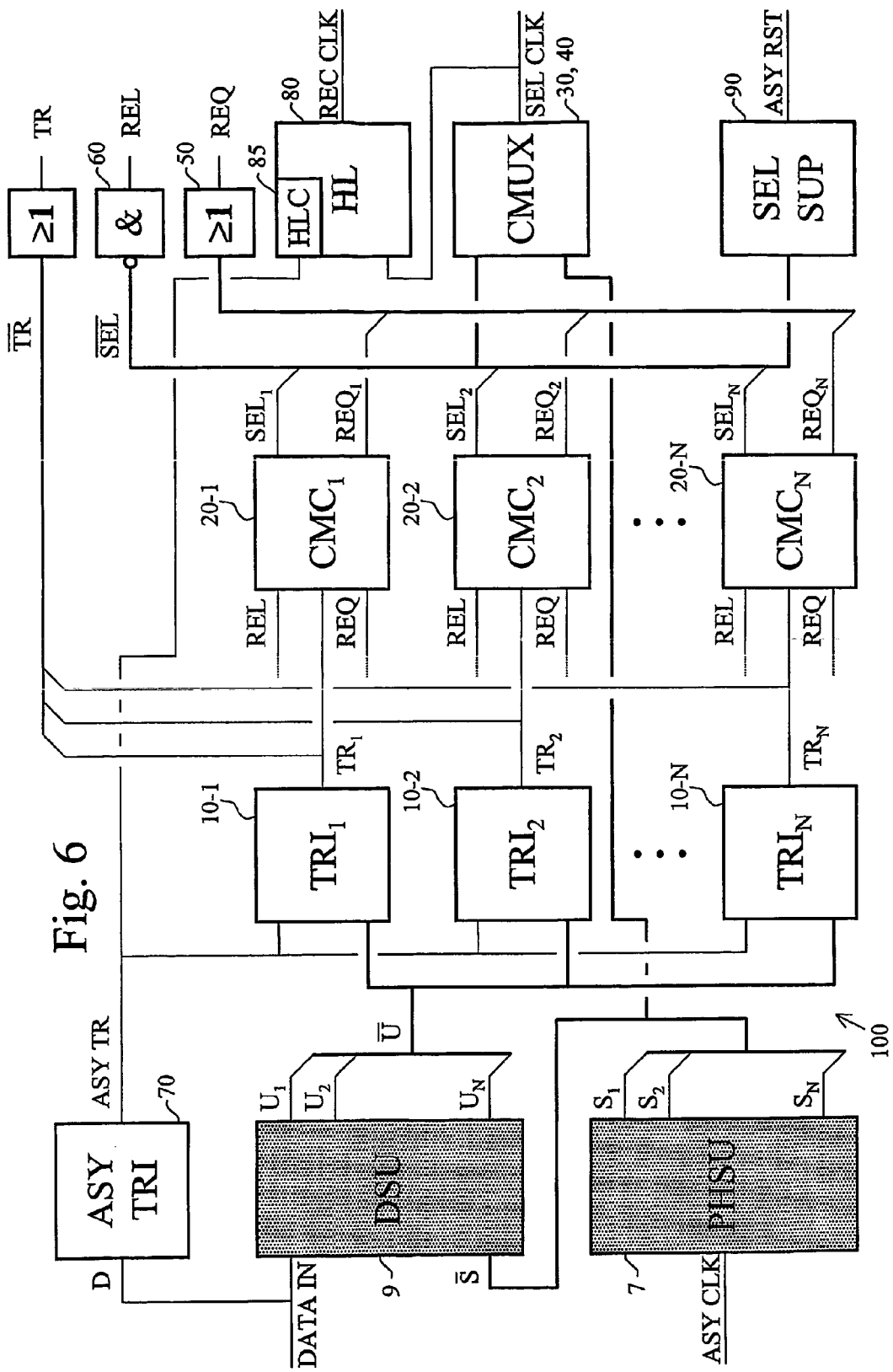
FIG. 6 is a schematic block diagram illustrating a practical implementation of a clock recovery system according to a preferred embodiment of the invention.

FIG. 6 is a schematic block diagram illustrating a practical implementation of a clock recovery system according to a preferred embodiment of the invention. The block diagram of FIG. 6 generally corresponds to the overall architecture outlined in FIG. 2, but illustrates a practical implementation in greater detail.

In addition to the basic building blocks mentioned in connection with FIG. 2, the clock recovery system 100 is now illustrated with a phase shift unit 7, also denoted PHSU, for generating the sample clocks, $S_1 \ldots S_N$, e.g. by decoding a high frequency divider or using a delay locked loop. The clock recovery system is also illustrated as having a data sampling unit 9, also denoted DSU, for sampling the input data signal, DATA IN, to extract a time discrete representation, $U_1 \ldots U_N$, of the input data signal by means of the set $\overline{S}$ of phase shifted sample clocks. The phase shift unit 7 and the data sampling unit 9 may, if desired, be considered as external modules and are presented shaded in FIG. 6.

Each phase shifted sample clock, $S_i$ that is eligible to be enabled and selected in the final clock mux unit 30, 40, CMUX, and thus becoming selected clock, SEL CLK, is associated with a unique transition indicator unit 10, $TRI_i$, cooperating closely with a corresponding clock mux control unit 20, $CMC_i$.

The block 50 for generating a common request signal is preferably formed by a simple OR gate, which logically combines the individual request signals, $REQ_1, \ldots, REQ_N$, into the compound request signal REQ. The block 60 for generating a common release signal is preferably formed by a simple AND gate with an inverting input, which in fact forms the compound release signal REL based on the selector signals, $SEL_1, \ldots, SEL_N$, inverted as input, thus simplifying the output interface of the clock mux control units 20.

The clock recovery system of FIG. 6 has bit rate jitter-tracking capabilities. In bit rate jitter-tracking mode, the asynchronous transition indicator 70, also denoted ASY TRI, generates an asynchronous transition indication, ASY TR, which acts as a common reset signal. Whenever a new input data transition has occurred, all non-served transition indicators 10 and clock mux control units 20 are reset into their initial states. Optionally, in bit error rate jitter tracking mode, all clock mux control units 20 including the current master in control of the clock mux are released through a reset operation.

The clock recovery system may also be equipped with a hold latch unit 80, denoted HL, which is added to the output of the clock mux unit 30, 40 in order to suppress spurious transitions, i.e. glitches, and prevent parasitic transitions that stem from the old clock source during handover. The overall hold latch functionality is for example partitioned into a low complexity and fast latch accompanied by an associated control unit 85, denoted HLC, containing the actual enable and disable logic circuitry. All positive clock mux transitions, from 0 to 1, are inhibited, similar to a freeze or hold operation, during the black out period after a new transition has been detected by the global asynchronous transition indicator, ASY TRI, but before the new master is activated. Transitions of opposite polarity, i.e. from 1 to 0, are not blocked in order to prevent data pulse shortening. Once handover to the new master is completed, the output is of course forced low. The largest pulse shortening possible is limited to half of the unit pulse duration.

The optional hold latch unit 80 limits the recovered clock period distortion to half a nominal cycle or an equivalent instantaneous frequency shift up to twice the nominal rate. In addition, the hold latch unit enable arbitrary cycle to cycle changes of the selected sample phase in bit rate jitter tracking mode but yet suppressing any positive transition (glitch) on the selected clock output during the handover from current to new master after a new data transition has occurred. Also, adaptive pulse broadening may be incorporated in the hold latch functionality to ensure that a selected clock pulse, which is initiated directly prior to an input data transition, is not terminated prematurely. This restricts the recovered clock period distortion due to change between arbitrary sample clock phases to half the nominal clock period, or equivalently double the output clock frequency.

If a hold latch unit is present in the clock recovery system, the asynchronous transition indicator 70 preferably generates an additional enable signal, denoted ASY EN, that turn on the hold latch function immediately after an new input data transition has occurred, to suppress spurious significant transitions.

Additional selection supervision circuitry 90, also denoted SEL SUP, may also be incorporated in the clock recovery system 100 for supervising the control units 20 and detect if more than one controller/selector 20 is active at a time, and generating a global reset signal ASY RST common for all relevant units. Consequent reset action thus help to resolve initiation problems.

Optional filtering of the global request signal, REQ, which is used to attain control over the clock mux selector, may be incorporated to limit the sample phase changes from cycle to cycle thus providing an inherent averaging process. Alternative configurations related to request filtering to obtain an averaged response is omitted from the top level diagram merely for the purpose of clearness and is discussed in detail in conjunction with the request filter unit, denoted REQF, later on.

In essence, an actual implementation of the proposed distributed, parallel clock recovery algorithm comprises multiple, independently operating instances of several types of sequential logic finite state machines, generically denoted FSMs. For instance a transition detector instance only communicate with its associated clock mux control unit without any explicit interaction with the other transition detectors. However the overall status and control signals such as request, REQ, release, REL and asynchronous transition indication, ASY TR, are formed based upon the collected state of an entire set of sequential state machines that all perform a similar task in parallel but without any specific knowledge about the individual states. All common signals except for the asynchronous transition indicator that relate directly to the input data signal are preferably pure simple combinatorial functions and nets implementing ANY (in REQ) or ALL (in REL) expressions. Both synchronous and asynchronous sequential logic implementations of the finite state machines are feasible. Synchronous state machines however require a high frequency system clock as well as additional explicit memory storage elements or registers to implement the state variables, denoted q and indexed according to their binary weight, that hold the logic machine state. Fundamental communication between the different sequential state machines by means of handshake procedures favor pure asynchronous state machine implementations. Already asynchronous by nature the preferred implementation of all state machines in the sequential logic units such as transition indicators, clock mux control and supervision units utilize feedback networks based upon logic functions triggered by changes in the state variables and inputs. State variables are no longer explicit elements but rather embedded in the combinatorial feedback functions where current and next states are separated only by the delay through the combinatorial nets. Lexicographically current and next states are separated by adding a plus as super index for the next state variables, for instance $q_1^+$ and $q_0^+$. Next state is a function of current state and all input signals to the particular unit and thus associated sequential finite state machine.

$$\begin{cases} q_1^+ = q_1^+(q_1, q_0, \text{inputs}) \\ q_0^+ = q_0^+(q_1, q_0, \text{inputs}) \end{cases} \quad \text{(Eq. 1)}$$

In essence, the sequential finite state machine change state in response to altered input signals. To avoid hazardous situations where the final state is ambiguous a change in state has to be triggered by a single input signal change where as all other input signals remain constant. Only one state variable is permitted to change at a time and thus only one bit in the state code can differ between adjacent states in the state diagram for an asynchronous sequential finite state machine. In addition the finial state must be stable to avoid combinatorial loops. In fact by close observation of the common request and release signals integrated in the state transition conditions the clock mux control units avoid combinatorial feedback loops on the clock recovery system level and remain insensitive to the transition timing and delay properties that are associated with semiconductor process and complexity in the synthesized logic (expression). Common global signals formed by a superposition of local signals from individual units are always delayed with respect to their individual local counterparts. These and many more sequencing issues are resolved by the fundamental stringent handshake procedures. In a state diagram for a particular logic unit a state transition is outlined by an arc with an arrow pointing at the destination state with the associated logic transition condition attached. Unconditional transitions, denoted u.c., occur almost immediately with only a physical circuit induced delay. At times several choices of transition conditions are available dependent on the desired clock recovery properties, such as bit rate jitter and modulation tracking versus filtered response. All state machines are Grey like coded such that only one bit differs between adjacent states. For instance a four-state machine may be coded as follows:

$$S_0 = 00_b, S_1 = 01_b, S_2 = 11_b, S_3 = 10_b \quad \text{(Eq. 2)}$$

No unused states are allowed to avoid unintentional absorbing states. If not otherwise stated the initial or idle state is $00_b$, with the notation "b" is added to stress that binary representation is used for the state coding. Only principal transitions vital to the overall operation are indicated in the state diagrams. Together with every state diagram a Karnaugh diagram is presented to even further clarify implementation considerations and choices. Arranged in a matrix fashion next state value is given for each state bit ($q_2$, $q_1$ or $q_0$ etc) as a function of current state and input signals. Each row represents the same state but with different input signal combinations. All input signal and state combinations are arranged such that only one bit differs between adjacent positions in the Karnaugh diagram. Enclosures of connected areas where the next state has the same value directly transform into logic reduction if the Karnaugh diagram is drawn as outlined previously. Hazard free operation requires that all uniform areas with the same next state are connected and the enclosures are overlapping. If not additional overlapping product terms must be added to the combinatorial expression to avoid race conditions and dependency on physical implementation properties. A one-to-one mapping exists between the Karnaugh diagrams and the next state combinatorial logic functions that ultimately are basis for a physical implementation. Primary sources of information are the defining combinatorial logic next state expressions presented as a sum of products, where as a multiple input logic OR is represented by a sum or plus and the product is an AND operation with a dot mark.

Transition Indicators and Input Data Sampling

All clock recovery schemes irrespective of topology nurture on input data transitions in order to accurately extract the vital source clock timing information as an integral part of the effort to convert the input signal into a data stream, basically extract the information content. Such transitions occur when the input data changes state and logic level for instance from a logic low to a logic high level, which correspond to a positive transition or vice versa for a negative transition. Effective data coding schemes does not rule out that the data signal may contain several symbols or data bits with equal value in a row, which in turn require a source clock extraction scheme in order to interpret the data signal at all. Troublesome data to follow and extract the source clock from consist of long sequences of constant symbols, succeeded by a fast transition such as from low to high and back to low again.

Input data signal transition detection is basically among the first operations that is performed during an operation cycle for the proposed distributed clock recovery method and system, as seen for example in FIG. 2. Although seemingly complicated the distributed process of input signal transition detection is based upon the evaluation of a set of simple transition conditions, $TR_1 \ldots TR_N$. Mathematically more accurately described as combinatorial logical functions by nature the transition conditions implemented in a set of independent non-overlapping transition indicators operate on a sampled description of the input data signal, $U_1 \ldots U_N$.

Figure 7:
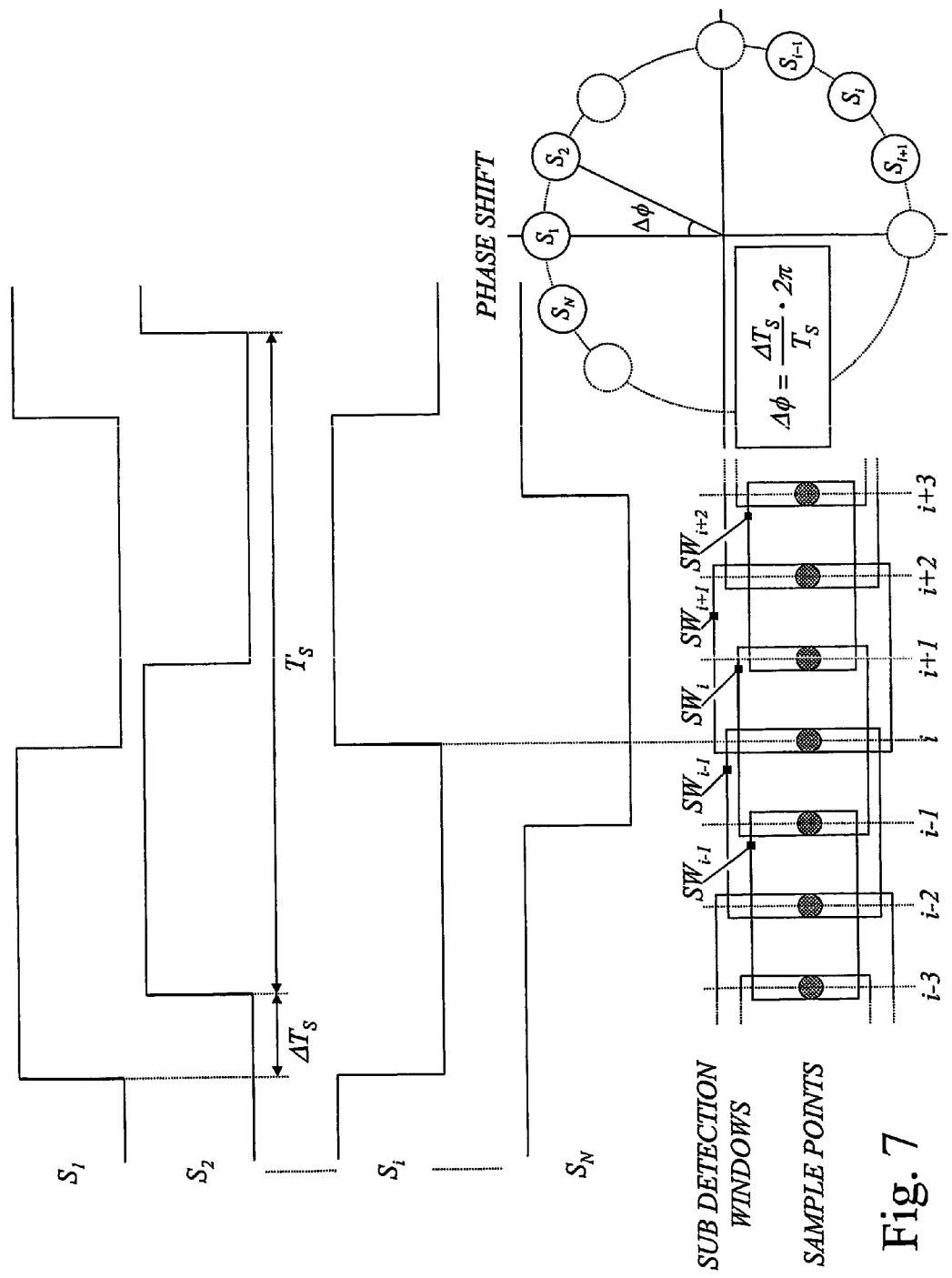
FIG. 7 illustrates how the sample phases may be equally distributed over one period.

Sampling of the input data signal is performed in parallel and thus does not require over-sampling. Instead, there are N independent memory elements commonly denoted registers, REG, each of which is updated by a unique sample clock and only once in that sample clock cycle. Memory elements exist in a large variety of implementations among which positively edge triggered sequential circuits such as D-flip flops are common and is used in the preferred embodiment of the proposed distributed clock recovery scheme. However the proposed clock recovery algorithm contain no limitations with respect to the particular choice of memory element topologies and signal conventions such as positive or negative edge triggered update. One important memory element feature that instead is important and required is the ability to hold the sampled data state between updates. Latches are thereby excluded unless they are used in a configuration that effectively implements an edge-triggered function. Periodic sample signals further denoted phase shifted sample clocks, $S_1 \ldots S_N$, that update the memory elements and that also are used in the clock selection part of the distributed clock recovery algorithm, i.e. the clock mux (CMUX), are supplied to the clock recovery unit from one or several external sources. Since all registers must be updated at different points in times but at a common rate the sample clocks are mutually delayed but all operate synchronously, i.e. has the same frequency such that the time interval between two consecutive updates for the same register never differs from that of any other register, as seen in FIG. 4. Furthermore, the mutual delays between two consecutive sample clock phases are chosen such that they never overlap, i.e. that two registers are updated at the same point in time. Causality is of paramount importance and requires that none of the sample phases does change place with its neighbors or effectively the associated register is not updated before the prior sample phase has transitioned or after the next consecutive sample phase has transitioned. If causality is not preserved none, erroneous or multiple transition indications follows a single input data transition. The sum of all sample phase delays must also be less than or equal one sample clock signal period. As seen in FIG. 7, the sample phases may be equally distributed over one period.

Returning briefly to the formation of the necessary transition condition, $TR_i$. Basically an input data signal transition that occur between two defining points in time, i.e. before an early but prior to a late sample phase transition, is said to fall within a predefined sub transition window, SW. In the preferred embodiment the sub detection window $SW_i$ is bounded by the sample points i−1 and i+1 respectively. Normally a transition has occurred within a sub detection window, SW, if two values of the sampled input data, $U_i$ and $U_j$, are dissimilar:

$$U_i \neq U_j|_{i,j \in SW} \Rightarrow U_i \cdot \overline{U_j} + \overline{U_i} \cdot U_j = U_i \oplus U_j = 1 \quad \text{(Eq. 3)}$$

In fact the transition condition (Eq. 3) constitute a simple exclusive OR operation based up on a sum, manifested in the OR operation and denoted by an uncircumscribed plus sign, of two individual and mutually exclusive AND conditions denoted by the dot products. Overstrike is equivalent to a logic inversion when a high symbol is replaced with a low and vice versa. Each AND condition requires that either one of the two sampled data values is high whereas the other is simultaneously low. Both positive, from low to high, and negative, from high to low, input data transitions are there by detected. Such a transition condition as (Eq. 3) only involves two sample points and is sensitive to metastability that is when the input signal is not stable during the register update sequence and thus may produce a non-deterministic output for several or more clock cycles. In the preferred embodiment the minimum sub detection window is replaced with a more practical one that incorporate three consecutive sample phases, namely i−1, and i+1, in the transition condition:

$$TR_i = (U_i \oplus U_{i+1} + U_{i-1} \oplus U_{i+1}) \cdot \overline{(U_i \oplus U_{i-1})} \quad \text{(Eq. 4)}$$

The two factors in the transition condition (Eq. 4) must both be true if a valid transition condition is to be asserted. The first part or factor consist of a regular transition condition, in this case involving samples $U_i$ and $U_{i+1}$ and thus detect an input data signal transition that occur between the center and late sample phases, together with one or several metastability correction factors. For instance if an input data transition occur between sample clock phases, $S_i$ and $S_{i+1}$, as seen in FIG. 4, the transition indication is pin-pointed to a single transition detection window and indicator, namely $SW_i$ and $TRI_i$ respectively. The normal transition condition is thus enhanced with several metastability corrections that involve other sample phases in the vicinity of the center phase, $S_i$, to ensure detection even if a metastability condition arise close to the center phase. In the preferred embodiment first order metastability correction is applied and thus three sample phases are sufficient. Further details regarding metastability enhancement may be found in the related Swedish Patent 516,280 regarding a window loss detector. Distinct transition detection require that each of the overlapping sub detection windows is pin-pointed to a specific sample phase and that an inherent arbitration algorithm resolve any ambiguity regarding multiple transition indications in response to a single input data signal transition. By choice input data transitions occurring between the early and center sample phases, i.e. i−1 and i, in the preferred embodiment are excluded with the arbitration factor:

$$\overline{U_{i-1} \oplus U_i} \quad \text{(Eq. 5)}$$

As opposed to a normal transition condition the arbitration factor act to preclude any transitions occurring in all except one of the overlapping time domains between one particular sub detection window and the others. Logic optimization bring the transition condition (Eq. 4) into an equivalent but more dense form well suited for an actual implementation:

$$TR_i = \overline{U_{i-1}} \cdot \overline{U_i} \cdot U_{i+1} + U_{i-1} \cdot U_i \cdot \overline{U_{i+1}} \quad \text{(Eq. 6)}$$

Again both positive and negative transitions are detected but with the additional benefit that spurious transitions such as glitches are suppressed in the transition condition. With even higher order metastability corrections this benefit is more evident but in essence an additional condition has been imposed, namely that the input data signal must remain at the same logical state or constant level at two or more sample occasions prior to the transition that is detectable in the sub detection window. Applied to the preferred embodiment with a first order metastability correction a constant sequence of two samples is required:

$$\begin{bmatrix} U_{i-1} \\ U_i \\ U_{i+1} \end{bmatrix} = \begin{bmatrix} 0 \\ 0 \\ 1 \end{bmatrix} \text{ or } \begin{bmatrix} 1 \\ 1 \\ 0 \end{bmatrix} \Rightarrow TR_i = 1 \qquad \text{(Eq. 7)}$$

The ensemble of transition indicators must form a complete set. Completeness ensures that no input signal transition is undetectable. Conceptually the transition indicators are linked together in a ring topology. In addition all transition indicators are orthogonal. Although the sub detection windows are overlapping the arbitration factors in the transition conditions, such as (Eq. 4), ensure that each transition indicator uniquely identifies an input data signal transition that occur within that particular sub detection window and is tied to the particular sample phase. Evidently each transition indicator and sub detection window is associated with a unique sample phase. None of the transition indicators are allowed to share reference phase with any other. In practice the entire sample phase period is monitored by equidistantly spaced transition indicators based upon transition conditions evaluated in overlapping sub detection windows with an additional inherent arbitration algorithm that uniquely identify each indication.

Figure 8:
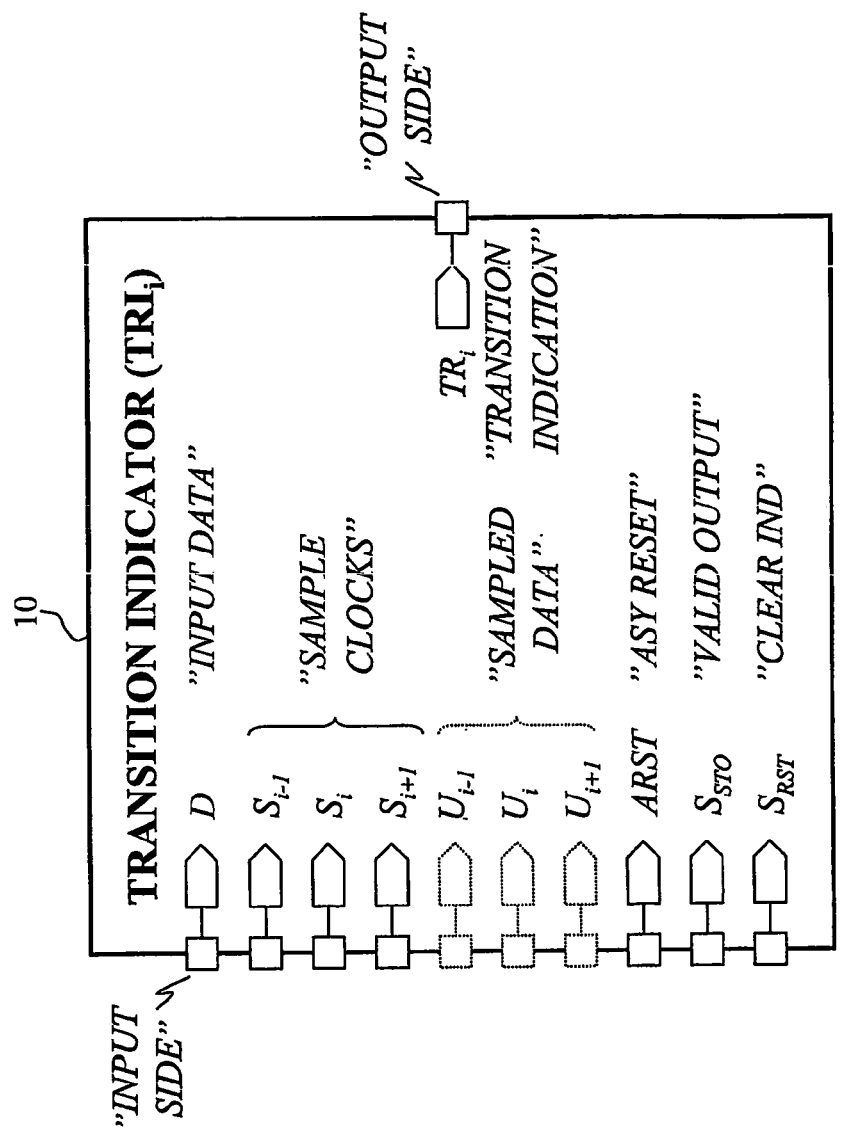
FIG. 8 is a schematic interface port diagram for a transition indicator according to an exemplary embodiment of the invention.

Apart from the fundamental combinatorial transition condition, $TR_i$, each synchronous transition indicator unit, $TRI_i$, consist of a finite logic state machine responsible for all communication with the associated clock mux control unit, $CMC_i$. A schematic interface port (block) diagram for the transition indicator, $TRI_i$, is exemplified in FIG. 8. Due to the distributed clock selection control architecture of the proposed clock recovery method and apparatus each individual transition indicator unit, $TRI_i$, has a transition indication output, $TR_i$, which in turn has a single connection to an unique clock mux control unit, $CMC_i$. No clock mux control units share a common transition indicator.

Each transition indicator unit performs several steps in a complete input signal transition detection cycle:

1. Form a purely combinatorial transition condition, $TR_i$, based upon the input data state and value sampled at all sample points within the sub detection window, $SW_i$, for instance [i−1, i, i+1].
2. Evaluate the transition condition in the initial sequential transition indicator machine state ($00_b$) to determine whether an input signal transition has occurred or not within the sub detection window and that thus can be tied to the particular sample clock phase of interest, $S_i$.
3. Whenever the transition condition is true, i.e. $TR_i$ goes high (1), the transition detector state machine shift from the initial state to the pre indication state ($01_b$).
4. However if the transition condition is no longer fulfilled, i.e. $TR_i$ goes low (0), or an asynchronous reset, ASY RST or AR, is issued the transition indicator state machine returns to the initial state ($00_b$) relentlessly monitoring the transition condition in search of a new valid input data transition.
5. If the transition condition is true and a store pulse or clock phase transition, $S_{STO}$, has been detected the transition indicator state machine transitions to the valid transition detected output state ($11_b$) and there by signal to the associated clock mux control unit, $CMC_i$, that a transition has occurred in the vicinity of the sample clock phase, $S_i$.
6. Await the proper reset condition or reset pulse or clock phase, $S_{RES}$.

Figure 9:
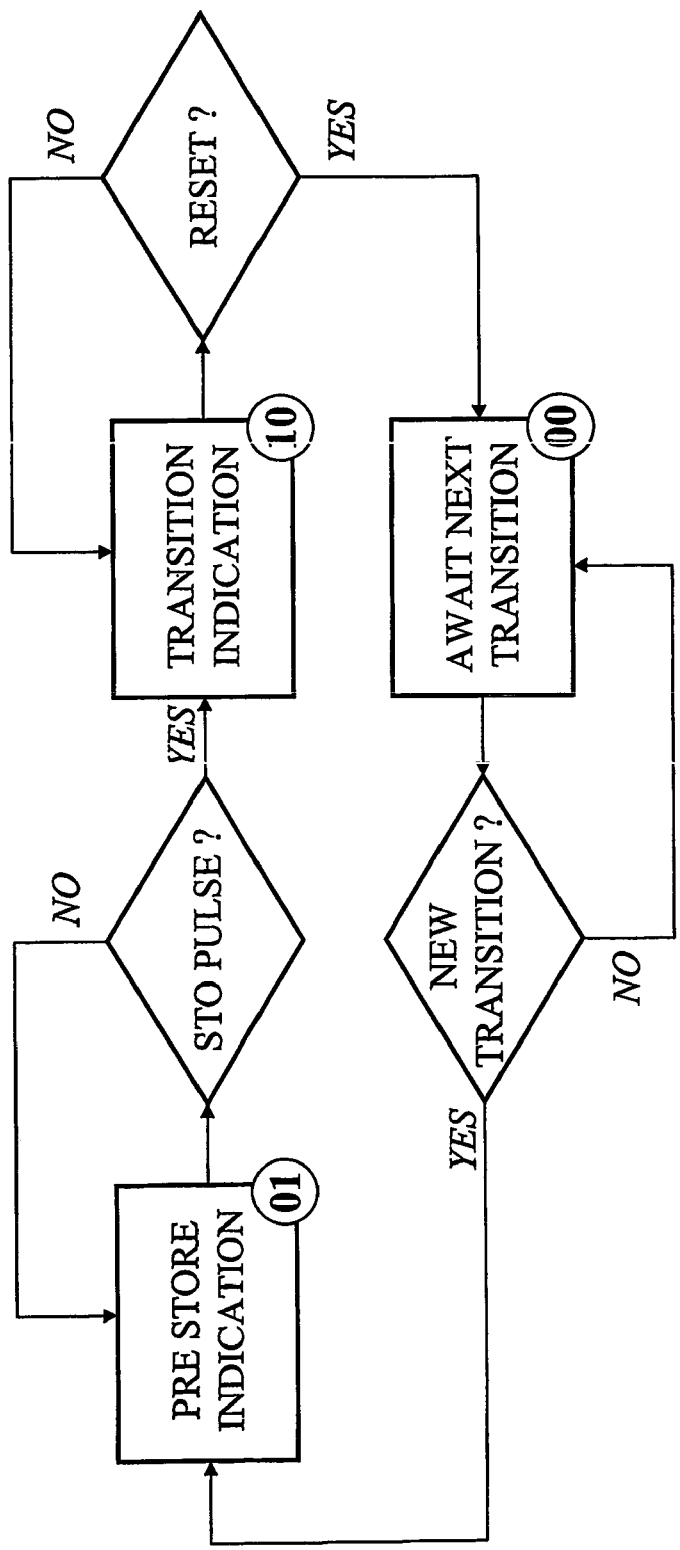
FIG. 9 is a simplified flow diagram of a transition indication cycle for an exemplary transition indicator.

Alternatively a simplified flow diagram of a transition indication cycle may be drawn as in FIG. 9, with associated logic implementation states encircled.

Figure 10:
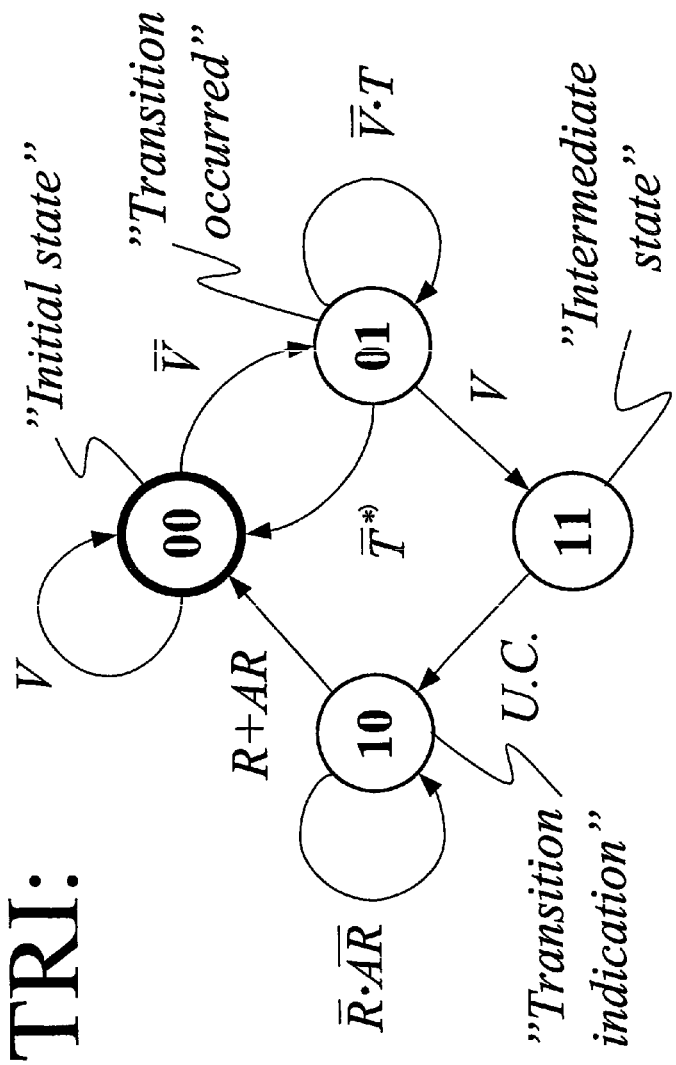
FIG. 10 is an exemplary state diagram for a sequential logic finite state machine implementation of a transition indicator.

Yet another way to describe the implementation of the transition indicator as a sequential logic finite state machine is to draw the state diagram as shown in FIG. 10. The initial or basic state is always occupied if no transition has occurred or in bit rate jitter tracking mode after an asynchronous transition indication, ASY TR used as AR in FIG. 10, has triggered a reset cycle. Regular reset, R, is performed after the transition condition is communicated to the clock control unit, $CMC_i$, as will be discussed in further detail later below. After an input data signal transition has occurred and the transition condition, T, becomes true the state machine shift into the pre store or transition occurred state ($01_b$). All transition conditions are presented attached to the arcs with a dot representing a logic AND operation and a plus sign for a logic OR operation. If a store pulse, i.e. a positive transition on the $S_{STO}$ input in the preferred embodiment, is detected while the transition indicator still is in the pre store state the state changes to the transition detection state ($10_b$) via the unconditional "immediate" transition from the intermediate state ($11_b$). The physical store, $S_{STO}$, and reset, $S_{RES}$, signals have logical counterparts V (Valid output) and R (Reset to initial), which are used in the state diagram of FIG. 10 and Karnaugh diagrams of FIGS. 11A-B. Although superfluous at a first glance the intermediate state ($11_b$) complete the state space and leave no unimplemented states as required for an all through asynchronous design. Only state transitions between states that differ with a single binary digit in the state code are valid and occur, for instance from $10_b$ to $00_b$ but are allowed but not directly from $01_b$ to $10_b$. Once again turning the attention to the transition indication about sample point i in FIG. 4 and the behavior of the corresponding transition indicator sequential logic machine as shown in FIG. 5 during the handover from the old clock mux master, $CMC_k$, to the new, $CMC_i$. The input data signal transition induces a valid transition condition, i.e. $TR_i$ goes high. By choice of design and without any loss of generality the transition indication pulse has a duration that equal two sample clock phase spacing delays, i.e. $2\Delta T_S$. Without prior knowledge of the timing properties of the clock mux control unit a safe choice is to provide a transition indication pulse with maximum duration which vanish coincident with the sample clock transition prior to the new selected output sample clock.

So far formation and evaluation of the transition condition has been analyzed in-depth without any preference regarding the actual physical implementation of the output from the transition indicator unit, $TR_i$. Conveniently the transition indicator output is direct decoded from the transition indicator sequential logic state machine, $TRI_i$ as given by (Eq. 8). If either the intermediate state ($11_b$) or the transition indication state ($10_b$) is occupied and thus $q_1$ is high (1) a synchronous transition indication is asserted.

$$TR_i = q_1 \qquad \text{(Eq. 8)}$$

All transition conditions are only updated once in a sample clock period coincident with the associated store pulse or clock transition, $S_{STO}$, when all comprising parts of the sampled input data representation, $\overline{U}$, are refreshed and the overall expression is stable. Normally the transition condition is set coincident with the first consecutive sample clock transition for the clock phase outside the detection window, i.e. i+2 in the preferred embodiment. As seen above several reset conditions exist. One important feature is to utilize the asynchronous transition indicator output signal, ASY TR or ATR in short, to clear all transition indications that stem from the prior input data transition. Proper start up behavior for the entire clock recovery unit is also ensured when the asynchronous reset signal clear all synchronous transition indicators after a new input data signal transition has occurred. Logic race conditions, combinatorial loops and dead lock situations are effectively avoided and the latency is minimized. Without explicit interaction or hand shake procedures between the transition indicator and the clock mux control unit in order to communicate a transition indication and thereby not relaying on an fixed reset clock phase, $S_{RES}$, given a priori every indication that has not been detected must be cleared before the new clock phase selection can be performed. For instance in an asynchronous communication manner the transition detector may raise its condition coincident with the store pulse once the condition is valid but is forced to await that the corresponding clock mux control unit state machine has transitioned into the request state ($01_b$) before a reset is performed. Asynchronous communication between the transition indicator and the clock mux control units however require a different reset condition in order to clear an occupied pre indication state after a new input data signal transition has occurred. In FIG. 10, the alternative transition condition including asynchronous reset, AR connected to ASY TR, is shown. Close examination of the transition indicator state machine operation particularly when the transition condition is evaluated reveals that the operation indeed is edge triggered and that the transition condition is sampled coincident with the store pulse or sample clock transition outside the detection window. At any time prior to the store operation a false transition condition output from the combinatorial net inevitably reset the transition indicator state machine back into the initial state ($00_b$), where there is no direct transition path to the valid transition detection output state ($11_b$). A valid transition condition, i.e. $TR_i$ goes high, only give a possible transition detection if it appear when the store signal is low for a positively edge triggered transition indicator. Thereby a latching behavior is avoided and the transition indicator may not be set on multiple occasions during a single store pulse duration.

A valid input signal transition detection cycle is given below:

$$\begin{bmatrix} V \\ T \\ q_1 \\ q_0 \end{bmatrix} = \begin{bmatrix} 0 \\ 1 \\ 0 \\ 0 \end{bmatrix} \Rightarrow \begin{bmatrix} q_1 \\ q_0 \end{bmatrix}$$

$$= \begin{bmatrix} 0 \\ 1 \end{bmatrix} \rightarrow \begin{bmatrix} V \\ T \\ q_1 \\ q_0 \end{bmatrix}$$

$$= \begin{bmatrix} 1 \\ 1 \\ 0 \\ 1 \end{bmatrix} \Rightarrow \begin{bmatrix} q_1 \\ q_0 \end{bmatrix}$$

$$= \begin{bmatrix} 1 \\ 1 \end{bmatrix} \Rightarrow \begin{bmatrix} q_1 \\ q_0 \end{bmatrix}$$

$$= \begin{bmatrix} 1 \\ 0 \end{bmatrix} \underset{R+AR=1}{\Longrightarrow} \begin{bmatrix} q_1 \\ q_0 \end{bmatrix}$$

$$= \begin{bmatrix} 0 \\ 0 \end{bmatrix}$$

Two state variables denoted $q_1$ and $q_0$ are used in the state coding. Low index is used for less significant binary digits.

The transition from $11_b$ to $10_b$ is unconditional with implementation dependent transition duration. A more precise description of the transition indicator state machine behavior is given in the slightly modified Karnaugh diagram for the next state functions $q_1^+$ and $q_0^+$ as a function of current state ($q_1$, $q_0$) and inputs signals (R, T and V), as illustrated in FIG. 11A and FIG. 11B, respectively.

Next state ($q_1^+q_0^+$) is listed in a matrix fashion as a function of current state ($q_1q_0$) and the input signals (R, T and V). Each row is consistent with a constant single state, the initial state ($00_b$) in the first row etc. On the other hand each column is defined by constant values of R, T and V.

Figure 12:
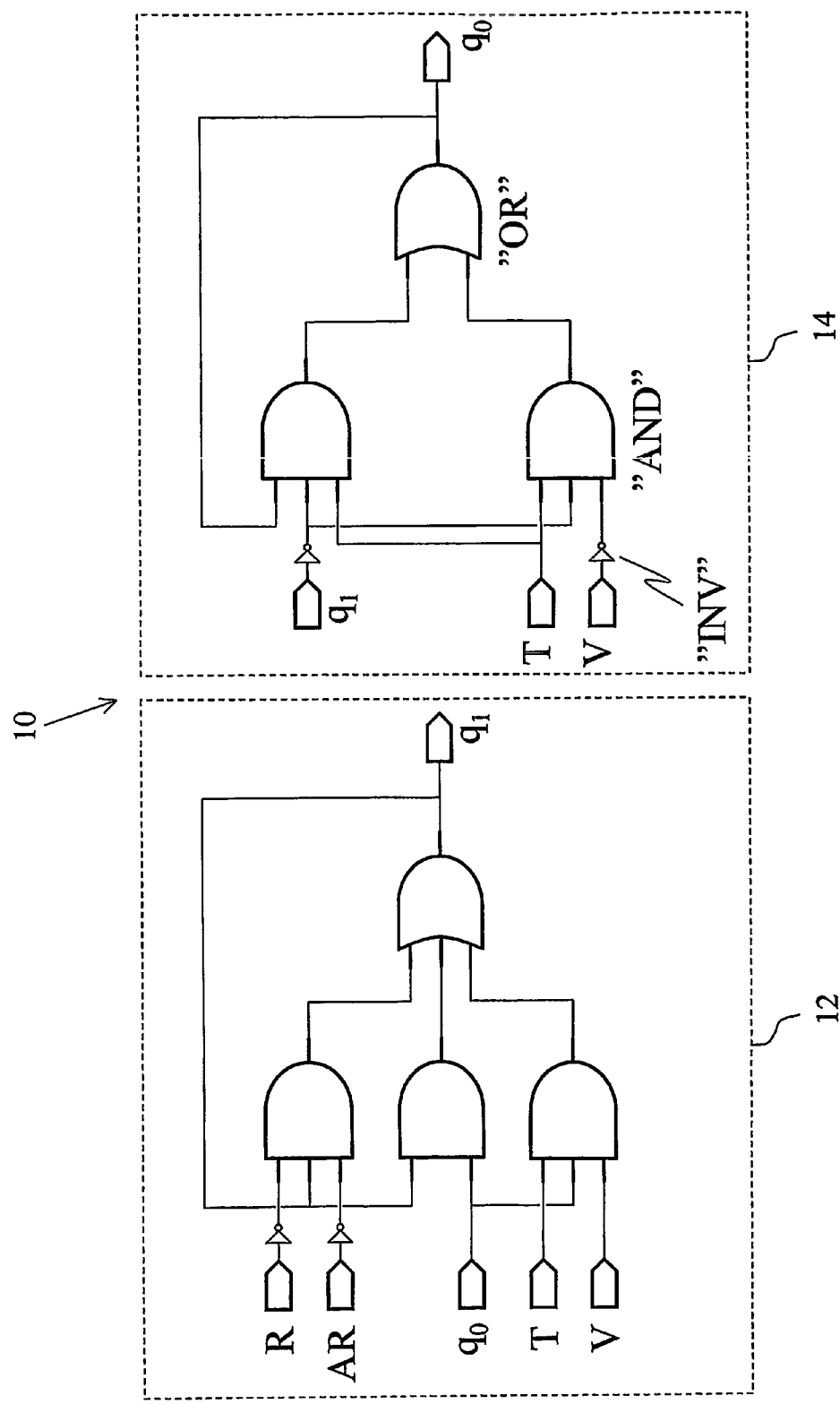
FIG. 12 is a gate level logic schematic and description of a preferred asynchronous implementation of a transition indicator.

FIG. 12 is a gate level logic schematic and description of a preferred asynchronous implementation of the transition indicator.

Next state combinatorial functions:

$$q_1^+ = q_1 \cdot q_0 + q_1 \cdot \overline{R \cdot AR} + q_0 \cdot T \cdot V \quad \text{(Eq. 9)}$$

$$q_0^+ = \overline{q}_1 \cdot q_0 \cdot T + \overline{q}_1 \cdot T \cdot \overline{V} \quad \text{(Eq. 10)}$$

All encirclements of only ones in FIGS. 11A-B form connected areas as required in an asynchronous implementation. Logic reduction of the combinatorial next state functions, $q_0^+$ and $q_1^+$ following the Karnaugh diagrams of FIGS. 11A-B gives a transition indicator circuit 10 formed by two interconnected combinatorial feedback networks 12, 14 based on AND gates and OR gates, as seen in FIG. 12.

However the invention is not limited to asynchronous implementations, and does not require a specific choice of gates or logic optimization.

In conjunction with the hold latch circuitry a common synchronous transition indication signal, TR, comes in handy as part of the enable signal, HLE.

$$TR = TR_1 + TR_2 + \ldots + TR_N \quad \text{(Eq. 11)}$$

Basically it detects if "ANY" of the distributed transition indicators has detected an input data signal data transition.

Transition indicator properties summarized:
The ensemble of transition indicators forms a complete set.
All transition indicators are orthogonal.
Causality is preserved among the ordered set of transition indicators.

Asynchronous Transition Indicator

Essentially instantaneous input signal transition detection requires a sequential logic state machine that is direct signal triggered. Asynchronous state machines possess that exact property. Common to all distributed units the asynchronous transition indicator, ASY TR, act as a reset signal in the bit rate jitter-tracking mode. Whenever a new input data transition has occurred, all non-served transition indicators and clock mux control units are reset into their respective initial states. Optionally in bit error rate jitter tracking mode all clock mux control units including the current master in control of the clock mux are also released through a reset operation. Yet another important task for the asynchronous transition indicator to fulfill is to provide an additional enable signal, denoted ASY EN, that turn on the hold latch function immediately after an new input data transition has occurred and thereby suppressing spurious significant transitions, i.e. from low to high in a positive edge triggered system, prior to the new selected clock transition.

Figure 13:
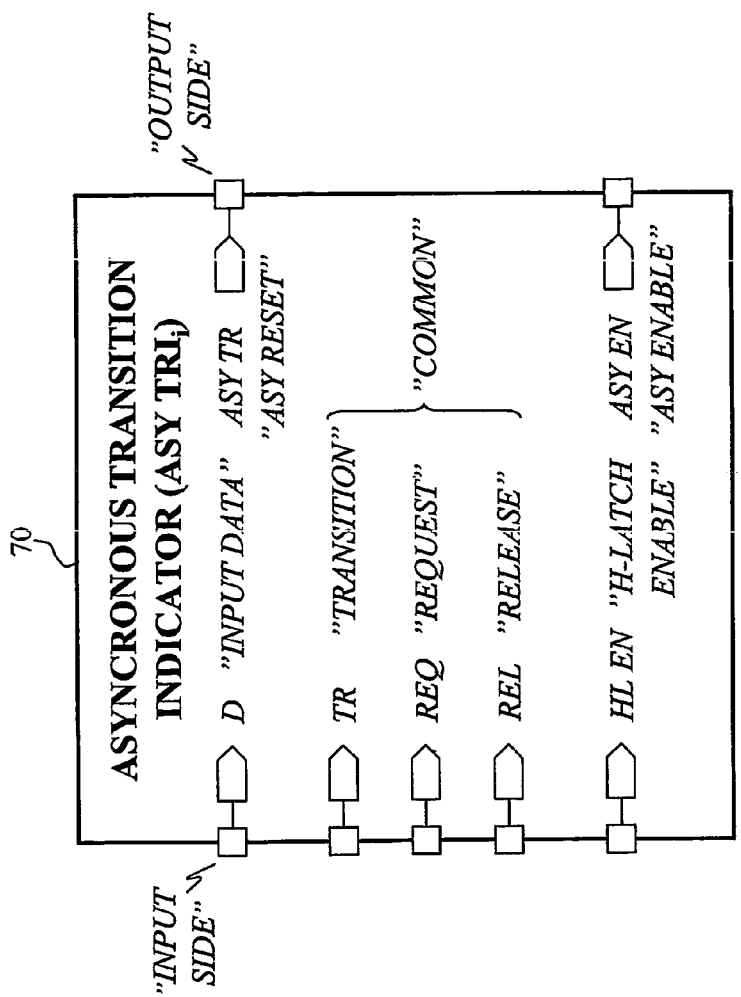
FIG. 13 is a block diagram of an exemplary top-level interface for an asynchronous transition indicator according to a preferred embodiment of the invention.

FIG. 13 is a block diagram of an exemplary top-level interface for the asynchronous transition indicator. The interface has five input ports to the left and two output ports to the right, namely ASY TR and ASY EN. Three common status signals, namely the transition indicator, TR, the request, REQ, and release, REL, signals accompany the monitored input data signal, D. All common signals indicate the overall state of the clock recovery unit without any detailed information regarding any particular distributed function and unit. Regular interaction between the hold latch control unit and the hold latch utilize the hold latch enable signal, HLE. All together an acknowledge signal, ACK, indicate weather or not all transition indicators and clock mux control units have been successfully been put into reset and that the hold latch is disabled.

$$ACK = \begin{cases} \overline{TR \cdot \overline{REQ} \cdot REL \cdot \overline{HLE}} & (T \text{ only}) \\ \overline{TR \cdot \overline{REQ} \cdot \overline{HLE}} & (F \text{ or } T) \end{cases} \quad \text{(Eq. 12)}$$

Two different modes of clock recovery operation are supported, which is reflected in the branched acknowledge condition listed in (Eq. 12). Bit rate jitter tracking mode, T, mandate that every new input data signal transition unconditionally trigger a clock mux master update irrespective of the phase changes of the recovered clock output signal. Filtered requests, F, that shape the input data signal jitter instead limit the cycle-to-cycle phase changes of the recovered clock, REC CLK, simply by only allowing handover from the current master to a new master located in a selected subset of all sample clock phases. Often adjacent sample phases are grouped such that the resultant cycle-to-cycle output clock phase shift is limited. Most prominent and useful is the simple case when the current master, $CMC_k$, has an associated request window, $RW_k$, which only include the two closest neighbors, centered about sample phases $S_{k-1}$ and $S_{k+1}$.

Figure 14:
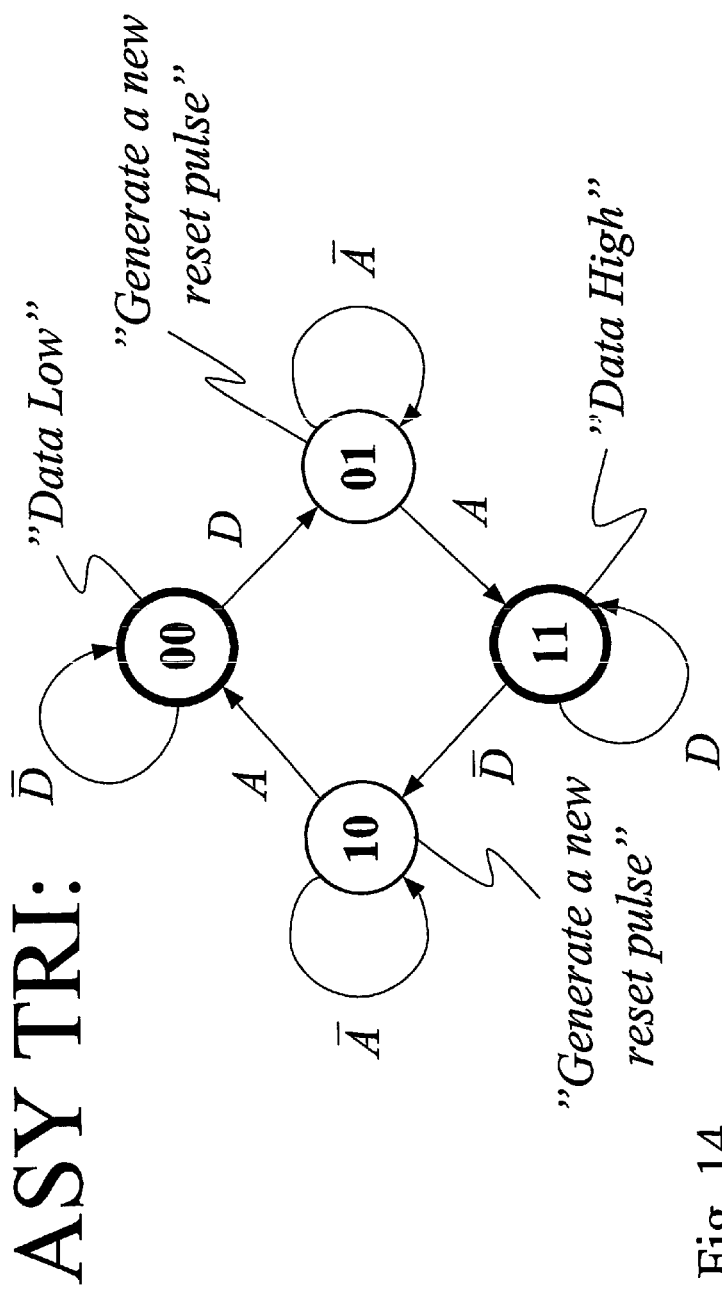
FIG. 14 is a state diagram illustrating a sequential logic implementation of an asynchronous transition indicator.

Basically a sequential logic implementation of the asynchronous transition indicator, as seen in the state diagram of FIG. 14, comprises two steady states, $00_b$ and $11_b$, which correspond to a constant input data signal state and level and two intermediate states, $01_b$ and $10_b$, occupied only during the formation and output of a reset pulse, denoted ASY TR or ATR or AR in short, following an input data signal transition or state change. Compactly described the transition indication and reset condition is equivalent to a logical exclusive-OR operation of the two state variables, $q_1$ and $q_0$:

$$ASY\ TR = AR = q_1 \cdot \overline{q_0} + \overline{q_1} \cdot q_0 = q_1 \oplus q_0 \quad \text{(Eq. 13)}$$

During time intervals with constant input data signal and sufficiently long time after a transition has occurred the asynchronous transition indicator remain either in the "Data Low" state ($00_b$) or the "Data High" state ($11_b$) depending on the input data level, i.e. low (0) or high (1). If the input data signal, D, transitions from low to high or vice versa the asynchronous transition indicator sequential logic state machine shift state from $00_b$ to $01_b$ or from $11_b$ to $10_b$ for an initially high input data signal. Distributed units of various types, such as synchronous transition indicators, clock mux control units and the hold latch and hold latch control circuits, all share a common reset signal which is connected to the asynchronous transition indication signal, ASY TR. Acknowledgment of a successfully completed reset cycle for all of the units that catch the asynchronous transition indication output pulse irrespective of individual variation in reset delay is ensured by a true overall, compound acknowledge condition as given by (Eq. 12). Only after an overall acknowledgement, ACK, has been asserted does the asynchronous transition indicator state machine shift from an intermediate state, $01_b$ or $10_b$, to the subsequent stable state, i.e. $11_b$ or $00_b$ respectively. In addition there is a possibility to detect an input data signal transition even before the asynchronous transition indicator logic sequential machine has been able to shift state. A simple purely combinatorial transition condition, ASY TR COMB, based upon the fact that if the input signal level and state differ from the static state an input data signal transition has occurred but the has not yet been detected. For instance if the input data signal suddenly shift from low to high where as the asynchronous transition detector state machine still occupy the "Data Low" state ($00_b$) a new input data transition has occurred, and the second logic AND condition in (Eq. 14) is true.

$$ASY\ TR\ COMB = q_1 \cdot q_0 \cdot \overline{D} + \overline{q_1} \cdot \overline{q_0} \cdot D \quad \text{(Eq. 14)}$$

Similarly, if the input data signal goes low when the asynchronous transition indicator state machine still has not transitioned from $11_b$ to $10_b$ the first part of the sum of logic products in (Eq. 14) is true. In the period of time after a new input data signal transition has occurred but before an asynchronous transition indication is set the combinatorial asynchronous transition condition, ASY TR COMB, is high and the asynchronous hold latch enable signal, ASY EN or AHLE in short, is forced low which rapidly disable the hold latch circuitry with a decreased delay. In essence asynchronous hold latch enable signal, ASY EN or AHLE in short, is formed by a logic inversion of the combinatorial asynchronous transition condition, ASY TR COMB.

Basic Karnaugh diagrams for the preferred embodiment without any specific restriction upon the acknowledge signal (R) are shown in FIGS. 15A-B.

Figure 16:
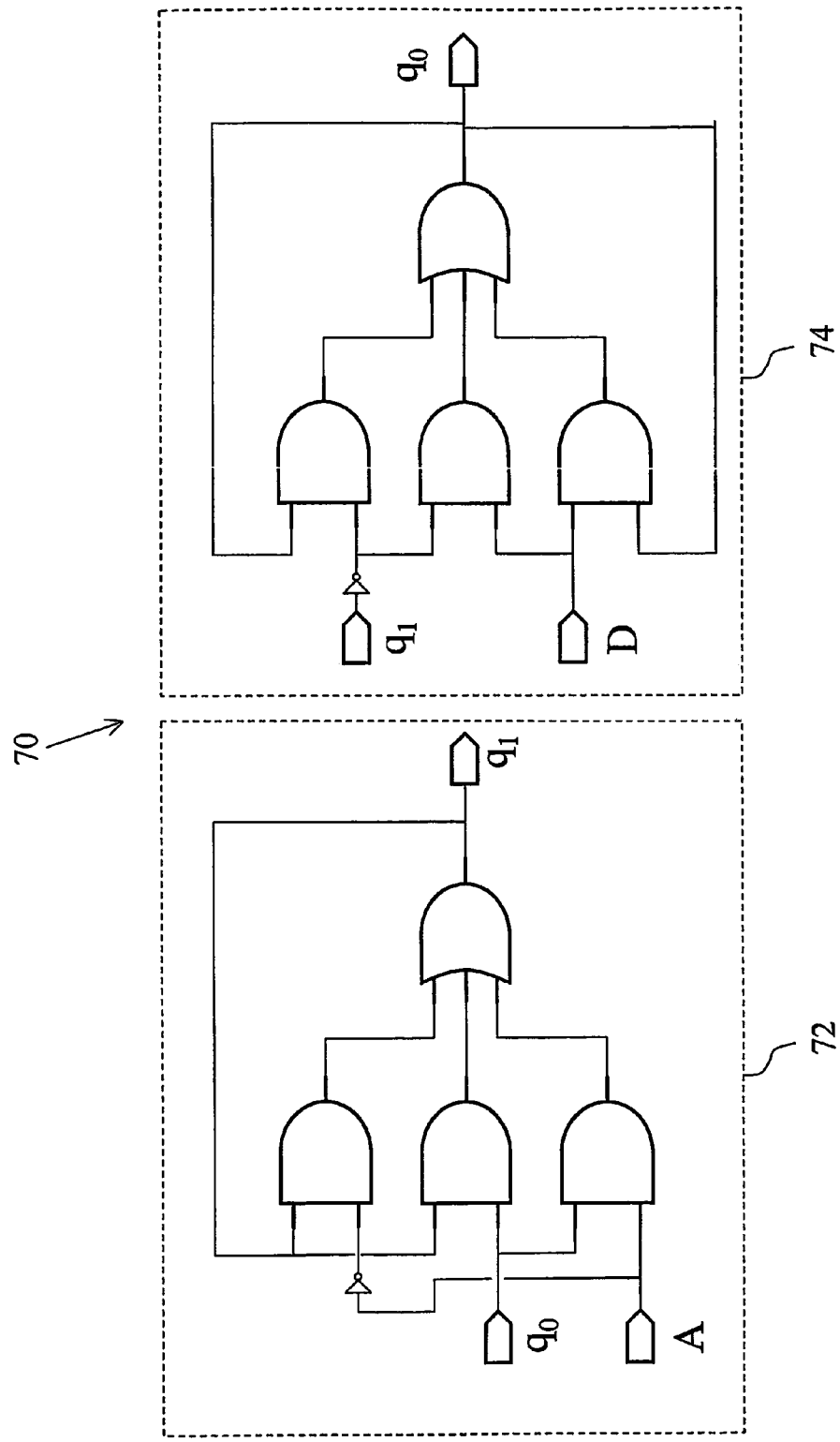
FIG. 16 is a gate level logic schematic of a preferred asynchronous implementation of the asynchronous transition indicator.

FIG. 16 is a gate level logic schematic of a preferred asynchronous implementation of the asynchronous transition indicator. The implementation 70 has externally provided data (D) and acknowledge (A) signals, and the next state functions ($q_0^+$ and $q_1^+$) are represented by combinatorial feedback networks 72, 74.

Next state combinatorial functions for the preferred embodiment of the asynchronous transition indicator unit, ASY TRI, are given by:

$$q_1^+ = q_1 \cdot q_0 + q_1 \cdot \overline{A} + q_0 \cdot A \quad \text{(Eq. 15)}$$

$$q_0^+ = \overline{q_1} \cdot q_0 + \overline{q_1} \cdot D + q_0 \cdot D \quad \text{(Eq. 16)}$$

Hazard free asynchronous implementation of the asynchronous transition indicator state machine as seen in FIG. 14 requires that the overlapping product term located first in the logic expression for $q_1^+$ is not removed through any kind of logic optimization procedure. Otherwise, the two main areas containing all ones in the Karnaugh diagrams of FIGS. 15A-B would be left unconnected and the state variable $q_1^+$ could erroneously be reset amidst when the acknowledge signal, A, changes from low to high or vice versa at the data high state ($11_b$).

Clock Mux Control Unit, CMC

Figure 17:
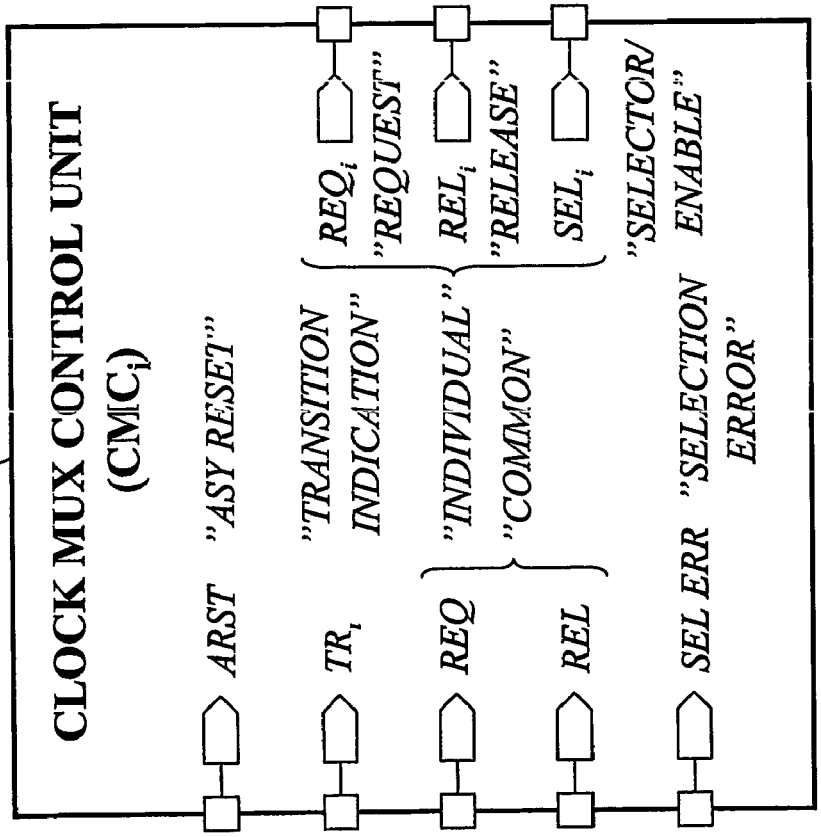
FIG. 17 is an interface and port block diagram for an exemplary clock mux control unit.

In addition to parallel transition indication the proposed clock recovery algorithm and circuitry also contain a fully distributed clock selection control mechanism. That is each, i=1 ... N, phase shifted sample clock signal, $S_i$, is individually gated by its corresponding control unit, $CMC_i$, through a unique phase select and clock mux control signal, $SEL_i$. FIG. 17 is a interface and port block diagram for an exemplary clock mux control unit.

As appreciated from both FIG. 2 and FIG. 17, each clock mux control unit, CMC, have common input signals acting globally such as the asynchronous reset signal, ASY RESET or AR, the common or overall request signal, REQ, and the common or overall release signal, REL, as well as a unique connection, $TR_i$, to the corresponding transition indicator associated with the sample phase specific to that particular clock mux control unit.

Figure 18:
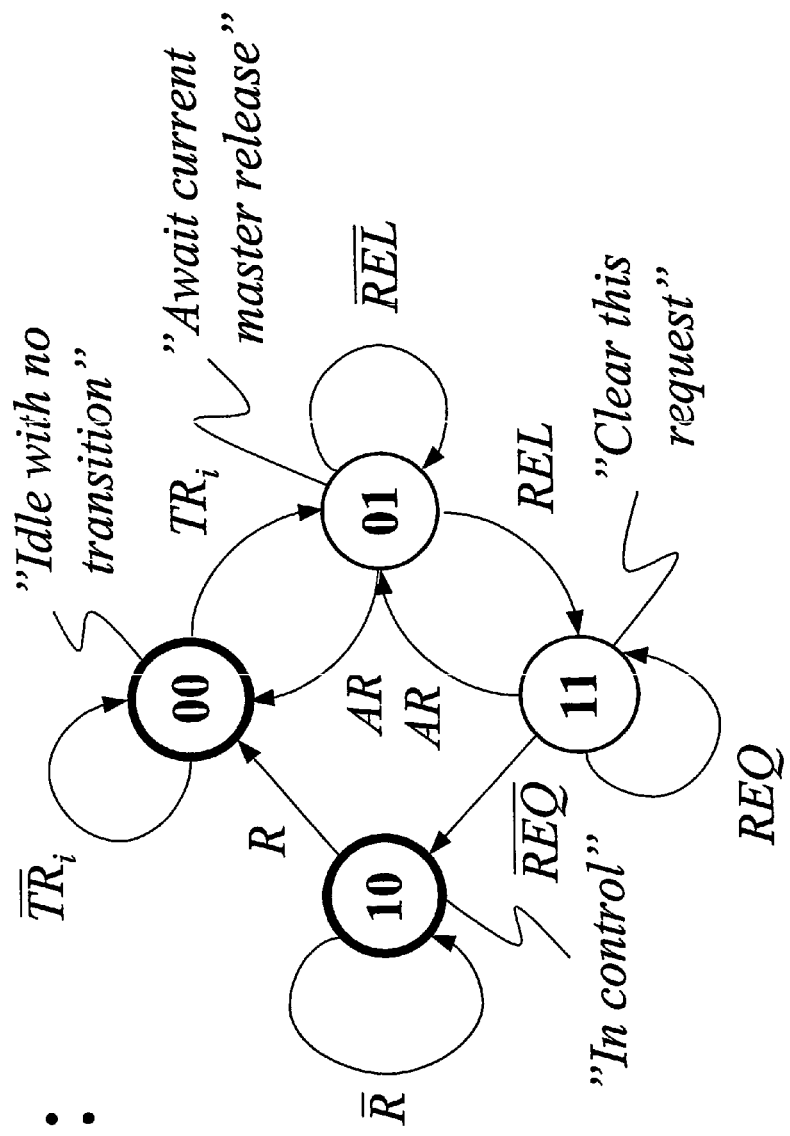
FIG. 18 is a state diagram for an exemplary clock mux control unit, CMC, represented as a finite state machine.

FIG. 18 is a state diagram for an exemplary clock mux control unit, CMC, represented as a finite state machine. All three outputs however operate independent from all other clock mux control units and only relate to the gating of a specific sample phase or signal according to the all-through distributed clock recovery architecture. Individual request, $REQ_i$, release, $REL_i$, and selector, $SEL_i$, signals are passed to the pure, combinatorial networks, which in essence implement passive ALL or ANY functions (in REQ and REL) necessary to perform the clock mux control arbitration procedure that was described previously in connection with the flow diagram of FIG. 3.

Each clock mux control unit, $CMC_i$, individually perform several steps during a new acquisition, control and release cycle of course provided that an input data signal transition has occurred about the related sample phase, $S_i$:

Idle:
1. During idle periods prior to a positive transition indication, the control unit is inactive. "Initial state" ($00_b$) is occupied in the state diagram of FIG. 18.

Reset:
2. An input signal transition occurs after which AR goes high, triggering a reset back to the initial state of all non-served requests, i.e. clock mux control state machines that still occupies the "Await current master release" state ($01_b$) or the "Clear this request" state ($11_b$).

Acquisition:
3. If a positive transition indication is communicated from the associated i:th transition indicator to the clock mux control unit, normally by means of a high $TR_i$ signal, this particular clock mux control unit finite state machine, CMUX FSM, shift state from $00_b$ to $01_b$, as a first step in the procedure to acquire clock mux control.
4. Direct decoded from the clock mux control machine states, $q_1$ and $q_0$, the i:th request signal goes high immediately after its particular "Await current master release" state ($01_b$) has been occupied with $q_1$ and $q_0$ low and high respectively.
5. Due to propagation delay properties imposed by the physical implementation of the compound request signal generator for the overall request, when REQ goes high, is delayed in time relative to occurrence of the original individual request, $REQ_i$ and is first visible to all other clock mux control units including the current master and in particular the unit responsible for the individual request in the first place at later point in time. Therefore a second intermediate state, labeled "Clear this request" ($11_b$) in FIG. 18, is inserted into the state diagram in order to block the new clock mux master from assuming control before the request is cleared and the compound request signal is inactivated there by preventing a combinatorial feedback loop that otherwise would be present when the new master would trigger a release based up on its own request, and so forth.
6. As soon as the current master has been forced to released clock mux control in response to either an asynchronous reset condition or a compound request signal and that the compound release signal, REL, in an active, normally high, state indicates that no unit has acquired clock mux control the state machine back to which the original transition indication and request is traceable shift to the "Clear this request" state and thereby clear its own request since $REQ_i$ is high only when $q_1$ is low and $q_0$ is high, which is only associated with the "Await current master release" state.

Control:
7. After the compound request signal has altered status to indicate that no further request is present, i.e. REQ is low, the new master acquires clock mux control by shifting into the "In control" state ($10_b$) in FIG. 18.

Release:
8. Clock mux control status has an indefinite duration terminated only by either an asynchronous transition indication, where AR goes high, in jitter tracking mode or by a positive filtered request signal, $REQ_f$, in the filtered response mode. After a reset condition is detected all active masters shift to their respective initial states ($00_b$) and the compound release indicator signal, REL, goes high.
9. Upon detection of an erroneous combination of several concurrent masters the selection supervision unit, SEL SUP, may also trigger an unconditional release procedure through the SEL ERR signal to resolve initiation problems and provide robustness.

Karnaugh diagrams for the next state functions, $q_0^+$ and $q_1^+$, are shown in FIGS. 19A-B. In order to avoid unnecessary complexity the Karnaugh diagrams of FIGS. 19A-B are not drawn according to the standardized procedure, which in turn would require a large number of smaller diagrams that in the end does not tend to present the much desired clear overview as in the case of two diagrams. However it is strongly recommended to proceed with great caution especially in conjunction with the interpretation of the encirclements and the implication of equal adjacent values with respect to logic reduction since at times there exist adjacent equal value pairs that differ in more than one state variable or input signal value. All overlapping logic product terms are included to ensure hazard free asynchronous implementation. Due to the large number of input signals, namely the reset (R), asynchronous reset (AR), compound release (REL), compound request (REQ) and transition ($TR_i$) signal that stimulate the clock mux control unit an additional color coding scheme is introduced where all input signal and state combinations that are directly influenced by the asynchronous reset are presented in a shaded manner in order to save space and further enhance the clearness of the Karnaugh diagrams. By means of regular or asynchronous reset, denoted R and AR respectively, each clock mux control unit that is affected is brought back into its initial state ($00_b$).

Next state combinatorial functions for the preferred embodiment of the clock mux control unit, CMC:

$$q_1^+ = q_1 \cdot q_0 \cdot \overline{AR} + q_0 REL \cdot \overline{AR} + q_1 \cdot \overline{R} \qquad \text{(Eq. 17)}$$

$$q_0^+ = \overline{q}_1 \cdot q_0 \cdot \overline{AR} + q_1 \cdot q_0 \cdot AR + \overline{q}_1 \cdot TR_i \cdot \overline{AR} + q_0 \cdot REQ \cdot \overline{AR} \qquad \text{(Eq. 18)}$$

Without introduction of ambiguities or any loss of generality the next state combinatorial functions are stated as a sum of products where as of course any logically equivalent form may be used. No gate level schematics are presented due to the relatively small addition of information content compared with the radically increased overall complexity of the drawing.

Three main local output signals in each clock mux control unit, $REQ_i$, $REL_i$ and $SEL_i$, are readily decoded from their respective state variables, $q_0$ and $q_1$. Whenever an input data signal transition is detected about the sample clock phase, $S_i$, associated with the i:th clock mux control unit, $CMC_i$, and subsequent the "Await current master release" state ($01_b$) is occupied the particular and individual request signal, $REQ_i$, goes high:

$$REQ_i = \overline{q}_1 \cdot q_0 \qquad \text{(Eq. 19)}$$

Immediately after the current active master has caught a valid request (signal) and released the clock mux control, i.e.

when REL goes low, the request is cleared, which require that $REQ_i$ goes low in the preferred implementation. In practice this procedure mandate that the request signal must remain inactive unless the "Await current master release" state is occupied with $q_1$ low and $q_0$ high. It is evident after a close inspection that the individual release and clock phase selection signals, $REL_i$ and $SEL_i$ respectively, are actually complementary, i.e. mutually exclusive such that if either one of them is high the other is always low and vice versa. Each individual release signal, $REL_i$, indicate whether that particular clock mux control unit is not the current master in control of the clock mux:

$$REL_i = \overline{q_1 \cdot \overline{q_0} + q_1 \cdot q_0} \qquad \text{(Eq. 20)}$$

$$SEL_i = q_1 \cdot \overline{q_0} + q_1 \cdot q_0 \qquad \text{(Eq. 21)}$$

Effectively, the handover of the clock mux control has been executed at the point where the new clock mux control master has entered the "Clear this request" state ($11_b$) and all others have backed off. Actual gating of the sample clock phase signals in the distributed clock mux require an individual enable signal, $SEL_i$, from each clock mux control unit, which is active whenever the particular clock mux control unit occupies either the $11_b$ or $10_b$ state.

Although triggered by slightly different events in the bit rate jitter tracking mode (T) compared to the filtered requests mode (F) the reset, R, terminates the current clock mux master session and in addition also resolves abnormal conditions such as multi master configurations during initiation and so forth.

$$R = \begin{cases} REQ + SEL\,ERR & (F \text{ or } T) \\ ASY\,RST(=AR) & (T \text{ only}) \end{cases} \qquad \text{(Eq. 22)}$$

For instance, if a clock mux control unit occupies the $10_b$ state and thus is effectively in control of the clock selection process a new input data signal transition either directly trigger a reset through the asynchronous reset signal as in the bit rate jitter tracking case or indirectly through another valid request or in the case of a selection error condition detected by the selection supervision unit. Selection supervision provide a crucial functionality in a robust system where filtered request signals is utilized in order to limit the impact of perturbations ideally to isolated bit errors instead of unpredictable burst error behavior.

Finally, the typical behavior during handover in an implementation of the preferred embodiment of the invention is discussed in close conjunction with FIGS. 4 and 5. By means of design the input data signal transition, from a low to a high value of the D signal, that occurred between the i:th and i+1:th sample clock phase is locked to the latter, hence a transition indication, where $TR_p$ goes high, is communicated to the associated clock mux control unit, $CMC_p$, simultaneous with the $S_{i+2}$ store clock strobe. Subsequently the transition indication trigger a transition from the initial, idle state ($00_b$) to the await current master release state ($01_b$) in that particular clock mux control unit which in turn raise an individual request, when $REQ_p$ goes high, to obtain clock mux control. All individual requests from all clock mux control units are added together in a multiple input "ANY" function to form a to a single compound request, REQ. Such an operation naturally introduces an inherent delay before the request is forwarded to all eligible clock mux control units. If request filtering is applied only a subset of all clock mux control units may in the end be eligible to receive a compound request. Through continuous close monitoring of the request input signal the current master, $CMC_k$, detect a valid request when REQ transitions from low to high, which in turn trigger a release whereas the clock mux control master transitions from the in control state ($10_b$) back to the initial state ($00_b$) and the compound release signal goes high in absence of a clock mux control master. Simultaneously the phase selection signal, $SEL_k$, that gates the sample clock signal associated with the old master transitions from high to low and thereby mute that particular sample clock signal. The new master, $CMC_p$, in turn detect that the release condition is now fulfilled and transitions from the await release state ($01_b$) to the clear this request state ($11_b$) and thereby forcing first $REQ_p$ low, which ultimately clears the compound request signal, REQ. Designed to avoid combinatorial feedback loops the clear this request wait state ($11_b$) has now served its purpose and the new master has fully acquired control of the clock mux when $SEL_p$ goes high and the $CMC_p$ state machine transitions from $11_b$ to $10_b$. The in control state ($10_b$) is occupied indefinitely unless a new input data signal transition occur in the vicinity of another sample clock phase and within the request filter window if applicable.

Request Filtering, REQF

The superior ability to instantaneously phase lock to an input data signal transition and from then on track fast input data signal transition timing changes tightly characterize the proposed direct clock recovery algorithm and circuitry when operated in the jitter tracking mode. At times however in part somewhat different behavior of the recovered clock behavior is desired without thereby sacrificing any of the significant advantages gained by the proposed novel distributed direct clock recovery algorithm and in that reduce input data transition observability or degrade lock acquisition and tracking performance. Tailored frequency response and limited cycle to cycle change of the recovered output clock phase and transition timing require additional request filtering functionality that does not alter the distributed architecture in any way but instead act as add on circuitry.

Figure 20:
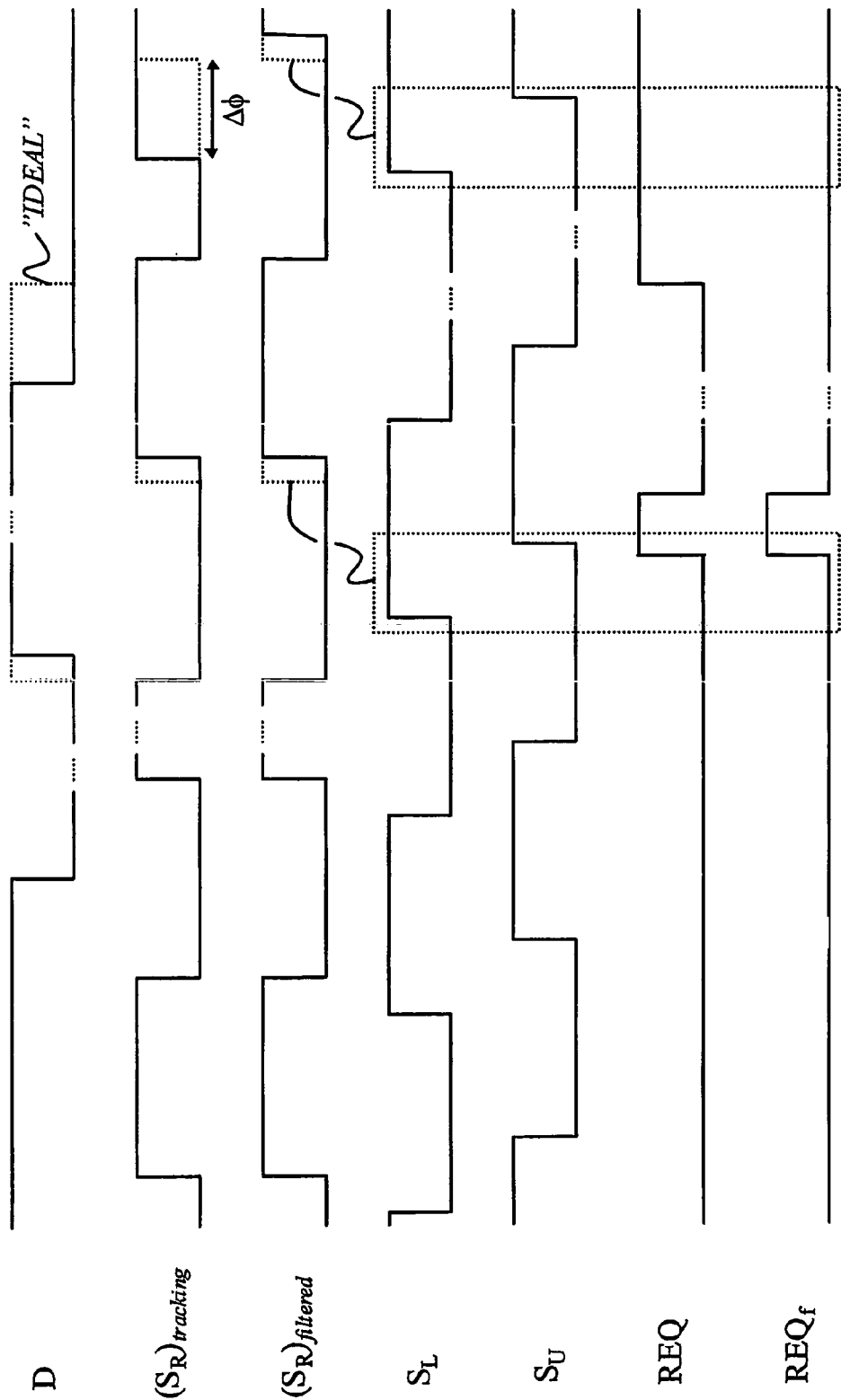
FIG. 20 is a comparative timing diagram for an exemplary clock recovery system operating in jitter tracking and filtered mode with dynamic input data phase offset.

Well-behaved input data signals that are derived from a stable system clock with a fairly constant period only perform logic state changes at well-defined points in time with a tight distribution of the transition timing. Perturbation of the input data signal transition timing introduce a dynamic phase offset, denoted jitter, which at worst trigger a large rapid shift of the recovered output clock phase in response. In FIG. 20, ideal signal behavior and especially all transitions are indicated by a dotted signal trajectory, which may differ from the actual perturbed jittered signal presented as a solid trace. Delay or advance of an input data signal transition produce a subsequent time dependent phase shift, $\Delta\phi$, at the recovered clock output, $S_R$, in response to altered input data signal transition timing. Jitter tracking by means of the novel distributed direct clock recovery algorithm by the very nature produces a one to one relation between input data and recovered output signal phases, i.e. the recovered clock output, $(S_R)_{tracking}$, experience abrupt phase changes, which in turn produce narrow pulses or gaps. Strained by limited bandwidth and insufficient timing margins the subsequent receiver equipment connected to the recovered clock output may fail to retime the input data signal flawlessly in conjunction with excessive recovered clock output phase changes even if the hold latch mitigate pulse distortion effects. Instantaneous oversized phase jumps are effectively smeared out over several recovered clock periods simply by limiting the handover from a previously selected sample clock phase to a set of adjacent sample clock phases and in that greatly reducing the cycle-to-cycle phase increment or decrement magnitude. Such a smooth phase error response mimic the averaged (low pass filtered) operation characteristic usually encountered and obtained in a feedback loop based clock recovery architecture but without the drawback of increased lock acquisition time. Comparatively the filtered response to input data signal jitter show significantly reduced cycle-to-cycle phase change on the recovered clock output, $(S_R)_{filtered}$. For instance the second request in FIG. 20 where REQ goes high coincident with an overly early input data signal transition is rejected in the filtered mode without any change in output signal transition timing and phase where as the corresponding tracking mode of operation produce a significant phase shift. On the other hand a valid request produce the same recovered output clock distortion response in both the tracking and filtered mode.

Figure 21:
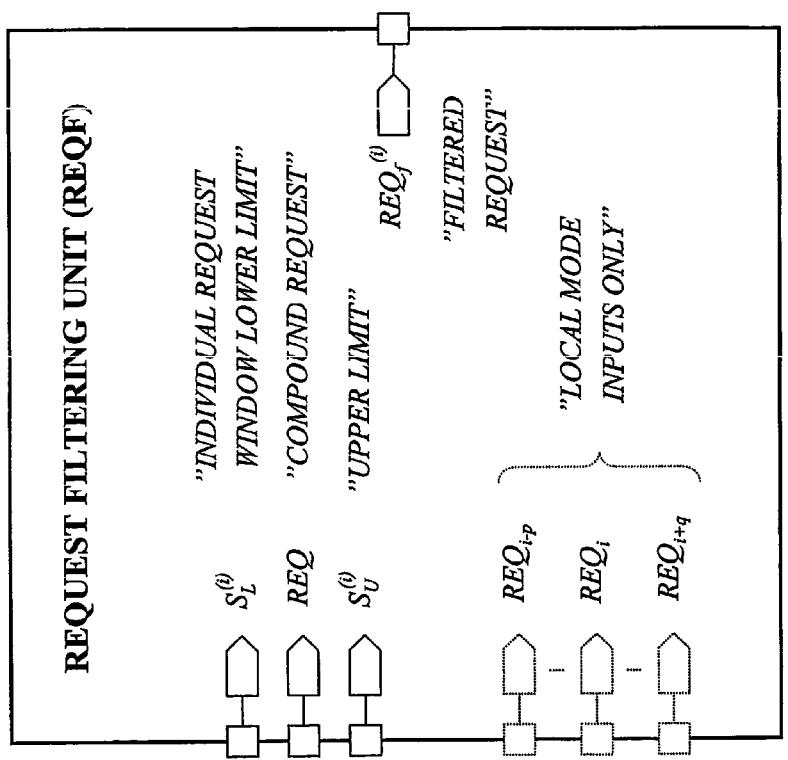
FIG. 21 is an interface and port block diagram for a request filter unit according to an exemplary embodiment of the invention.

Request filtering functionality as a concept translates into an almost infinite variety of implementations with different phase shift shaping properties. However, two major distinctive request filtering unit configurations exist categorized by means of differences in the input port specifications, see the diagram of FIG. 21. Each individual request filtering unit either only require a single compound request signal input, REQ, or alternatively require an entire ensemble of several local request signal inputs, $REQ_{i-p}, \ldots, REQ_i, \ldots, REQ_{i+q}$, often originating from neighboring clock mux control units. Compound request filtering essentially individually gate a request signal common to all clock mux control units where as in local request filtering each clock mux control unit receive a compound request signal formed by a logic ANY (OR) operation involving a for each unit unique subset of all local clock mux control signals. More advanced local request filtering techniques may incorporate sequential logic in order to avoid glitches and other deficiencies associated with a simplified pure combinatorial formation of the individual compound request signals. Generic by nature the interface and port diagram of FIG. 21 displays both options simultaneously, with the input ports associated with local request filtering visualized in a dashed manner. No unnecessary restrictions are imposed upon the actual content of the request signal subset formed uniquely for each request filter unit and associated clock mux control unit. Both compound (C) and local (L) request filtering in essence classify all requests into two categories or subsets, namely valid requests and all other remaining requests, based upon a request window that is unique for each individual clock mux control unit with super index (i) and bounded by a lower and an upper sample clock signal, $S_L$ and $S_U$ respectively, see FIG. 20. Only a request that actually originate from an input data signal transition (detection) that occur at some point in time during the time interval between a principal transition, in particular from a low to a high state whenever a positive oriented logic reference system is used, of the lower sample clock signal ($S_L$) and a subsequent principal transition of the upper limiting sample phase signal ($S_U$).

Compound request filtering effectively reduce the recovered clock phase variations simply by gating the overall compound request signal (REQ), which is common to all clock mux control units, with two for each clock mux control unit unique lower limiting enable ($S_L$) and disable ($S_U$) signals individually at each request signal input. A basic request filtering cycle is shown in the flow diagram of FIG. 22. Again, each request filtering finite logic state machine operate independently and the flow diagram only apply to an arbitrary single unit at a time. At first during the idle portion of a request filtering cycle, labeled "Await next REQ window" in the flow diagram, prior to a new gating period the lower limiting enable signal ($S_L$) is inactive low (0) and no request signal is passed onto the request input of the associated clock mux control unit ($CMC_i$).

$$\overline{S}_U \cdot S_L = 1 \qquad \text{(Eq. 23)}$$

The request filter turn transparent coincident with a principal transition of the lower enable signal ($S_L$) from low to high in a positive edge triggered system given that the upper limiting disable signal ($S_U$) has performed the opposite transition from high to low priory and thus has been inactivated. Transition from idle to open, i.e. from the $00_b$ state to $01_b$ state, is consistent with a fulfilled combinatorial transition condition as given in (Eq. 23). Either of two principal events may take place during the open period and change the request filter state, first a request may emerge, whereas REQ goes high, or secondly if the valid request timeslot (window) is terminated by a principal transition of the upper limiting disable signal ($S_U$) from low to high (Eq. 24).

$$S_U: 0 \rightarrow 1 \qquad \text{(Eq. 24)}$$

A valid request originate from an input data signal transition that occur within the valid request window, i.e. the period in time between a primary transition of the enabling signal and a subsequent primary transition of the termination signal, during which the gating condition of (Eq. 23) is fulfilled. Once detected the valid request is latched and the output remain constant (high) irrespective of the gating condition for the reminder of the request processing period until the compound request signal (REQ) goes low (Eq. 25).

$$REQ: 1 \rightarrow 0 \qquad \text{(Eq. 25)}$$

After the request has been properly communicated to the associated clock mux control unit and accepted by the current master the request filter state machine return to idle and the request filtering process start over again.

Figure 22:
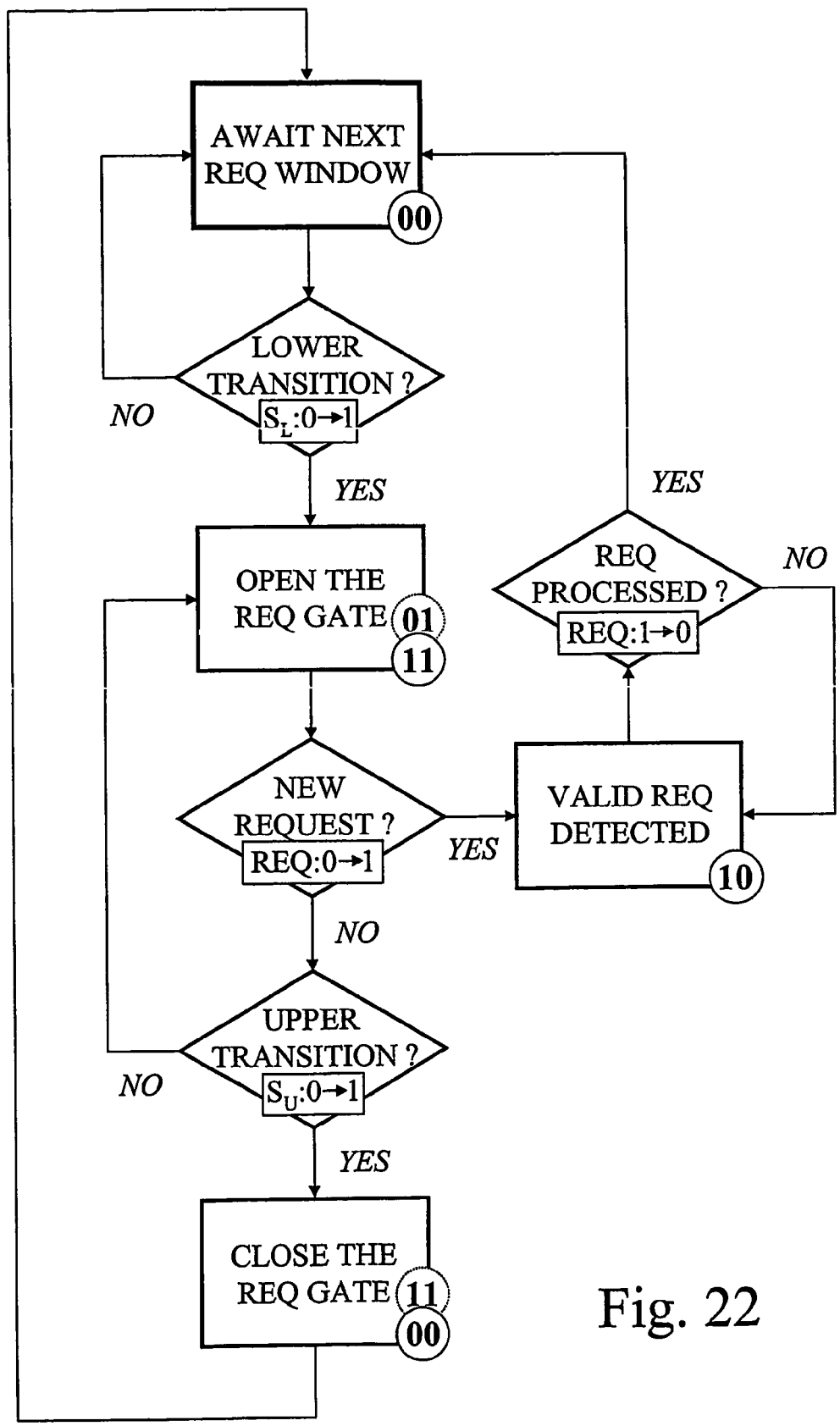
FIG. 22 is a flow diagram of an exemplary compound request filter process.
Figure 23:
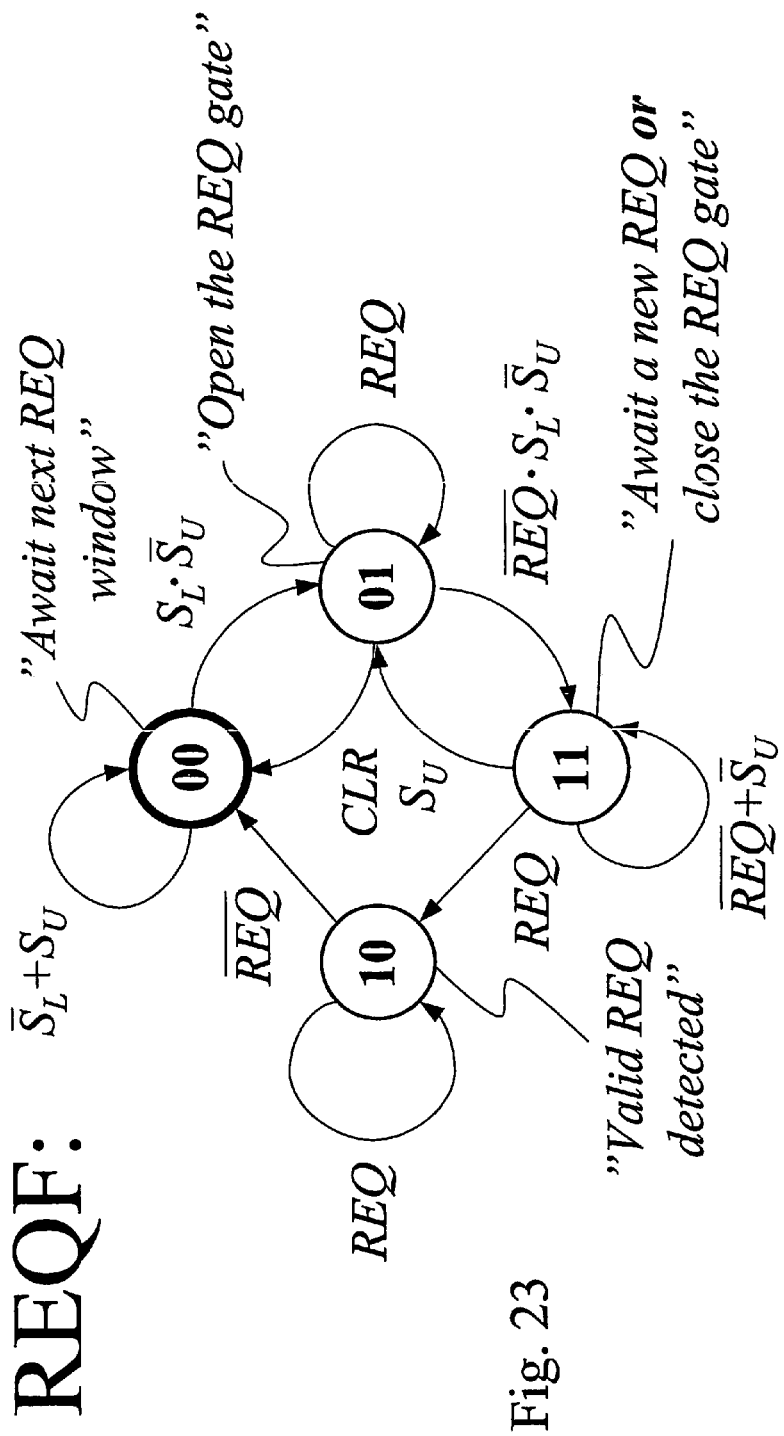
FIG. 23 is a schematic state diagram for an exemplary request filtering finite state machine.

Turning the attention to the state diagram for the request filtering finite logic state machine in FIG. 23, which implements the request filtering functionality with desired properties and behavior stated by the sequential chain of events described in the flow diagram FIG. 22 by means of incorporating sequential logic. Two state variables, $q_1$ and $q_0$, form four distinct Grey coded states, $[00_b\, 01_b\, 11_b\, 10_b]$, identical to the encircled references in the flow diagram of FIG. 22. Since each clock mux control unit cooperate with a unique associated request filtering unit the two gating signals, $S_L$ and $S_U$, are also different for each request filter unit although the super index i appearing in the block diagram of FIG. 21 has been omitted. Each request filter state machine, $REQF_i$, individually perform several steps during a request filter cycle:

Idle:
1. Outside the timeslot when the request filter is transparent the "Await next REQuest window" ($00_b$) is occupied as seen in the state diagram of FIG. 23.

Open:
2. Coincident with a primary transition, from low to high in the preferred implementation, of the lower limiting enable signal ($S_L$) the pass gate becomes transparent during the open condition with the "Open the REQuest gate" state ($01_b$) occupied.
3. Irrespective of the request signal state a fulfilled clear logic condition, when the CLR goes high in the preferred embodiment, reset the request filter state machine back to the idle state ($00_b$). Essentially a reset is triggered by a change in polarity for either of the two gating signals, $S_L$ and $S_U$, whereas the gating condition (Eq. 23) is no longer valid.

Clear:

4. Only a request initiated within the valid request window, i.e. the timeslot when the "Open the REQuest gate" state ($01_b$) is occupied, may be passed onto the associated clock mux control unit ($CMC_i$). In order to distinguish between an invalid request already (constant) high when the request pass gate opens and a valid request counterpart wherein the input request signal logic level perform a transition and thus alter and effectively invert logical level from low to high within the valid request window a transition condition and additional intermediate state ($11_b$) is introduced. As seen in the state diagram of FIG. 23, the request filter state machine remains in the "Open the REQuest gate" state ($01_b$) until the input request signal (REQ) goes low and then transitions to the "Await a new REQuest or close the REQuest gate" state ($11_b$). This procedure effectively clears both old and invalid requests.

Await:

5. Once arriving to the "Await a new REQuest or close the REQuest gate" state ($11_b$) a new request and equivalently a principal REQ transition from low to high that appear prior to a primary transition of the upper limiting disable signal ($S_U$) coincident with the point in time where the request gate closes unconditionally end up in yet another subsequent state change to the "Valid REQuest detected" ($10_b$) state.

6. A primary transition of the upper limiting disable signal ($S_U$) on the other hand trigger a state change back to the initial state, "Await next REQuest window" ($00_b$), via the intermediate "Open the REQuest gate" state ($01_b$) state.

Detect:

7. All through the duration of the "Valid REQuest detected" ($10_b$) state occupancy the request output indicates a valid request, which is communicated to the clock mux control unit.

Close:

8. If either a primary transition of the upper limiting disable signal ($S_U$) occur whilst the "Await a new REQuest or close the REQuest gate" state ($11_b$) is occupied or the input request is cleared, i.e. REQ goes low, after a valid request has been acknowledged by the current clock mux control master during occupancy of the "Valid REQuest detected" ($10_b$) state the request gate is closed and the corresponding request filtering state machine returns to the idle state ($00_b$).

Elaborated a bit more in detail the logical clear condition, CLR, applied to reset the "Open the REQuest gate" state ($01_b$) back to the "Await next REQuest window" ($00_b$) initial state whenever the constitutional condition (Eq. 23) for the valid request window is no longer satisfied is in turn true if $S_L$ goes low or $S_U$ goes high directly derived from deMorgans combinatorial reduction laws.

$$CLR = \overline{\overline{S_L} \cdot S_U} = \overline{S_L} + S_U \quad \text{(Eq. 26)}$$

To prevent latching behavior associated with operation at clock rates significantly below the nominal, i.e. under clocking, and propagation of spurious requests after the first valid request has been properly processed the transition condition from the "Valid REQuest detected" ($10_b$) state back to the "Await next REQuest window" ($00_b$) initial state may be replaced by a similar one that in addition delay the reset until the full duration of the request filter period has elapsed.

$$\overline{REQ} \cdot CLR = \overline{REQ} \cdot \overline{S_L} \cdot \overline{S_U} \quad \text{(Eq. 27)}$$

Normally narrow band request filtering, which restrict handover from the current master to adjacent sample phases and in that severely restricting the instantaneous phase offset, exclude the need for the hold latch circuitry presented later. Dependent on implementation hold latch circuitry may even be incompatible with request filtering.

Mainly principal transitions with an overall influence on the fundamental operation of the request filtering functionality are depicted in the state diagram of FIG. 23. Presented as truth binary logic tables the Karnaugh diagrams of FIGS. 24A and 24B define the next state functions, $q_0^+$ and $q_1^+$ according to the state diagram of FIG. 23. An indispensable overlapping product term vital for asynchronous implementations in order to avoid race conditions exist in the next state function $q_0^+$, which may be removed by accident during logic optimization.

$$OPT(q_0^+) = q_0 \cdot \overline{REQ} \cdot S_L \cdot \overline{S_U} \quad \text{(Eq. 28)}$$

Logical expressions for the next state functions $q_0^+$ and $q_1^+$ for the preferred embodiment of the request filter unit presented as a sum of products:

$$q_1^+ = q_1 \cdot q_0 \cdot \overline{S_U} + q_1 \cdot REQ + q_0 \cdot \overline{REQ} \cdot S_L \cdot \overline{S_U} \quad \text{(Eq. 29)}$$

$$q_0^+ = q_1 \cdot q_0 \cdot \overline{REQ} + \overline{q_1} \cdot S_L \cdot \overline{S_U} + q_0 \cdot \overline{REQ} \cdot S_L \cdot \overline{S_U} \quad \text{(Eq. 30)}$$

The filtered request output ($REQ_f$) is decoded from the state variables $q_0$ and $q_1$ such that a high request is only forwarded to the clock mux control unit when the "Valid REQuest detected" ($10_b$) state is occupied:

$$REQ_f = REQ_f^{(i)} = q_1 \cdot \overline{q_0} \quad \text{(Eq. 31)}$$

Local request filtering utilize a somewhat different approach whereas the compound request signal, REQ, common to all clock mux control units, is replaced by an individual input request signal for each clock mux control unit separately. Each unique local request signal replacement for the overall compound input request signal is in turn formed by a logic "ANY" (OR) compilation of the request signal outputs from all clock mux control units that belong to the valid request subset for that particular unit as seen in (Eq. 32). The valid request subset in the preferred embodiment of the invention contain a collection of request signals that originate from clock mux control units associated with adjacent sample clock phases sufficiently close to the particular sample phase associated with the clock mux control unit subject to filtering.

$$REQ_f^{(i)} = REQ_{i-p} + \ldots + REQ_{i+q} \quad \text{(Eq. 32)}$$

In that hand over from the current master to a new eligible master is performed in a controlled manner with less instantaneous phase disturbance with a predetermined limited maximum phase error. Large flexibility in tailoring the frequency response of the filtering functionality is easily incorporated in the formation of the valid request window.

Selection Supervision, SEL SUP

Technically complex systems of today are often inherently sensitive and may react unpredictably and beyond all control during anomalous operating conditions such that a burst of errors are produced in response to an isolated error condition not foreseen by the designer in the first place. One increasingly important property of a modern communication system is thus overall robustness. Preferred features often include limited error propagation and rapid fault recovery in conjunction with an overall predictable and bounded system error response and reduced impact of errors especially isolated errors. Evidently a robust clock recovery system possesses the ability to withstand severe perturbations and in addition tolerates a highly distorted input signal due to a large amount of erroneous input signal symbols without loosing track of the input signal or in the worst case being forced into a deadlock.

Figure 25:
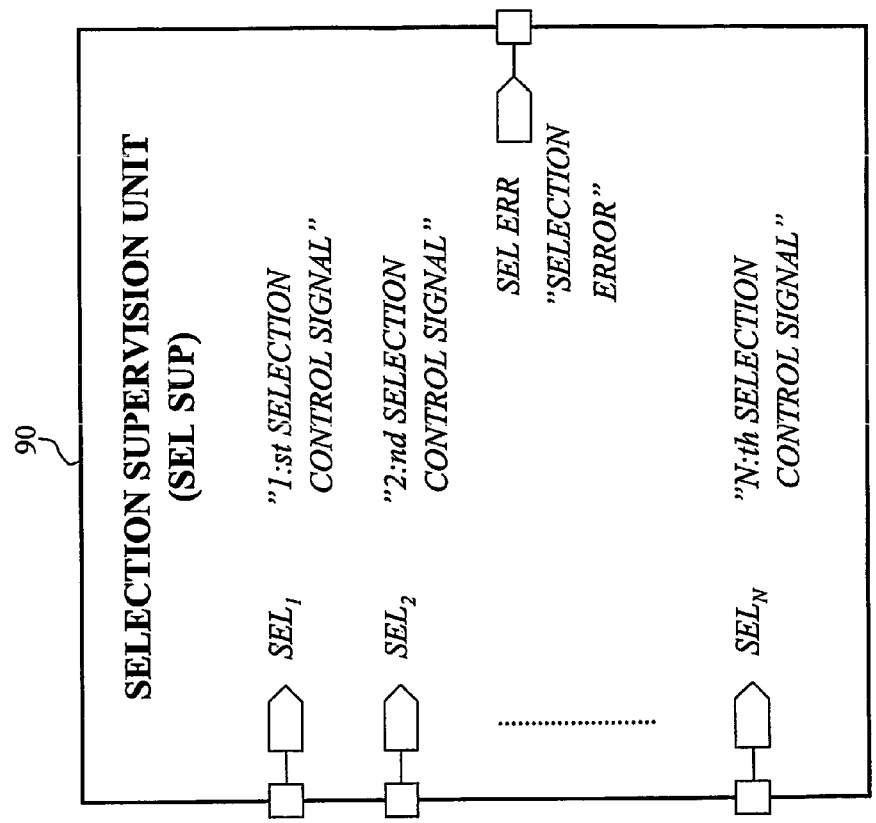
FIG. 25 is a schematic interface and port block diagram of an exemplary selection supervision unit.

Superior to conventional feedback loop based clock recovery systems the proposed clock recovery scheme with its ability to process every new input data signal transition in a parallel manner and based there upon form a recovered clock possesses all these favorable properties due to the inherent simplicity in the distributed algorithm thereby avoiding a complex centralized decision unit and mechanism. An isolated error simply does not multiply when propagated to the recovered clock output since the clock recovery algorithm virtually acquire lock instantly as soon as the next regular input signal transition appears on the data signal input. However when operated in the jitter filtering configuration an additional selection supervision unit may even further increase the robustness with an independent reset signal generator which resolve all erroneous situations where several clock mux control units act as clock selection masters simultaneously. Such a clock selection supervision unit with a port diagram depicted in FIG. 25 receives all selection control signals, $SEL_1, \ldots, SEL_N$ and output an high selection error signal, SEL ERR, in response to any abnormal condition where as two or more selection signals are active, normally associated with high level, simultaneously. Both an all-digital implementation of the selection supervision functionality is presented together with an alternative and significantly speedier analog counterpart.

All through the proposed novel distributed clock recovery algorithm has been derived as a generic functionality without any explicit requirements, such as timing of events, imposed upon the actual physical implementation and in that achieving great flexibility, scalability, portability and ease of use. In order to preserve these and other important features an all through digital implementation of the selection supervision functionality is advantageous.

Figure 26:
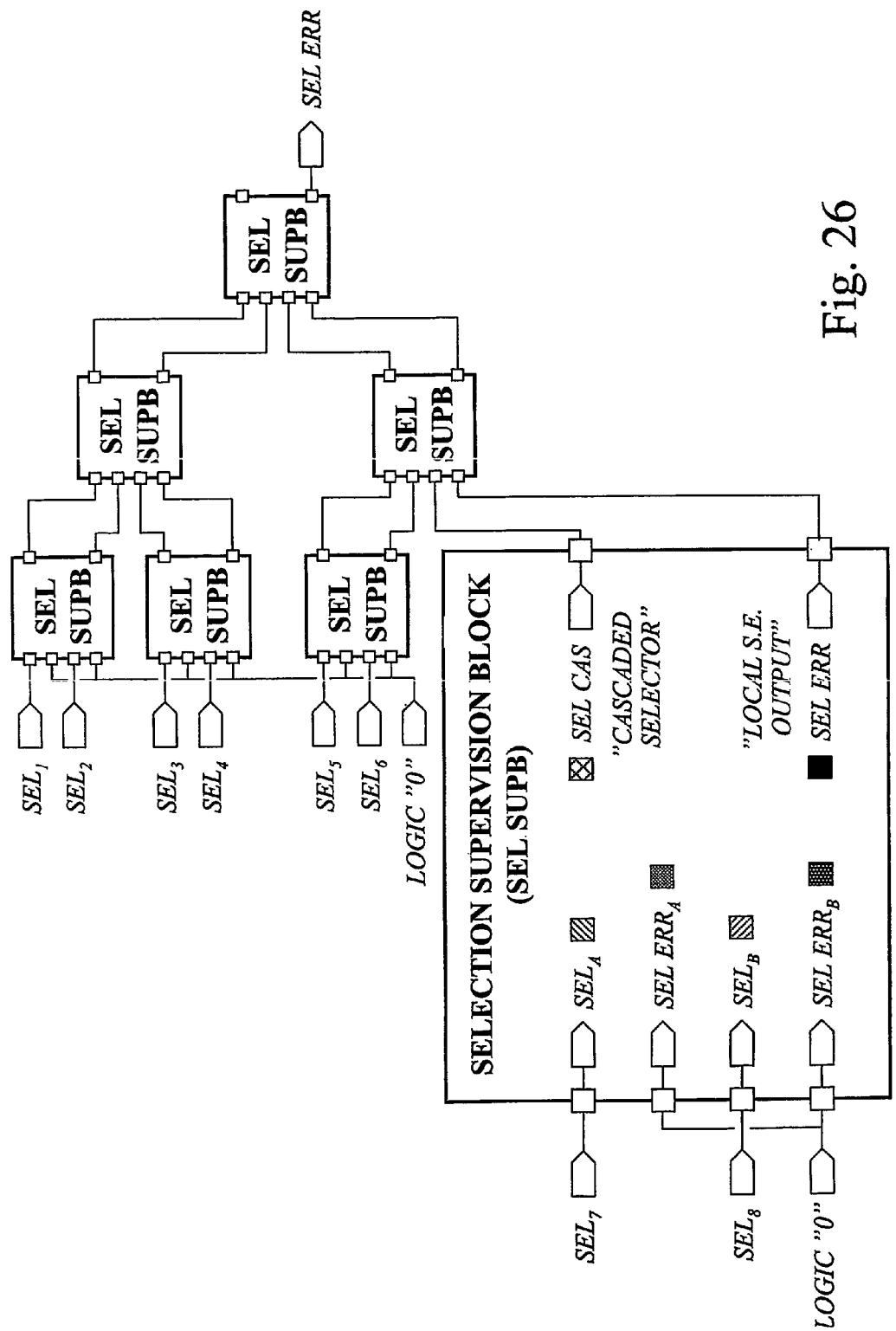
FIG. 26 is a schematic diagram of selection supervision blocks arranged in a binary tree manner to form the overall unit.

As seen in FIG. 26, the internal structure of a selection control unit, SEL SUP, comprises several individual instances of a common selection supervision block, SEL SUPB. In total a selection supervision unit consist of N−1 selection supervision blocks arranged in a binary tree hierarchy with N/2 leaves where N is assumed to be an even number of sample clock phases. All selection supervision blocks are in turn arranged in a binary tree manner whereas the individual clock phase selection signals, $SEL_1, \ldots, SEL_N$, enter as leaves and the selection error signal, SEL ERR, is gradually propagated all the way to the root. All additional unused inputs that exist on the leaves are effectively inactivated through a forced logic low (0) input signal. Each selection supervision block, except for the ones that were previously referred to as leaves, is interconnected to the two adjacent selection supervision blocks that reside on a lower level in the binary tree hierarchy (whereas by convention the root is actually at the top level) through the two selection input signals, $SEL_A$ and $SEL_B$ respectively, and the two selection error inputs, SEL $ERR_A$ and SEL $ERR_B$ respectively, that propagate a selection error that was detected in a lower level selection supervision block. Both the locally generated selection error output signal, SEL ERR, and the cascaded selection signal, SEL CAS, are then propagated to a neighboring selection supervision block at the next higher level in the binary tree hierarchy.

Essentially each selection supervision block continuously compares the two selection input signals in order to determine whether or not both are simultaneously active high and a selection error thus has occurred. If either of the two selection inputs is high this information is passed on to the next higher level in the hierarchy so that all selection signals are compared in an orderly manner:

$$SEL\ CAS = SEL_A + SEL_B \qquad \text{(Eq. 33)}$$

A selection error has occurred whenever both selectors, $SEL_A$ and $SEL_B$, are active high simultaneously:

$$SEL\ ERR = (SEL_A \cdot SEL_B) + SEL\ ERR_A + SEL\ ERR_B \qquad \text{(Eq. 34)}$$

Additionally, the result from previous selection error processing, SEL $ERR_A$ and SEL $ERR_B$, in the two neighboring selection supervision blocks are forwarded to the root and thus also enter into the compound selection error expression, SEL ERR, through a simple logic ANY operation (implemented as a three input OR function). Both the selection cascade and error signals are formed as pure combinatorial logic functions with expressions given by (Eq. 33) and (Eq. 34).

A drawback of an all-digital implementation of the selection supervision functionality is the inherent delay introduced by the cascaded selection error-forwarding algorithm in the binary tree structure. Significantly faster detection of an anomalous selection control condition is readily achieved with an analog implementation based upon a level comparator with large gain and high slew rate specified as output voltage change per unit time during a selection error output signal change from low to high or vice versa. By comparison the equivalent logic depth is limited to a first layer in the binary tree.

Figure 28:
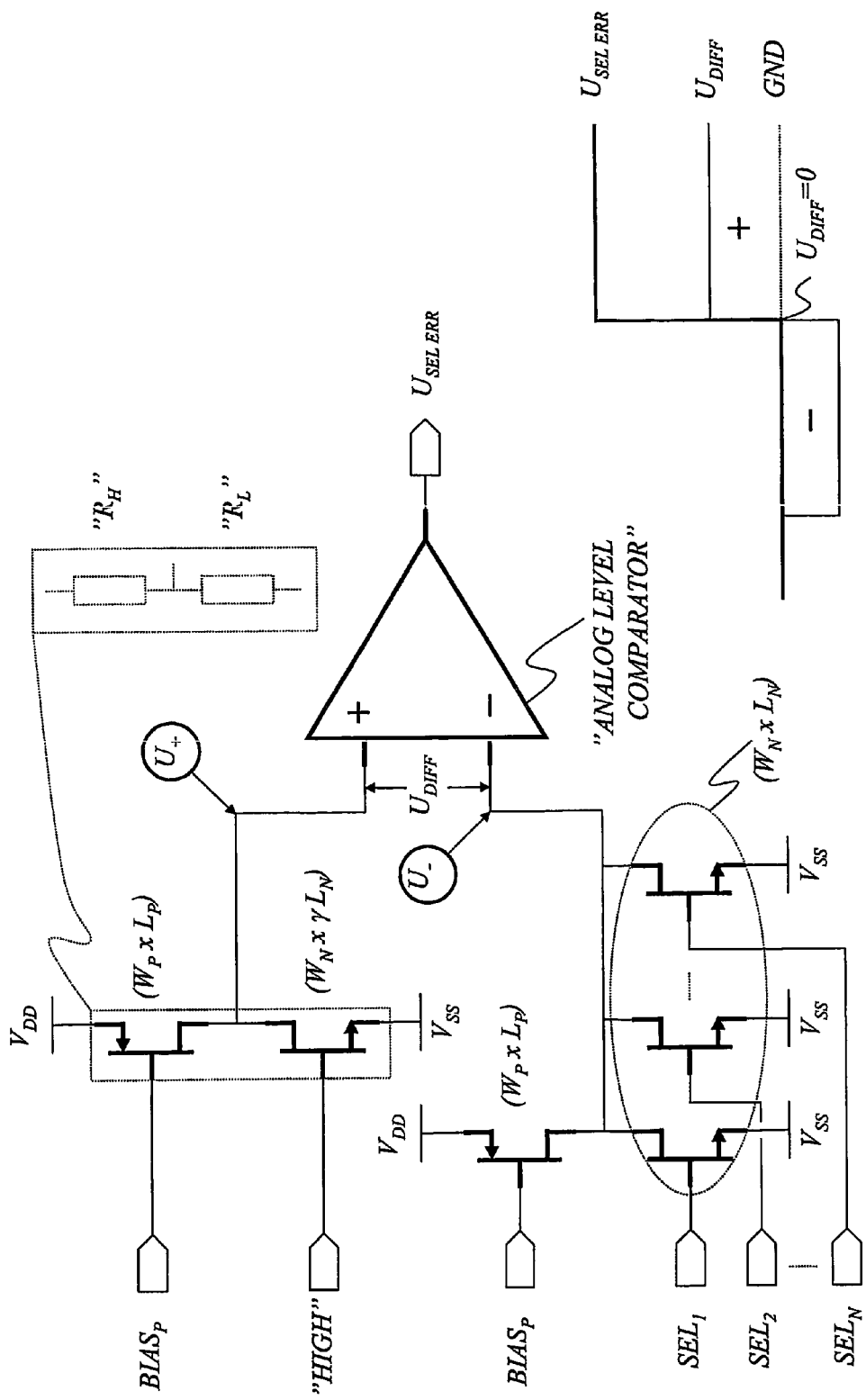
FIG. 28A is a schematic circuit diagram of an ultra fast analog selection supervision unit.
FIG. 28B illustrates the behavior of the level comparator of FIG. 28A.

Basically the analog selection error detector in FIG. 28A includes three main parts, namely a reference voltage generator branch connected to non-inverted input of the comparator, denoted "+", a similar supervision branch, connected to the inverting input labeled "−", with the important difference that all the selection control signals, $SEL_1, \ldots, SEL_N$ dynamically determine the voltage level, which is subsequently compared to the reference value by the level comparator that output desired selection error signal, $U_{SEL\ ERR}$, with predetermined proper logic signal levels in response to the difference voltage signal, $U_{DIFF}$, at the level comparator input.

Both the reference ($U_+$) and supervision ($U_−$) voltages are generated by means of an equivalent voltage divider, in much similar to a pair of discrete resistors, $R_H$ and $R_L$, connected in series with the output voltage derived from the common connection point, whereas the upper resistor indexed H is in addition tied to a high potential ($U_H$), a supply voltage $V_{DD}$ or similar, and the lower resistor indexed L is instead tied to a lower potential ($U_L$), ground trace $V_{SS}$ or similar. Preferably active devices such as field effect transistors, for instance implemented in NMOS and PMOS technology, are used in the voltage dividers. Omitting all analytic derivation steps a simple and well-known expression for the mid potential ($U_M$) may be stated as in (Eq. 35):

$$U_M = U_L + (U_H - U_L) \cdot \frac{R_L}{R_L + R_H} \qquad \text{(Eq. 35)}$$
$$= \left\{ \begin{array}{c} U_L = 0 \\ U_H = V_{DD} \end{array} \right\}$$
$$= V_{DD} \cdot \frac{R_L}{R_L + R_H}$$

Clearly, if both the reference and supervision voltage dividers share a common element size such that for instance both upper PMOS transistors, or equivalent resistors $R_H$, are of identical length ($L_P$) and width ($W_P$) and thereby has equal channel resistance provided that the same gate drive level, $BIAS_P$, is applied to both transistors a difference in pull down strength would produce a difference voltage across the level comparator input.

Conveniently the input voltage difference, $U_{DIFF}$, is defined according to a positive convention following (Eq. 36):

$$U_{DIFF} = U_+ - U_- \quad \text{(Eq. 36)}$$

Even a small electrical potential difference, $U_{DIFF}$, between the reference branch connected to the non-inverting input (+) and the supervision branch connected to the inverting input (−) is sufficient to ensure a well defined selection error output signal level and state without any ambiguity due to the large gain typically associated with a level comparator. If the non-inverting input has a higher potential compared to the inverting input the level the comparator output goes high. On the other hand if the inverting input potential ($U_-$) is raised above the non-inverting input potential ($U_+$) the comparator output is forced low all according to (Eq. 37) below:

$$U_{SEL\,ERR} = \begin{cases} 1 & U_{DIFF} > 0 \\ 0 & U_{DIFF} < 0 \end{cases} \quad \text{(Eq. 37)}$$

To ensure proper operation with sufficient noise immunity margin the reference voltage ($U_+$) is preferably located in the middle of the voltage span between a supervision branch voltage potential ($U_-$) created by a single active selection supervision signal (any one out of $SEL_1, \ldots, SEL_N$ is exclusively high) and the case were exactly two clock mux control units simultaneously and consequently erroneously act as clock selection masters where as two selection signals are high (two out of $SEL_1, \ldots, SEL_N$). In the preferred embodiment a difference in voltage level directly translate into a difference in pull down strength and equivalently a lower resistance to ground in the voltage divider, which in turn correspond to an effectively altered scale factor for the devices connected to ground in the active transistor based implementation of the voltage divider. Field effect transistors produced in planar technology has a scale factor (S) which depend upon the two dimensional cross section of the conductive channel, namely the channel length (L) and the channel width (W). To separate the n- and p-type of transistors an additional index is used in FIG. 28A. Linear dependency of resistance on the channel length (L) and inverse proportionality to the channel width (W) make field effect transistor (CMOS or similar) based implementations especially suitable. For instance, if the gate length of a transistor is reduced to half of its initial value the resistance is accordingly also drop to half of the previous value similarly if the width is doubled the resistance also drops to half of its initial value. To quantify the difference in pull down resistance to ground between a transistor in the reference branch and a transistor at the same position in the supervision branch due to the variation in geometric sizes a common base scale factor (width $W_N$ and length $L_N$), which is common to all transistors of n-type, is used in conjunction with a relative length multiplier ($\gamma$). To even further simplify the presentation equal channel width is used. Optimal choice of scale factor for the reference branch may depend upon the actual implementation and choice of integrated circuit technology but in the preferred embodiment of the invention the pull down resistance is chosen 50 percent lower for a n-type of transistor in the reference branch compared to a similar transistor in the supervision branch (Eq. 38).

$$\gamma_{nom} = 1 - \frac{1}{2} = 0.5 \quad \text{(Eq. 38)}$$

However the net resistance to ground is twice as large in the reference voltage divider when two pull down transistors are active in the supervision branch. In all this ensures a symmetric positioning of the reference voltage generator relative to the supervision branch at the very detection threshold where only one additional selection signal is active and the desired noise immunity requirement is thereby met. Additional capacitive decoupling of the reference branch to the ground may even further reduce the impact of noise by stabilization of the switching threshold.

When the proposed clock recovery unit is introduced in a fault redundant system where duplicated clock recovery systems are used in parallel, a failing unit simply results in that the output recovered clock vanishes (stop condition) until a new input data signal transition occur and the clock synchronization is restored. Such a behavior greatly simplifies the design of majority vote circuitry and synchronization fail detectors. Optionally a simple hold circuitry may be added onto the selection supervision output in order to hold the selection error signal until all clock mux control units are properly reseted (i.e. REL is high).

Clock Mux Unit, CMUX

Figure 29:
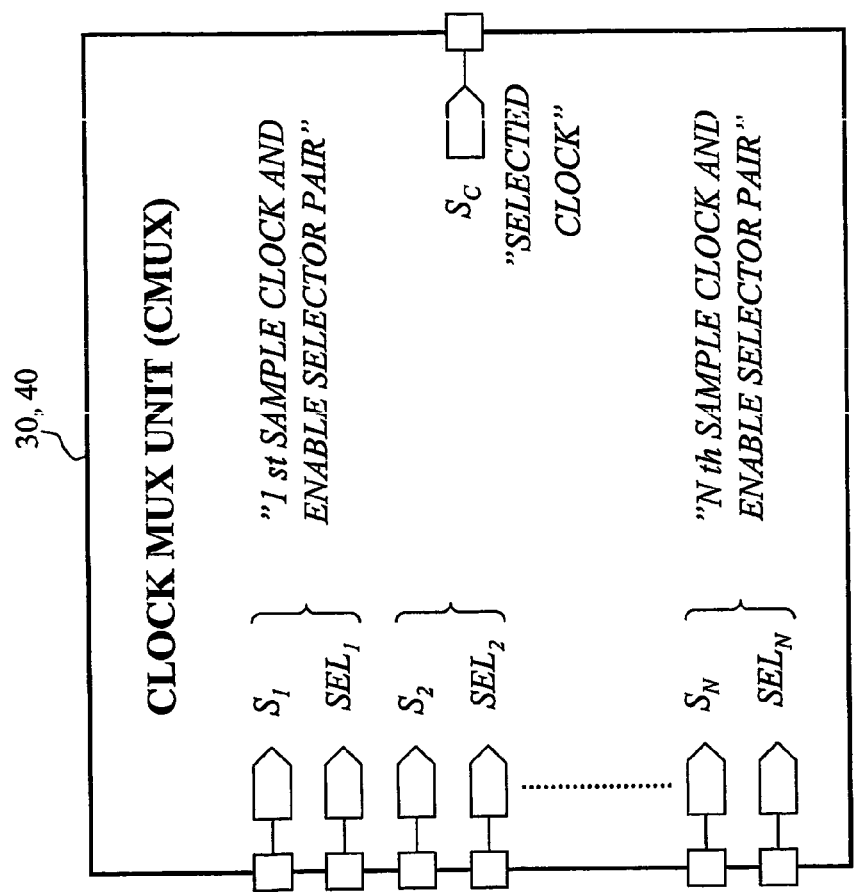
FIG. 29 illustrates a core clock mux unit, CMUX, interface and port block diagram according to an exemplary embodiment of the invention.

Although distributed in nature the overall clock recovery algorithm and hardware contain a multiplexor core, CMUX, which in response to the phase selection logic state continuously produce, a single selected output signal, $C_S$, during the dynamic phase selection process involving all the clock mux control units. Each phase shifted sample clock connected to a clock mux input, $S_i$, is accompanied by a unique selection signal, $SEL_i$, which collectively enable the sample clock signal from an active master and disable all others, see FIG. 29.

Without any loss of generality the interface and port block diagram for the clock mux unit is drawn in a standardized manner displaying sample and selector signal pairs that share a common index irrespective of the actual wiring of the clock mux when embedded into the overall clock recovery system as seen in FIG. 2. Ideally the input data signal is sampled amidst a data bit at shortest between two consecutive input data signal transitions, which give a target phase relation between the recovered clock signal, either $S_C$ or $S_R$ depending on application, and the input data signal transition. Optimal choice of the data strobe point where the input data signal is evaluated and sampled by the recovered clock signal in presence of high frequency jitter where as the cycle to cycle input data signal transition timing changes are large thus require that the recovered clock signal is delayed one half sample clock signal period, $T_S$, with respect to the input data signal transition. The necessary phase shift and delay is effectively introduced with a cleaver arrangement of the interconnect between the clock mux control units and the clock mux itself without any addition of explicit delay elements. Instead of enabling the sample phase associated with a clock mux control unit, such that $SEL_i$ from $CMC_i$ is connected to the $SEL_i$ input of the clock mux, a more suitable choice is a sample clock with a phase offset of one half period, i.e. if $SEL_i$ is active the proper choice of sample clock is $S_{i+N/2}$. Delay introduced by physical signal interconnect and propagation delay associated with combinatorial and sequential logic such as gates often introduce an unintentional phase offset between the recovered clock and input data transitions, which may require a slightly different ordering of sample clock phases and selection signals. Additional feedback loops may measure and adjust the phase offset through dynamic re-ordering of the sample phases utilizing an additional cross connection mux or an explicit delay element connected to the clock mux or hold latch output. All such adjustments are performed over a significantly longer period in time and thus with a low phase adjustment bandwidth. Phase offset cancellation and calibration of the clock recovery unit does not mix or intervene with the high frequency jitter tracking abilities and the overall distributed direct clock recovery algorithm. Completion of both the edge detection and the subsequent hand over of clock mux control tasks within the time slot between the original input data signal transition and the selected clock signal transition delayed by one half sample clock signal period is essential to ensure error free operation of the clock recovery system.

Figure 30:
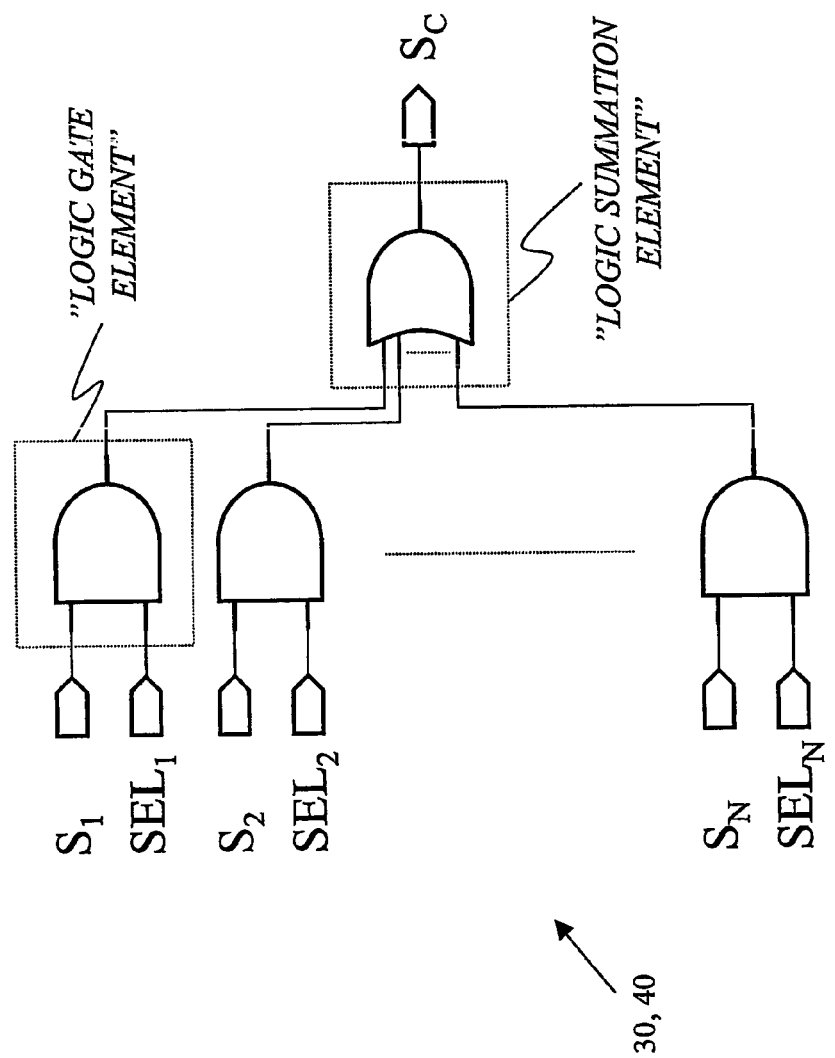
FIG. 30 illustrates an exemplary physical implementation of the clock mux unit with digital elements in sum of products format.
Figure 31:
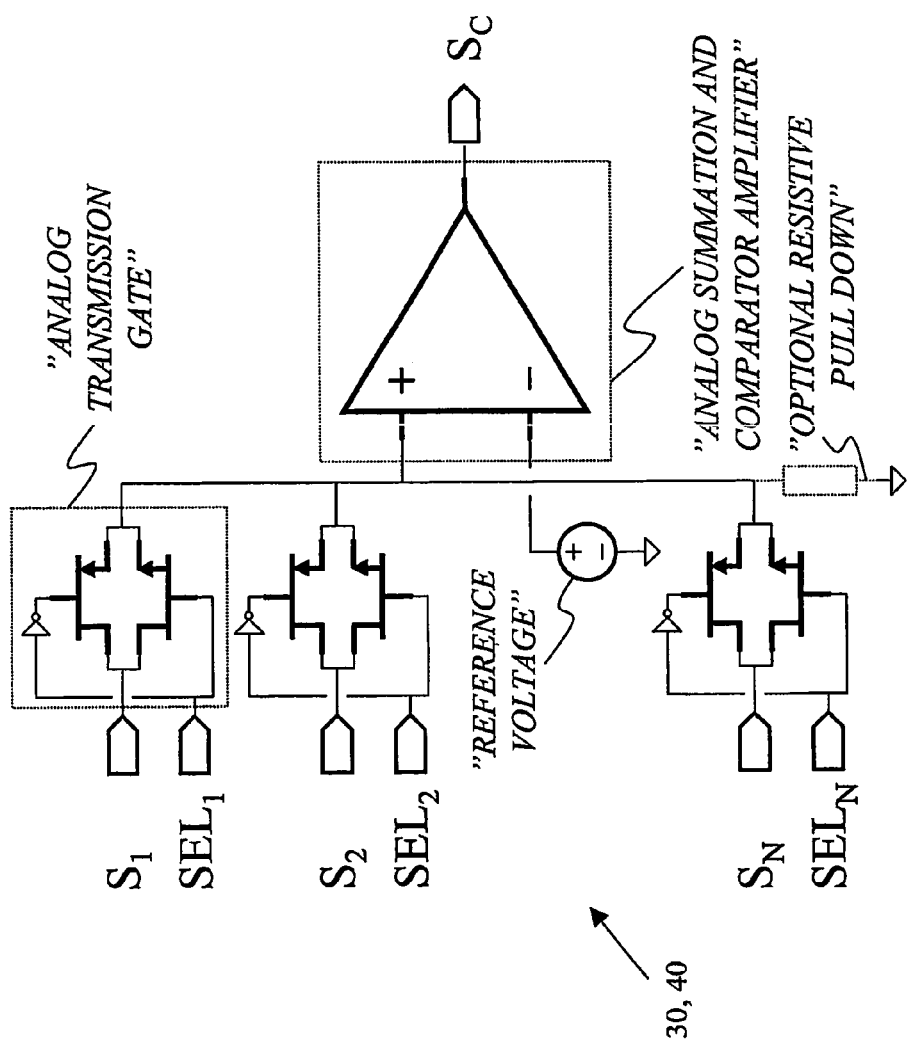
FIG. 31 illustrates an exemplary physical implementation of the clock mux unit as an analog scheme with transmission gates and a comparator.

Among the wide range of simple multiplexor implementations a preferred digital, based upon combinatorial elements, and a preferred analog based solution, consistent of transmission gates and a comparator function, is outlined without any loss of generality in FIG. 30 and FIG. 31, respectively. The basic constitutive logic expression for the clock mux is shown in (Eq. 39):

$$S_C = (S_1 \cdot SEL_1) + (S_2 \cdot SEL_2) + \ldots + (S_N \cdot SEL_N) \quad \text{(Eq. 39)}$$

In the digital logic implementation of FIG. 30, a constant low selection signal, $SEL_i$, effectively inhibit the sample clock signal, $S_i$, in that the output from the associated logic AND function remain low at all times irrespective of the input sample clock signal state and level. Only an active selection signal, normally with a high polarity, provide a transparent path from the sample clock signal input through the multi input summation logic OR element to the selected clock output, $S_C$.

$$\overline{SEL_1} + \ldots + \overline{SEL_{i-1}} + SEL_i + \overline{SEL_{i+1}} + \ldots + \overline{SEL_N} \Rightarrow$$
$$S_C = SEL_i \cdot S_i = S_i \quad \text{(Eq. 40)}$$

Even though presented as a sum of products logic function other logical equivalent forms exist. For instance a product of sums, i.e. where multiple OR functions are combined in an AND function as seen in (Eq. 41):

$$S_C = (S_1 + \overline{SEL_1}) \cdot (S_2 + \overline{SEL_2}) \cdot \ldots \cdot (S_N + \overline{SEL_N}) \quad \text{(Eq. 41)}$$

If a selector is low the logic OR output depend solely on the respective sample clock state and level where as all other selectors force the respective logic OR functions high which is a neutral state in the context of a logic AND product.

In the all analog solution of FIG. 31, the contribution of each sample clock phase to the overall selected clock discriminator embodied in the comparator amplifier is instead controlled through a set of independent transmission gates. Each transmission gate preferably consist of a complementary pair of field effect transistor elements arranged such that the input signal is passed to the output if the selector signal and its logic inverse is supplied to the gates of the N-type and P-type transistor elements respectively. One major benefit with a transmission gate based upon a complementary transistor pair, where as the N-type transistor has a conduction cut off threshold close to ground and the P-type of transistor instead experience cut off close to the high signal level, is that the clock signal is passed with a minimal distortion both for transition from low to high and vice versa. Naturally many other transmission gate arrangements are feasible preferably with the large signal capabilities associated with a complementary implementation. The analog summation and comparative amplifier has a simple wired OR connection from each transmission gate output to the common non inverting input of the comparator or amplifier identified by a plus sign in the implementation sketch of FIG. 31. The inverting input, marked by a minus sign, is connected to a properly filtered reference voltage, $V_{REF}$, which effectively implement the switch threshold associated with the digital implementation. Preferably the comparator switch threshold and reference level is located in the middle of the voltage span between ground and supply voltage. To produce a well behaved and predictable output signal with a well defined logic level in absence of any input clock signal, i.e. when no clock mux control unit act as master and all control signals, $SEL_1, \ldots, SEL_N$, are low and all transmission gate outputs are at a high impedance state an optional sufficiently high impedance pull down from the non inverting input to ground is introduced. Dimensioned properly the pull down resistance does not significantly reduce the saturated high output signal level.

Hold Latch and Hold Latch Control Units, HL and HLC

Bit rate jitter tracking capabilities exploited to the fullest may produce a selected clock signal pulse train from the clock mux output that experience abrupt phase changes in the range of one half unit interval in each direction at worst due to instantaneous displacement of the input data signal transition timing with up to one half data bit duration. In practice excessive cycle-to-cycle selected clock signal phase changes significantly distort the duty cycle of the selected clock, i.e. the amount of time spent in the saturated high state differs from the duration of the corresponding low state, especially if the selected clock is forced low coincident with the asynchronous transition detection. Spurious selected clock signal transitions that stem from a previously selected sample clock prior to the new input data signal transition is yet an even more serious problem, which may trigger an additional read operation in the subsequent receiver and thus erroneously sampling the input data signal twice during the handover from current to new clock selection master as seen in FIG. 32.

Figure 32:
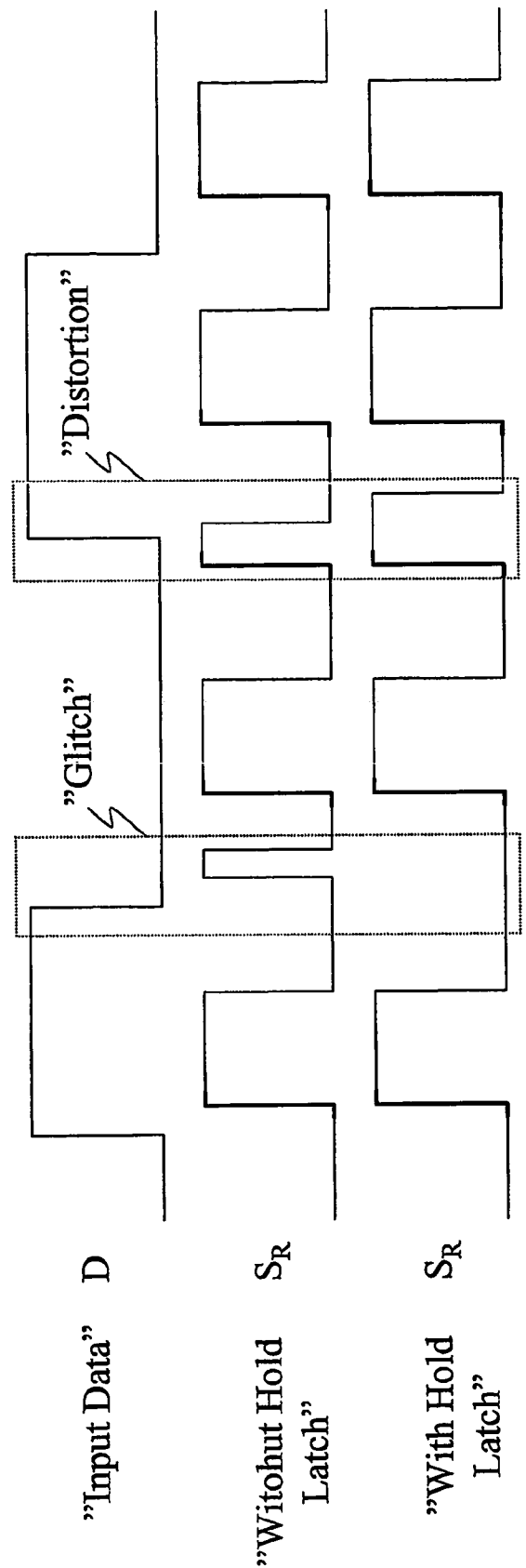
FIG. 32 is a comparative timing diagram for a native clock mux and an identical instance with hold latch functionality that suppress glitches and distortion.

A native clock mux without additional hold latch circuitry incorporated in the clock mux output section generally lacks efficient means to block all primary transitions, from low to high in a positive oriented system, during the critical period in time after a new input data transition has occurred but before the clock mux hand over has been finalized, which is readily seen in FIG. 32. All regular primary transitions are conveniently highlighted in bold in the preferred embodiment of FIG. 32. On the other hand if the clock mux is gated in such a manner that the recovered clock is forced low prematurely, the output waveform appear severely distorted particularly if the previous primary transition of the selected clock occur close before the new input data transition, which is compatible with a phase lag relation between data and clock signals. A rudimentary gate procedure often possesses a seed for highly distortive behavior introduced by an overly simplified approach, for instance if the clock mux output is forced low coincident with a positive asynchronous transition indication. Instead the novel concept of a hold latch (HL), which is transparent for all secondary transitions, from high back to low in the preferred embodiment of the invention, but still effectively block any spurious primary transition, from low to high prior to the intended new selected sample clock signal transition after the hand over of the clock mux control, is introduced to overcome all the shortcomings of a conventional output latch and instead procure all the good spurious transition and distortion canceling properties necessary for robust high speed operation. After a new input data signal transition has been detected, following a positive asynchronous transition indication (ASY TR), optionally accelerated by a trailing edge transition from high to low of the asynchronous hold latch enable signal, AHLE, the hold latch circuitry remain in the semi-transparent mode where a previously attained high selected clock signal state is preserved until the two conditions listed below are fulfilled (unless the previously selected sample clock signal transitions back to low spontaneously).

Conditions:
1. The clock mux control release procedure is either fully completed or at least properly initiated and REL or REQ transitions from low to high.
2. One half sample clock signal period has elapsed.

Unintentional and spurious selected clock signal transitions that stem from previously selected sample clock sources with a single or multiple simultaneously active clock mux selectors ($SEL_i$) during the critical period after a new input data signal transition has occurred and prior to the completion of the clock mux control release procedure identified by an emerging compound request (REQ) or preferably the detection of a positive compound release (REL) condition, which clearly signal that all sample clock sources that are securely disabled, is effectively blocked and filtered if the hold latch remain disabled with E low and thus maintain a semi-transparent "hold" mode of operation until a "pass" condition is detected. Properly enabled with E at a constant high logic level in the "pass" mode of operation the hold latch is fully transparent and passes the selected clock signal without any modification.

Premature trailing edge transitions back the low recovered clock state are often stimulated by a clock selection source change in conjunction with abrupt and excessive phase changes during jitter tracking operation. Ideally the hold latch circuitry delay a forced trailing edge transition of the selected clock from high to low up to one half sample clock period and thereby prolong the clock pulse in such a manner that next consecutive principal transition of the recovered clock occur one half sample clock period after the delayed trailing edge transition initiated by the prior sample clock source. Consequently minimized pulse and duty cycle distortion is achieved when the duration of the low state (pause) is adjusted to match the duration of the high state (pulse). Spontaneous trailing edge transitions from high to low are never withheld in order to reduce the clock pulse and duty cycle distortion.

All according to implementation preferences any suitable combination of the compound transition (TR), request (REQ) and release (REL) signals may be incorporated into the formation of a "pass" condition and the associated physical "pass" pulse delivered to the hold latch control circuitry (HLC). Preferably the trailing transition from high to low of the compound synchronous transition indication signal (TR) is used to switch the hold latch behavior from "hold" to "pass" in a negative edge triggered manner. Conveniently the negative edge triggered condition is replaced by an equivalent positive edge triggered condition wherein the compound synchronous transition indication signal enter inverted, i.e. low when the regular signal is high and vice versa.

$$TR = TR_1 + TR_2 + \ldots + TR_N \quad \text{(Eq. 42)}$$

According to the distributed multiphase clock selection algorithm if an input data signal transition occur in the vicinity of the i:th sample clock phase the selected clock is delayed an amount equal to N/2 sample phase increments. Proper alignment of the trailing edge transition for each individual synchronous transition indicator, $TR_i$, amidst the time interval between the input data and selected clock signal transitions irrespective of symmetry properties of the sample clock signal waveform is readily achieved if the reset of the transition indicator from the active high state back to low coincides with a positive transition of the sample clock signal, $S_{i+N/4}$, with a phase offset that equal one quarter of the sample clock period, $T_S/4$. Symmetry properties of an arbitrary sample clock, $S_i$, with equal high and low level duration a property may optionally be exploited in the formation of a trailing edge transition for the transition indicator. Mutually orthogonal the set of transition indicators collectively ensure that only a single transition indicator, which is locked to the new input data signal transition, contribute actively to the compound transition indication signal (TR) at a time and in that producing a bound phase relation between the trailing edges of the individual active transition indicator ($TR_i$) and the compound transition indication signal (TR). Additional timing information stated implicitly assume that the hand over procedure from current to new clock mux control master is completed prior to the trailing transition of the compound transition indicator. Timing independent hold latch control merely require an updated "pass" signal condition taking into account whether or not the actual clock mux control hand over is completed, i.e. if the compound release signal (REL) has performed a low-high-low cycle after the new input data signal transition occurred and the "hold" mode was activated with a H signal pulse.

Summarized below are three properties of the proposed novel hold latch that ensure proper clock mux behavior in bit rate jitter tracking mode:

1. After a new input data signal transition has occurred (and subsequently has been detected) the hold latch is disabled and block all primary transitions until an externally provided signal (P) again enable the hold latch, commonly after the handover is either initiated or fully completed and the distortion sensitive time interval with a duration of one quarter of a sample clock signal period has elapsed since the input data signal transition occurred.
2. On the other hand the hold latch should never block a secondary transition initiated by the selected sample clock signal source at any time.
3. When enabled the hold latch remain fully transparent and in that passing the selected clock signal on to the recovered clock output of the overall clock recovery unit in a one to one manner without any pre-distortion or filtering of primary or secondary transitions.

Figure 33:
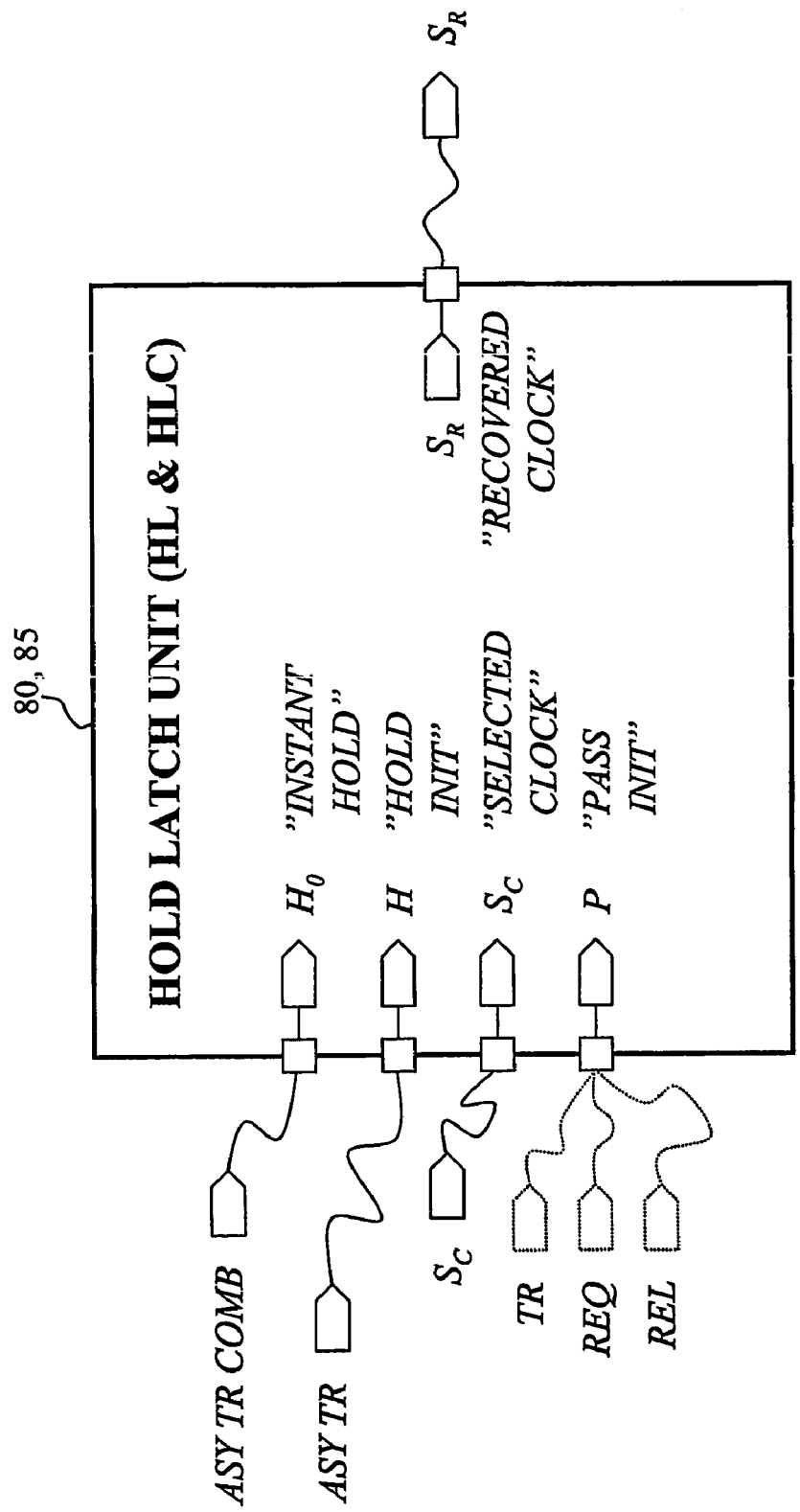
FIG. 33 is a hold latch and controller unit (HL & HLC) interface and port block diagram according to an exemplary embodiment of the invention.

FIG. 33 is a hold latch and controller unit (HL & HLC) interface and port block diagram according to an exemplary embodiment of the invention.

Efficient implementation of the hold latch functionality with a low complexity and reduced logic depth suitable for high-speed applications is readily achieved if the overall hold latch system is divided into two separate logical and physical subsystems, namely a hold latch unit (HL) and a hold latch control unit (HLC), in cooperation. The divided functionality is also reflected in two separate flow diagrams for the latch unit and the control unit in FIGS. 34A and B, respectively.

Figure 34A:
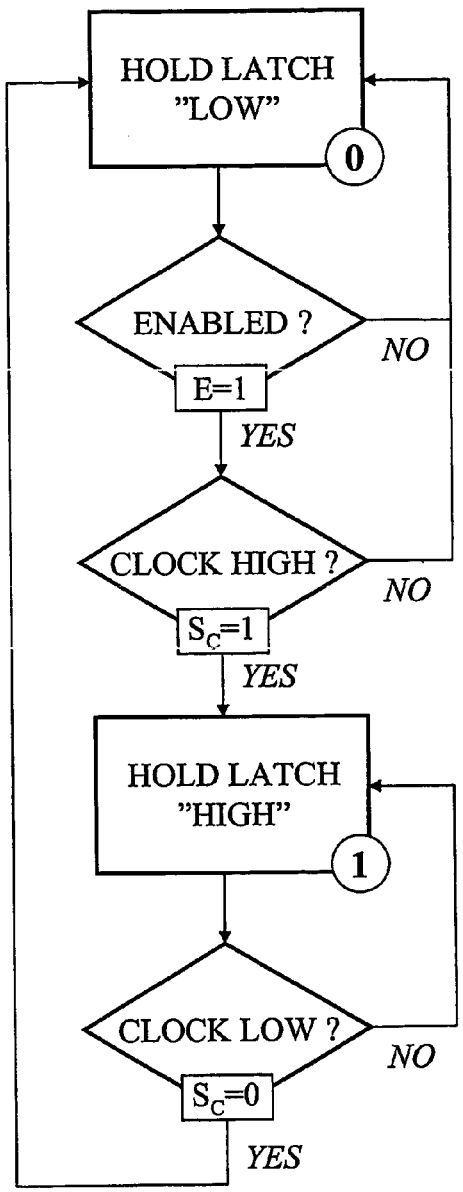
FIGS. 34A and B illustrate flow diagrams for a hold latch (HL) and hold latch control circuitry (HLC), respectively.
Figure 34B:
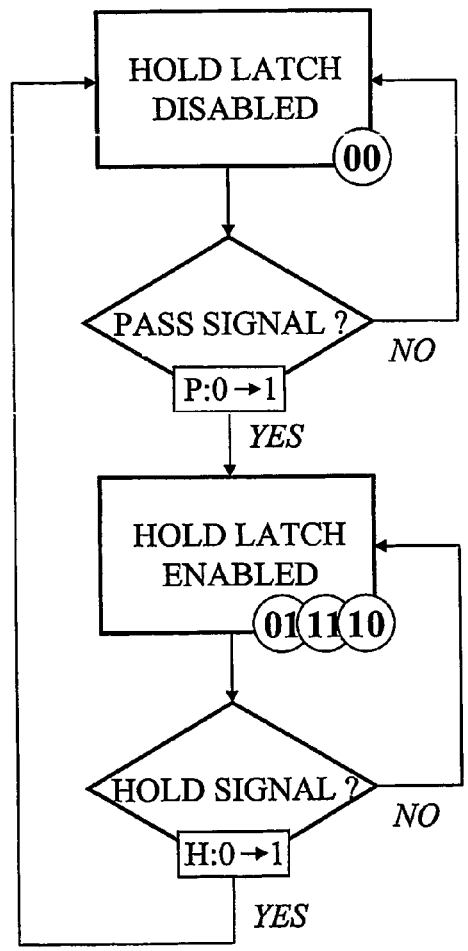

Each branched condition in the flow diagrams for the hold latch in FIG. 34A and the hold latch control unit in FIG. 34B is accompanied by an equivalent transition condition presented as an equivalent logic expression attached to the positive branch. In addition the implementation dependent logic state associated with an action is also presented encircled. For instance the "HOLD LATCH DISABLED" task is associated with the initial state ($00_b$) in the hold latch control unit finite state machine implementation. Both the enable (E) and the selected clock ($S_C$) signals must be high simultaneously to stimulate a hold latch (output) transition from low to high following the logic transition condition for the hold latch finite state machine from a low current state ($q_0$) to a high next state ($q_0^+$) given by Eq. 43. At all other times an enabled hold latch flip back and forth between the "LOW" and "HIGH" states dependent only on the input selected clock signal level.

$$q_0=0 \land E=1 \land S_C=1 \Rightarrow q_0^+=1 \quad \text{(Eq. 43)}$$

The hold latch control circuit derives the internal enable signal, denoted HLE or E in short, from the pass and hold signals, denoted P and H respectively in the overall hold latch unit block diagram of FIG. 33 and the flow diagram of FIG. 34B. By convention an enabled hold latch, with a high E signal level, passes the selected clock signal to the output transparently. A hold signal pulse disables the hold latch where as a pass signal pulse instead enables the hold latch again. Both the pass and hold operations are guided by edge discriminating principal transition conditions, which in turn radically reduce the dependency on pulse duration and other delay sensitive properties together with the one shot behavior that latch based control logic lack.

Without any loss of generality both the pass and the hold logic condition are preferably transformed into positive edge triggered conditions even though the native pass condition is actually negative edge triggered. Several intermediate states, namely $01_b$, $11_b$ and $10_b$, are involved in the positive edge trigged activation of the hold latch.

Figure 35:
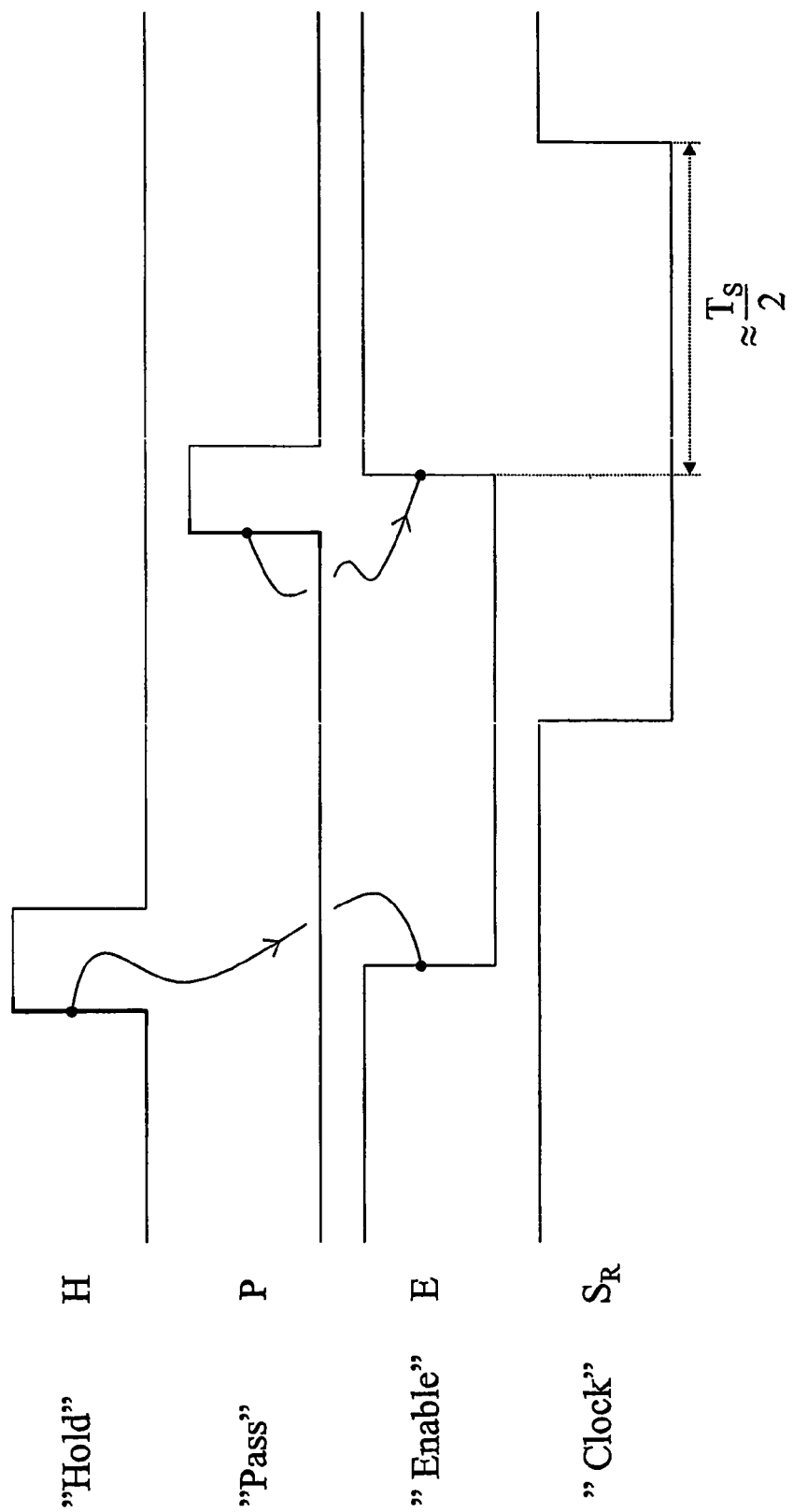
FIG. 35 illustrates formation of the hold latch enable signal stimulated by the pass (P) and hold (H) pulses together with the recovered output clock ($S_R$)

Formation of the hold latch enable signal during a typical clock recovery resynchronization cycle between the hold and pass pulses is outlined in FIG. 35. The recovered clock signal ($S_R$) is included in the timing diagram as a reference. Without any restriction regarding implementation preference the hold latch is enabled approximately one half sample clock period prior to a principal transition of the new selected sample clock signal if the pass signal (P) is derived from the trailing transition of the synchronous transition detection signal (TR).

Logical and physical separation of the latch and gate element (HL) from the control unit (HLC) provide several additional important benefits such as a compact, low skew implementation of the hold latch element as seen in FIG. 36C compared to an all inclusive approach. Compatibility to high frequency operation is ensured with only a single (AND) gate element present in the direct path of the selected clock signal. Naturally an all-analog solution based upon explicit transistor or diode based transmission gates may simply replace the logic latch element although not depicted.

With two states, $0_b$ and $1_b$, corresponding to either a low or a high output level respectively the finite logic state machine implementation of the hold latch only require a single state variable, $q_0$, to fully map the desired behavior of the flow diagram in FIG. 34A into the sequential machine of FIG. 36A. Next state function, $q_0^+$, presented in an optimized logic equivalent form as a basis for the gate level logic implementation of FIG. 36C:

$$q_0^+=q_0 \cdot S_C + E \cdot S_C = S_C \cdot (q_0+E) \quad \text{(Eq. 44)}$$

The recovered output clock, $S_R$, is simply direct decoded from the state variable, $q_0$:

$$S_R=q_0 \quad \text{(Eq. 45)}$$

Figure 37:
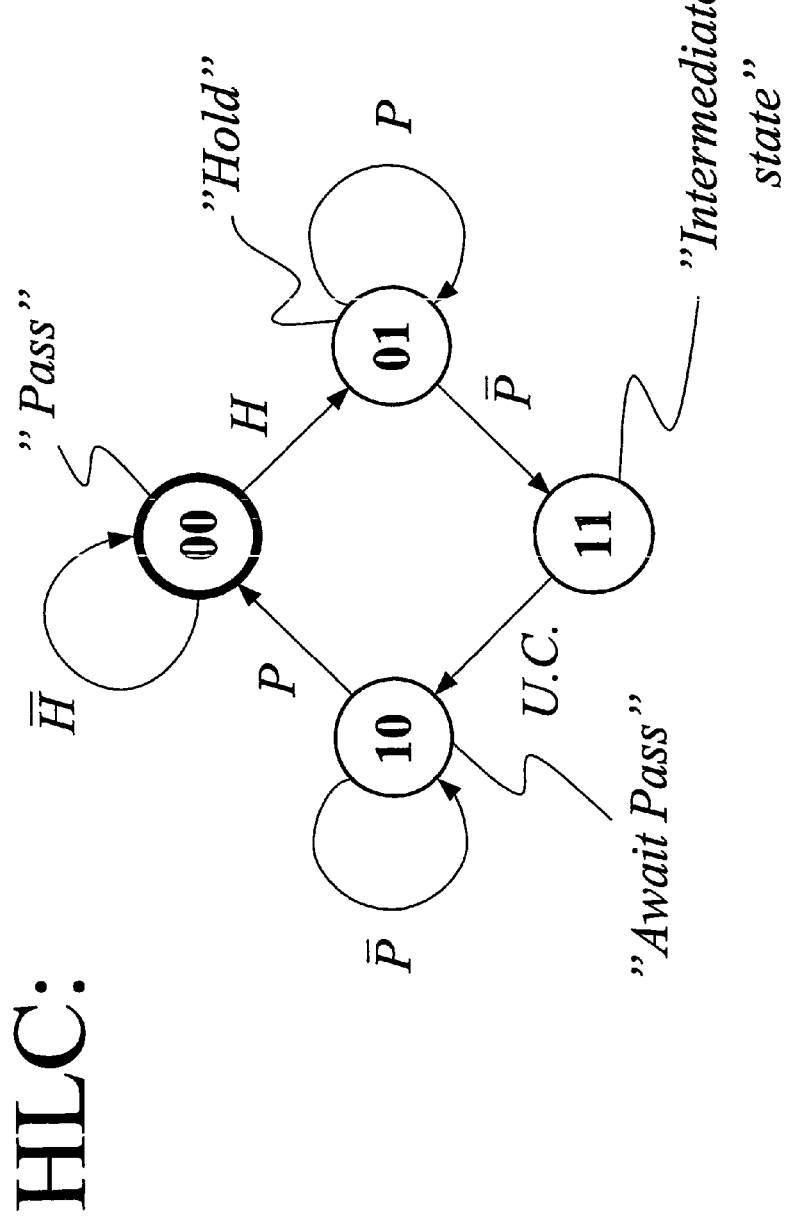
FIG. 37 is a state diagram for the hold latch control unit, HLC, finite state machine according to an exemplary embodiment of the invention.

Edge triggered by nature, the hold latch control unit requires somewhat more complex logic circuitry to implement the finite logic sequential state machine as presented in FIG. 37 (with an unconditional state transition marked U.C.).

Two logic state variables, $q_0$ and $q_1$, are decoded into four unique states. Unless preoccupied with suppression of spurious primary transitions or restoration of recovered clock waveform symmetry a fully enabled hold latch occupies the "Pass" state ($00_b$). Only if the hold latch control unit occupies the "Pass" state ($00_b$) is the hold latch element (HL) enabled, with E driven high:

$$E=\bar{q}_0 \cdot \bar{q}_1 \quad \text{(Eq. 46)}$$

Optionally a compound enable signal is formed by combining both the asynchronous hold latch enable signal, AHLE, and the ordinary hold latch enable signal, HLE or E in short, in a logic AND function, which in turn requires that both are simultaneously high to enable the hold latch. The compound enable signal replaces the simple enable signal and in that effectively accelerates the hold latch disable after a new input data signal transition has occurred.

After a new input data signal transition has occurred and the related hold signal, H, goes high the finite logic state machine in the hold latch control unit shift to the "Hold" state ($01_b$) and the enable signal, E, goes low. The sample and hold property associated with the edge triggered evaluation of the logic transition condition shifting the hold latch functionality from "pass" to "hold" mode of operation and vice versa is essential to avoid combinatorial loops formed by overlapping P and H signals. Instead robust hold latch behavior is ensured when all simple level sensitive conditions are replaced by well defined compound logic transition conditions consistent of a unique chain of complex logic events such as a positive edge transition of the pass signal (P), which preferably is derived from the negative transition of the compound transition indication signal (TR), followed by a similar positive transition of the hold signal (H), all in an interleaved manner. All though not obvious at first, the transition from the "Pass" ($00_b$) state to the "Hold" ($01_b$) state governed by a simple level sensitive condition, completed only if the hold signal (H) is high, is effectively positive edge triggered due to the fact that there is no direct opposite transition back to the "Pass" state from the "Hold" state and that the overall clock recovery algorithm ensure that the hold signal return to an inactive low level prior to the completion of the positive edge transition cycle for the pass signal (P), i.e. from low to high or from high to low and back to high. Without a priori knowledge of the pass and hold signal behavior prior to the input data signal transition the generic nature of the proposed asynchronous clock recovery scheme is best preserved if the hold latch enable cycle, that guide the hold latch control circuitry from the "Hold" state ($01_b$) back to the "Pass" state ($00_b$) through the "Intermediate state" ($11_b$) and the "Await pass" state ($10_b$), include a first transition condition that effectively inhibit a direct triggered transition to the "Pass" state ($00_b$) in a level sensitive manner when pass signal (P) is initially high. Once a positive pass signal (P) transition from low to high logic level is detected the hold latch control circuitry enables the hold latch and shift state from "Await hold" ($01_b$) back to "Pass" ($00_b$).

All five major steps in a complete hold latch control cycle, from enabled to disabled and back again to enabled mode, are summarized in a sequentially ordered list:

1. Fully enabled in the transparent mode the hold latch control circuitry occupies the "pass" state ($00_b$).
2. Coincident with a hold signal (H) level transition from low to high the hold latch is disabled when the hold latch control circuitry shift to the "hold" state ($01_b$).
3. To avoid misinterpretation of an initially constant high pass signal (P) as a fulfilled positive transition condition occupation of the "Intermediate state" ($11_b$) is compliant only with a low pass signal.
4. A subsequent unconditional transition brings the hold latch control state machine to the "Await nextpass pulse" state ($10_b$).

5. Following a pass pulse transition from low to high the "pass" state ($00_b$) is occupied and the enabled hold latch becomes fully transparent.

A Karnaugh diagram for the preferred implementation of the finite state machine description of the hold latch control circuitry as shown in FIG. 37 is presented in FIG. 38.

Next state combinatorial functions, $q_0^+$ and $q_1^+$, for the state variables, $q_0$ and $q_1$:

$$q_1^+ = q_1 \cdot q_0 + q_0 \cdot \overline{P} + q_1 \cdot \overline{P} \tag{Eq. 47}$$

$$q_0^+ = \overline{q}_1 \cdot q_0 + \overline{q}_1 \cdot H \tag{Eq. 48}$$

Figure 39:
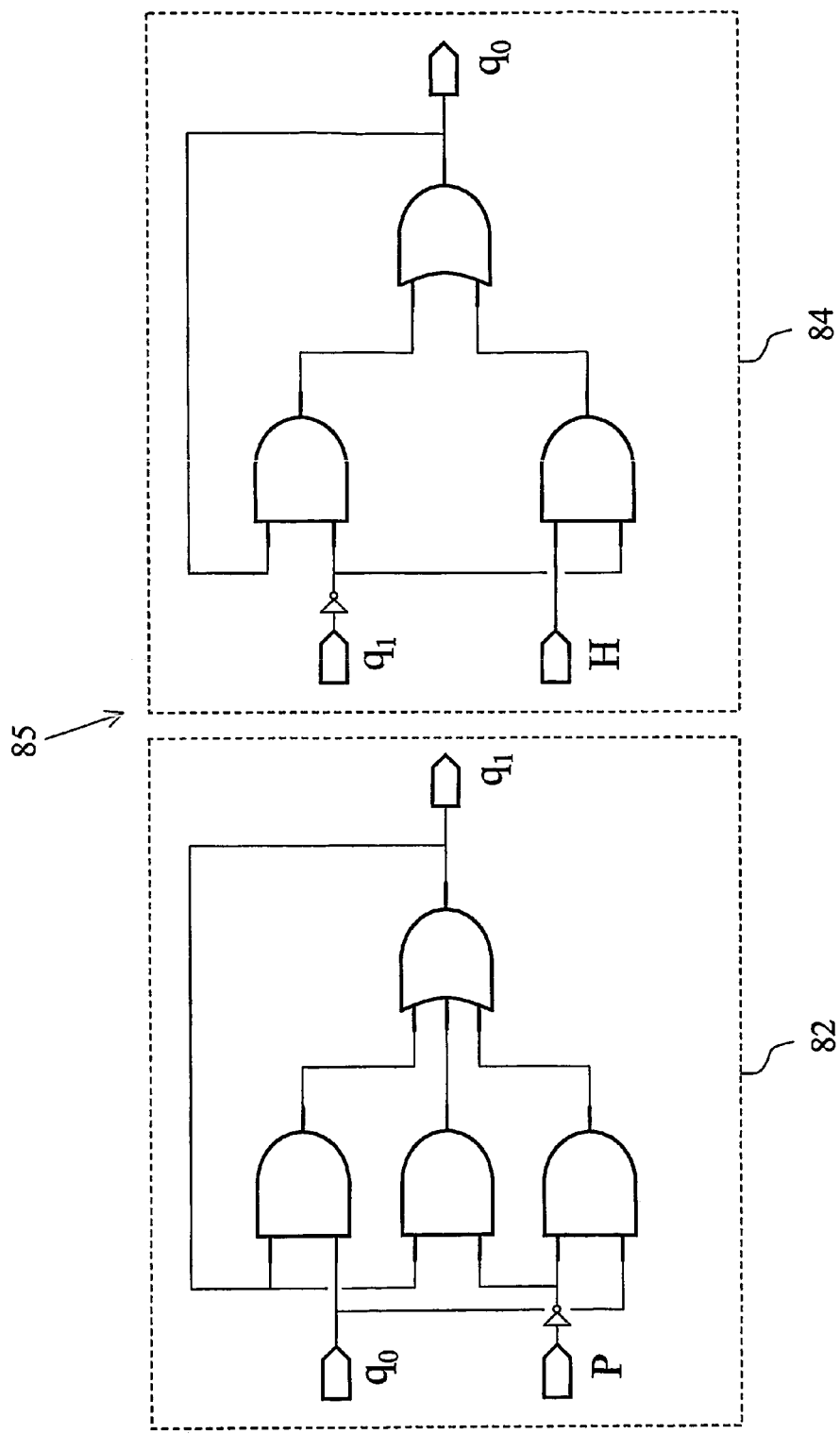
FIG. 39 is a gate level logic description of a preferred implementation of the hold latch control unit circuitry (HLC)

FIG. 39 is a gate level logic description of a preferred implementation of the hold latch control unit circuitry (HLC). The implementation 85 responds to the pass (P) and hold (H) signals, and the next state functions ($q_0^+$ and $q_1^+$) are represented by combinatorial feedback networks 82, 84. Although implemented with asynchronous feedback circuitry presented in a sum (OR) of products (AND) format any logical equivalent transformed circuit as well as other completely different implementation schemes such as edge triggered flip flop based circuitry may be incorporated provided that the basic sequential state machine behavior of FIG. 37 is preserved.

Additional, Optional Phase and Frequency Offset Cancellation Techniques

Exploited to the fullest the unprecedented jitter tracking abilities of the proposed novel distributed multiphase clock recovery algorithm and circuitry may be even further enhanced if static phase offsets and slow frequency variations are cancelled through additional compensation feedback loop arrangements. Once the static phase and frequency offsets are eliminated the overall clock recovery performance is improved with increased high frequency jitter margins. Even more accurate centering of the data strobe point, defined by the recovered clock signal transition that samples and evaluates the input data signal, clearly open up for larger variations of the input data signal transition timing, i.e. reduced setup and hold margins for input data signal sampling.

Figure 40A:
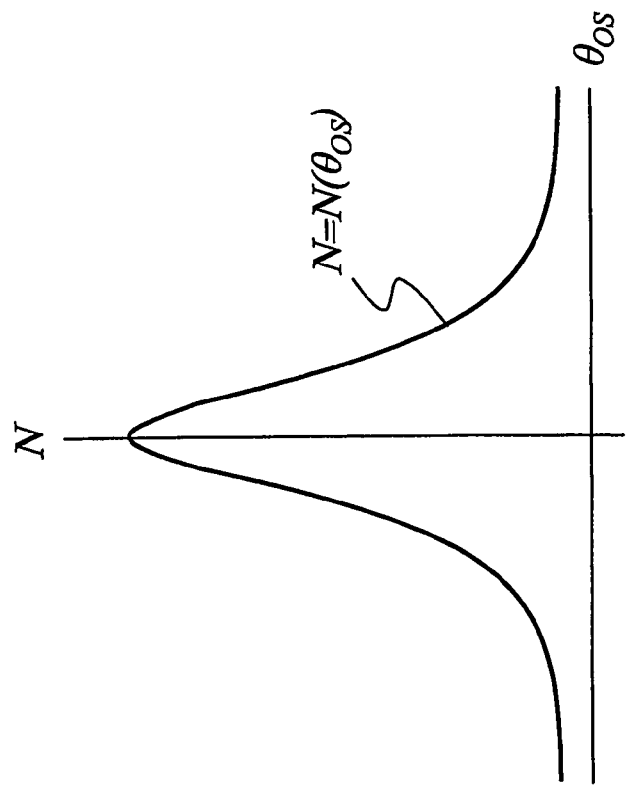
FIGS. 40A-B illustrate the accumulated phase offset distribution, symmetric with an ideal data strobe point and asymmetric consistent with a late data strobe, respectively.
Figure 40B:
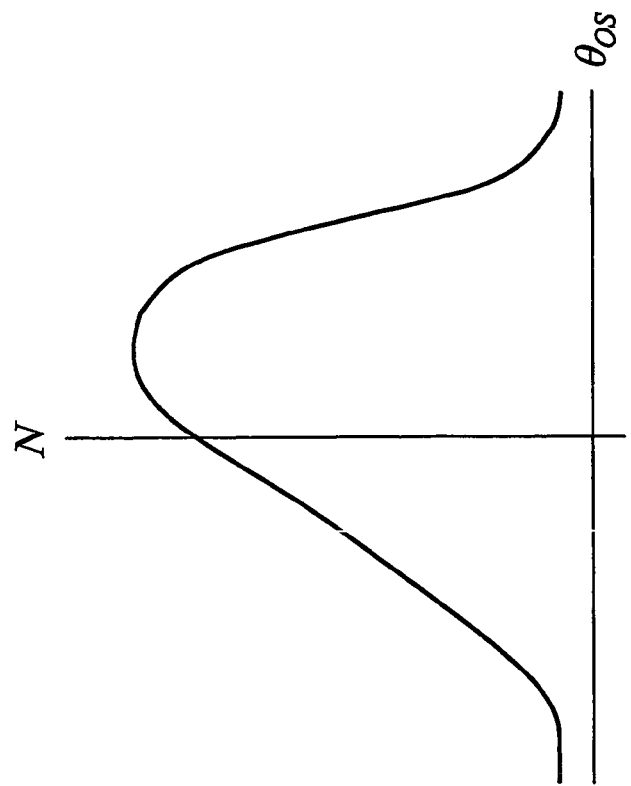

Observed over a significant long time the accumulated phase offset superimposed onto the data strobe point distort the ideal sample clock signal to data transition relation, which effectively add a positive or negative delay to the recovered clock signal with respect to an ideal counterpart. Although depicted as a continuous phase offset distribution in FIGS. 40A-B, the proposed multi phase clock recovery algorithm actually display discrete phase adjustment properties with a finite phase error resolution. The weight or occurrence, N, of a strobe point with a phase offset, $\theta_{os}$, is measured or collected during a predetermined statistical gate period significantly longer than the duration of a phase adjustment cycle for the direct clock recovery algorithm when operated in filtered mode. Ideally the sample phase variations cancel and the strobe point is located amidst the data bit in average as seen in FIG. 40A. However, if the phase offset distribution for the recovered clock signal is asymmetric a residual sample phase error and data strobe point offset exists in average as seen in FIG. 40B. Several other properties of the accumulated phase offset distribution such as excessive peak phase offsets may prove to be even more important and clearly influence the design of an additional correction algorithm. Particularly the phase detector choice in a correction feedback loop may alter the phase offset response.

Figure 41:
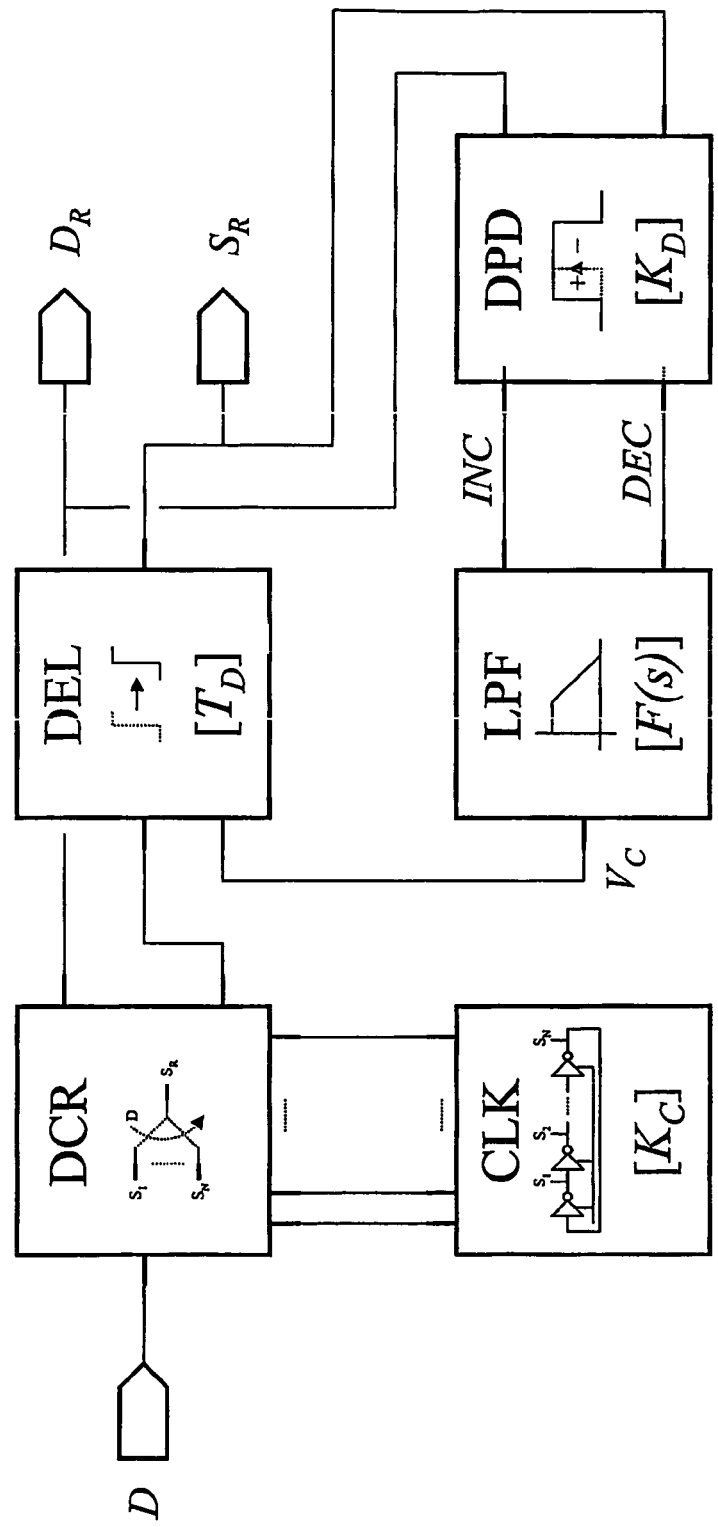
FIG. 41 illustrates an example of direct clock recovery, DCR, including an additional phase offset calibration feedback loop based on a cascaded delay element, DEL.

Static or slowly varying phase offsets may be fully compensated through an additional feedback loop arrangement, whereas a delay element is included directly in the recovered clock or data signal path as seen in FIG. 41. Preferably a tunable delay element, DEL, is inserted after the hold latch unit. Through the feedback loop the amount of additional delay and hence the compensating phase shift is adjusted, aided by the control voltage signal $V_C$, such that the recovered clock signal after the delay unit attain the desired relation to the input data transition, normally amidst the data bit. Among the wide range of suitable data phase detectors, DPD in FIG. 41, particularly edge triggered implementations with large range and small internal offset errors are preferred. One example of a single edge triggered phase detector is given in U.S. Pat. No. 5,754,080 by Chen et al. As indicated in the block diagram in FIG. 41, the data phase detector measures the delay (and hence the phase shift) between an input data signal transition and the first consecutive recovered clock signal transition and vice versa. Dependent on the magnitude and sign of the phase error increase, INC, and decrease, DEC, delay adjustment signals are created. A negative sign is consistent with an advanced recovered clock signal transition with respect to an ideal counterpart. On the other hand a positive phase error occur when the recovered clock signal transition is delayed instead. Active or passive low pass filter functionality, LPF, containing one or several charge storage elements such as integrators, which in turn may be formed by charge pump or active filter circuitry, is charged by a high INC pulse and discharged by a DEC pulse.

To compensate for an early recovered clock signal transition, which in turn produce a negative phase error, $\theta_e$, and a negative phase offset, $\theta_{os}$, the delay, $T_D$, is increased by an amount proportional to the duration of the INC signal as seen in (Eq. 49).

$$\begin{cases} \theta_{os} < 0 \\ \theta_e < 0 \end{cases} \Rightarrow INC > 0 \Rightarrow \frac{d}{dt}(V_C) > 0 \Rightarrow \frac{d}{dt}(T_D) > 0 \tag{Eq. 49}$$

A late data signal strobe, associated with a positive phase error and phase offset, is instead compensated by a reduced path delay when the DEC delay pulse appear on the data phase detector output summarized in (Eq. 50).

$$\begin{cases} \theta_{os} > 0 \\ \theta_e > 0 \end{cases} \Rightarrow DEC > 0 \Rightarrow \frac{d}{dt}(V_C) < 0 \Rightarrow \frac{d}{dt}(T_D) < 0 \tag{Eq. 50}$$

Preferably the amount of charge and discharge is linearly proportional to the phase error contained in the INC and DEC pulse duration. Charging and discharging of the integrator give a low pass filtered control voltage, $V_C$, which is subsequently fed to the delay control input of the adjustable delay element, DEL. All though not limited to positive slope implementations the delay is assumed to increase with increased control voltage. After phase offset cancellation the recovered clock and data signals appear on the $S_R$ and $D_R$ outputs respectively. To preserve the fundamental high frequency phase tracking properties of the direct clock recovery unit, DCR, the cut off frequency for the additional phase offset compensation feedback loop including the low pass filter is chosen well below any significant time scale and cycle time for the direct clock recovery system. More over additional poles and zeros may be utilized to custom tailor the frequency response of the phase offset cancellation loop. Especially stability issues and large high frequency roll off may require complex low pass filter topologies. In depth design and analysis of phase locked loops and delay locked feedback loops is presented in "Phase locked loops" by Roland E. Best, McGraw Hill (1999). Actual implementation of the feedback loop components such as delay elements and active filters is covered in "Monolithic phase locked loops and clock recovery circuits" by B. Razavi, IEEE Publications (1996).

Figure 42:
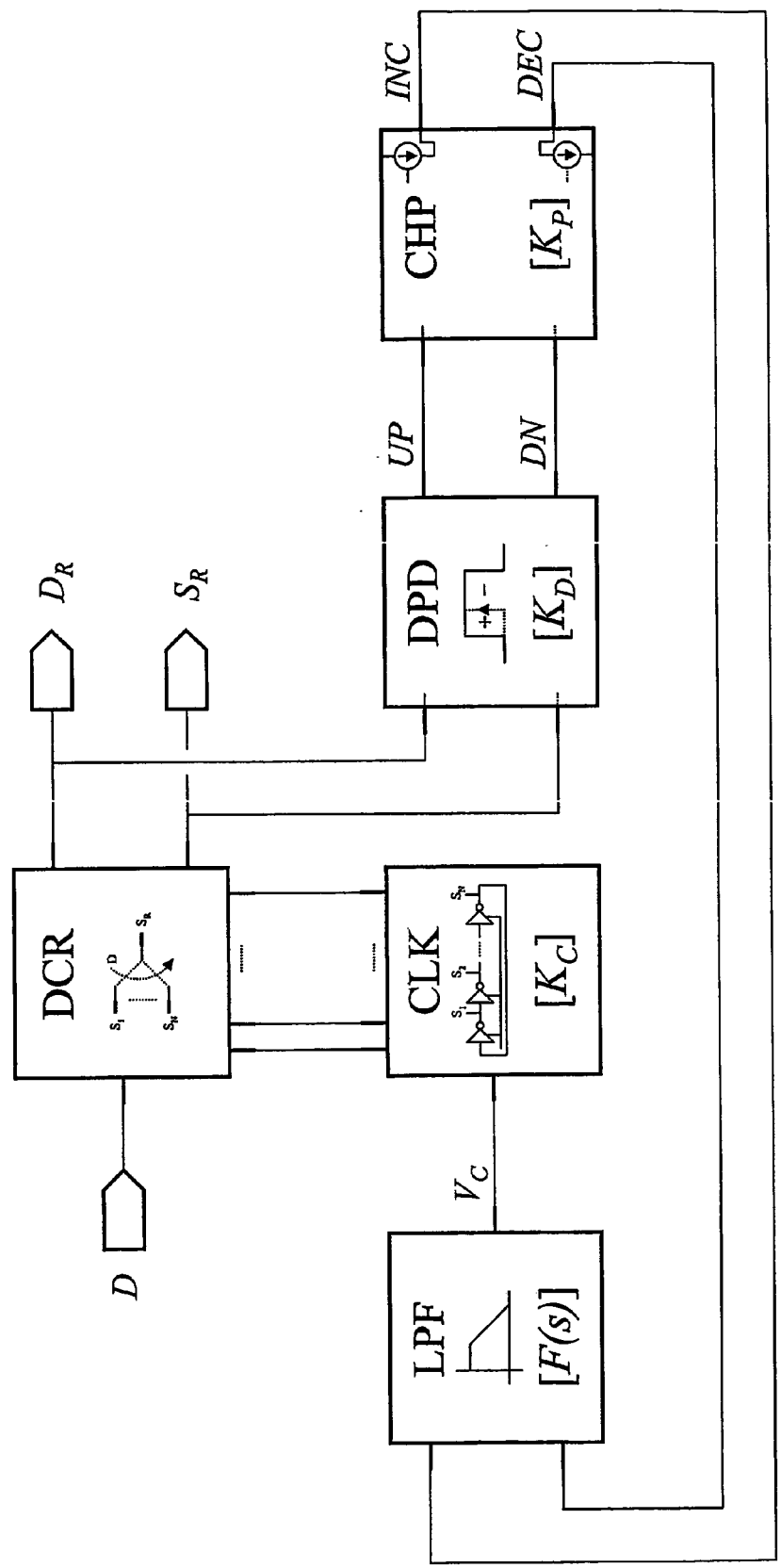
FIG. 42 illustrates an example of enhanced direct clock recovery functionality including a frequency and phase offset cancellation feedback loop controlling the local timing source, CLK.

As opposed to the previously described phase offset cancellation scheme, depicted in FIG. 41, the phase and frequency offset cancellation feedback loop, FIG. 42 does not contain an explicit delay element, corresponding to DEL in FIG. 41. Instead any timing offset of the recovered clock signal transition is indirectly cancelled through frequency adjustment of the timing source, CLK. Decreased sample clock frequency, $f_S$, elongates the oscillation period time, $T_S$, and thus delay a recovered clock signal transition as seen in (Eq. 51) below:

$$\Delta f_S < 0 \Rightarrow \Delta T_S > 0 \Rightarrow \Delta \theta_R > 0 \quad \text{(Eq. 51)}$$

Increased sample clock frequency on the other hand advances a recovered clock signal transition:

$$\Delta f_S > 0 \Rightarrow \Delta T_S < 0 \Rightarrow \Delta \theta_R < 0 \quad \text{(Eq. 52)}$$

Measurement of the phase offset, $\theta_{os}$, and phase error, $\theta_e$, between the recovered clock signal and the input data signal require a data phase detector, DPD, that generate up (UP) and down (DN) signals in response to an delayed or advanced recovered clock signal transition with respect to an ideal counterpart.

$$\theta_{os} = \theta_e = \theta_R - \theta_R^{(ref)} \quad \text{(Eq. 53)}$$

Based upon the ideal placement of the data strobe point, normally with a delay equivalent to one half data bit length after the data signal transition has occurred, the reference phase denoted "ref" in (Eq. 53) is thus derived from the input data signal transition timing. To calculate the phase offset, $\theta_{os}$, at a particular instance of time the accumulated phase shift of the ideal timing reference signal is subtracted from the recovered clock signal phase shift function, $\theta_R$. Existence of an average "ideal" data strobe point in (Eq. 53) merely reflects the need of an analytical aid, which does not necessary map to a physical entity. Instead through charging and discharging the integrators in the low pass loop filter, LPF, either directly by the data phase detector outputs, UP and DN, or aided by an additional intermediate charge pump circuit, CHP, with frequency increase (INC) and decrease (DEC) outputs, the control voltage, $V_C$, is adjusted until the recovered clock signal is positioned in the middle of the data bit and the charge update balance condition is met. At lock equal amount of charge is sunk and sourced during the two complementary parts of a data bit period, namely prior to and after a primary recovered clock signal transition. If a positive voltage to frequency characteristic is assumed for the local timing source, i.e. the voltage controlled sample clock signal generator CLK, an increased control voltage, $V_C$, decrease the oscillation period, $T_S$, and thus advance a recovered clock signal transition, where as a decreased control voltage level instead increases the oscillation period and delay a recovered clock signal transition. At least ten times lower bandwidth of the low pass filter in particular and the adjustment bandwidth for the entire phase and frequency offset cancellation loop in general compared with any other effective filter bandwidth or time scale in the direct clock recovery system ensure that the proposed direct clock recovery operation and high frequency jitter tracking abilities is not affected.

Several major benefits are gained through phase locking the sample clock timing source, CLK, to the average source clock rate recovered from the input data signal transition timing by the additional phase and frequency offset cancellation loop:

1. No drift rate compensation is necessary and thus reduced intrinsic jitter and larger jitter margins are achieved.
2. Precision alignment of the data strobe, parasitic delay cancellation and de-skew.

The phase offset cancellation technique described first utilize a free running local timing source, which produce the phase shifted sample clock signals $S_1, \ldots, S_N$. In general the sample and data source clocks are thus asynchronous. Continuous adjustment of the recovered clock signal phase through the direct clock recovery algorithm is necessary to maintain the desired relation between the recovered clock signal and the input data signal, which in turn decrease the margin for additional timing variations and especially high frequency input data signal transition timing displacement. In addition the continuous adjustment of the recovered clock signal phase introduces an undesired jitter component in the output clock signal.

Figure 43:
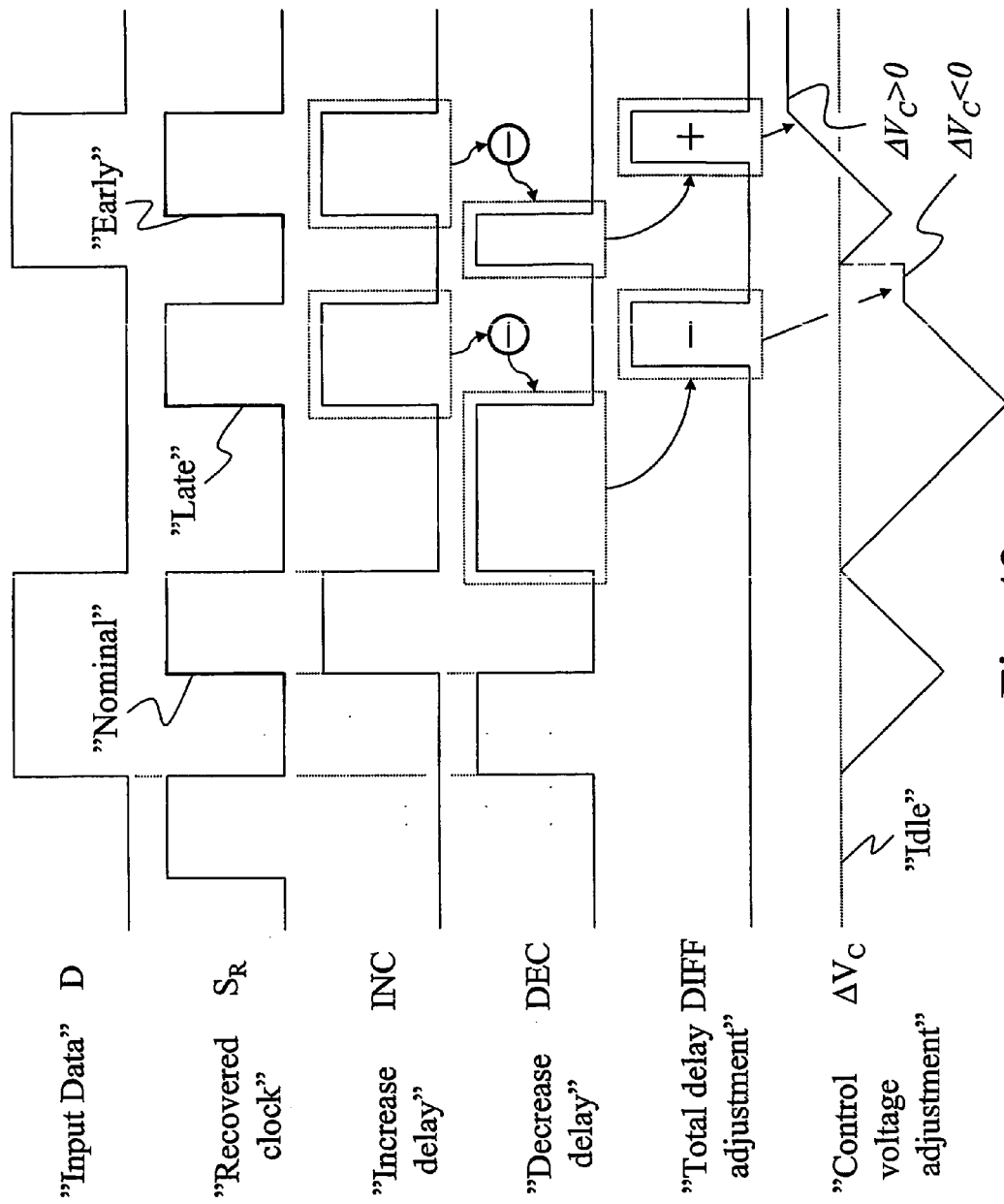
FIG. 43 is an informative timing diagram for a generic phase and/or frequency offset compensation loop.

First an ideal situation with a "Nominal" relation between the recovered clock and input data signal transitions is depicted in the informative timing diagram of FIG. 43 for a generic phase and/or frequency offset compensation loop. The positive recovered clock signal transition from low to high occurs perfectly amidst the constant high input data bit. No net charge build up or depletion occur in the loop filter integrators since the duration of the increase, INC, and decrease, DEC, phase adjustment pulses are equal, i.e. the difference signal, DIFF, is equal to zero. The control voltage, $V_C$, return to the exact same value after being lowered and raised again.

On the other hand a positive phase offset introduces a delay and the recovered clock signal transition appears to occur "Late" with respect to the input data signal transition. Imbalanced the duration of the decrease phase signal, DEC, differs an amount equal to the phase error from the shorter increase delay signal, INC, marked by a minus sign in the total delay adjustment signal, DIFF. Due to the difference in charge and discharge time a net decrease in total charge lowers the control voltage ($\Delta V_C < 0$), which in turn decrease the overall path delay if a positive delay characteristic is assumed.

Similarly a negative phase offset is consistent with an advanced recovered clock signal transition, which appears to occur "Early" with respect to the input data signal transition. Predominance of the increase delay signal, INC, over the decrease delay signal, DEC, produce a positive total delay adjustment pulse, DIFF, with a duration equal to the phase difference, $\theta_e$. The delay control voltage, $V_C$, is increased ($\Delta V_C > 0$) since the charge and discharge cycles of the loop filter integrators by the charge pump differ by an amount proportional to the phase offset.

All delay adjustments by the negative feedback phase adjustment and offset cancellation loop are thus performed to minimize the total phase error and displacement of the data strobe.

The embodiments described above are merely given as examples, and it should be understood that the present invention is not limited thereto. Further modifications, changes and improvements, which retain the basic underlying principles disclosed and claimed herein are within the scope of the invention.

The invention claimed is:

1. A digital clock recovery system operating with multiple mutually phase shifted clock signals defining a set of clock phases, said clock recovery system comprising:
   a set of individual transition detectors for processing an input data sample representation obtained by sampling an input data signal with said multiple mutually phase shifted clock signals, each transition detector being adapted for determining whether input data samples within a detection window associated with a respective one of said clock phases includes an input data transition;

a set of clock selection controllers, each of which is connected to a respective one of said transition detectors, associated with a unique clock phase and adapted for:
  requesting clock master control only if an input data transition is detected by the associated transition detector;
  continuously monitoring whether any of a predetermined group of said cluck selection controllers requests clock master control, and releasing possible clock master control by the monitoring clock selection controller if such a request is detected; and
  acquiring clock master control only when no clock selection controller is in clock master control; and means for dynamically extracting, from said phase shifted clock signals, a clock signal that has a clock phase associated with the clock selection controller currently in clock master control as an output clock signal.

2. The digital clock recovery system according to claim 1, wherein each clock selection controller is associated with another predetermined clock phase than that of the transition detector to which it is connected.

3. The digital clock recovery system according to claim 1, wherein said predetermined group of clock selection controllers comprises a number of clock selection controllers, each of which is associated with a clock phase within a given phase distance from the clock phase of the monitoring clock selection controller, thus limiting the cycle-to-cycle phase changes of said output clock signal.

4. The digital clock recovery system according to claim 1 wherein said predetermined group of said clock selection controllers is limited to a selected subset of said clock selection controllers.

5. The digital clock recovery system according to claim 1, wherein said predetermined group of said clock selection controllers includes all clock selection controllers required to enable that every new input data transition unconditionally triggers a clock master control update irrespective of the change in phase of said output clock signal, thus enabling bit rate jitter tracking operation of said clock recovery system.

6. The digital clock recovery system according to claim 1, wherein each clock selection controller is adapted for awaiting that no other clock selection controller requests clock master control and ending its own request for clock master control before fully acquiring clock master control.

7. The digital clock recovery system according to claim 1, wherein each clock selection controller is adapted for setting an individual clock selection signal when the clock selection controller is in clock master control, and said means for dynamically extracting comprises means for dynamically gating one of said phase shifted clock signals as the output clock signal in response to said clock selection signals.

8. The digital clock recovery system according to claim 7, wherein said means for dynamically extracting comprises a distributed clock signal multiplexor responsive to the clock selection signals from said clock selection controllers and said phase shifted clock signals to dynamically select, as the output clock signal, the clock signal associated with the clock selection controller having a set clock selection signal.

9. The digital clock recovery system according to claim 1, further comprising a hold latch for suppressing impact of spurious transitions and/or preventing parasitic transitions in said output clock signal.

10. The digital clock recovery system according to claim 1, wherein said hold latch is controlled to perform adaptive pulse broadening of said output clock signal.

11. The digital clock recovery system according to claim 1, wherein each clock selection controller is adapted for:
  setting an individual request signal requesting clock master control if the associated transition detector has detected an input data transition;
  setting an individual release signal if it is detected that any of the clock selection controllers within said predetermined group requests clock master control and
  acquiring clock master control provided all individual release signals are set.

12. The digital clock recovery system according to claim 11, further comprising:
  means for generating, for each clock selection controller, an associated compound request signal based on the individual request signals of said predetermined group of clock selection controllers; and
  means for generating a compound release signal based on said individual release signals,
  wherein each clock selection controller is adapted for:
    continuously monitoring the associated compound request signal to determine whether its own individual release signal is to be set; and
    continuously monitoring said compound release signal to determine whether clock master control is to be acquired.

13. The digital clock recovery system according to claim 11, further comprising:
  means for generating a compound request signal based on said individual request signals; and
  means for generating a compound release signal based on said individual release signals,
  wherein each clock selection controller is adapted for:
    continuously monitoring said compound request signal to determine whether its own individual release signal is to be set; and
    continuously monitoring said compound release signal to determine whether clock master control is to be acquired.

14. The digital clock recovery system according to claim 1, further comprising means for supervising said clock selection controllers to enable detection whether more than one of said controllers is in master control at a time, and means for performing consequent reset of said controllers in order to resolve initiation problems in response to detection of multiple master controllers.

15. The digital clock recovery system according to claim 1, further comprising means for sampling said input data signal with said multiple phase shifted clock signals to obtain said input data sample representation.

16. A computer-controlled method of digital clock recovery when operating with multiple mutually phase shifted clock signals defining a set of clock phases, wherein at least one control processor causes a clock recovery system to perform the steps of:
  processing by a set of individual transition detectors, an input data sample representation obtained by sampling an input data signal with said multiple mutually phase shifted clock signals, said processing step including determining by each transition detector whether input data samples within a detection window associated with a respective one of said clock phases includes an input data transition;
  connecting a set of clock selection controllers to the set of transition detectors, each clock selection controller being connected to a respective one of the transition detectors, wherein each clock selection controller is associated with a unique clock phase and performs the steps of:

requesting clock master control only if an input data transition is detected by the associated transition detector;

continuously monitoring whether any of a predetermined group of the clock selection controllers requests clock master control, and releasing possible clock master control by the monitoring clock selection controller if such a request is detected; and acquiring clock master control only when no clock selection controller is in clock master control; and dynamically extracting, from the phase shifted clock signals, a clock signal that has a clock phase associated with the clock selection controller currently in clock master control as an output clock signal.

\* \* \* \* \*